US012604535B2

(12) United States Patent     (10) Patent No.:    US 12,604,535 B2

Pan et al.                  (45) Date of Patent:     Apr. 14, 2026

(54) SEMICONDUCTOR DEVICE HAVING SERIALLY CONNECTED TRANSISTORS WITH DISCONNECTED BODIES, AND METHOD OF MANUFACTURING THE SAME

(71) Applicants: TAIWAN SEMICONDUCTOR MANUFACTURING COMPANY, LTD., Hsinchu (TW); TSMC CHINA COMPANY, LIMITED, Shanghai (CN)

(72) Inventors: Lei Pan, Hsinchu (TW); Di Fan, Hsinchu (TW); Yaqi Ma, Hsinchu (TW)

(73) Assignees: TAIWAN SEMICONDUCTOR MANUFACTURING COMPANY, LTD.; TSMC CHINA COMPANY LIMITED, Shanghai (CN)

( * ) Notice: Subject to any disclaimer, the term of this patent is extended or adjusted under 35 U.S.C. 154(b) by 146 days.

(21) Appl. No.: 17/451,943

(22) Filed: Oct. 22, 2021

(65) Prior Publication Data

US 2023/0055721 A1     Feb. 23, 2023

(30) Foreign Application Priority Data

Aug. 20, 2021    (CN) .......................... 202110963743.9

(51) Int. Cl.
     *H10D 89/60*        (2025.01)

(52) U.S. Cl.
     CPC ......... *H10D 89/815* (2025.01); *H10D 89/611* (2025.01)

(58) Field of Classification Search
     CPC ........................ H01L 27/0277; H01L 27/0255
     USPC .......................................................... 257/355
     See application file for complete search history.

(56) References Cited

U.S. PATENT DOCUMENTS

| | | | |
|---|---|---|---|
| 6,768,619 B2* | 7/2004 | Ker ..................... | H01L 27/0262 |
| | | | 257/355 |
| 7,260,442 B2 | 8/2007 | Hwang et al. | |
| 9,256,709 B2 | 2/2016 | Yu et al. | |
| 9,373,612 B1* | 6/2016 | Huang ................ | H01L 27/0288 |
| 2002/0140001 A1* | 10/2002 | Komaki .............. | H10D 84/907 |
| | | | 257/E27.108 |
| 2003/0230769 A1* | 12/2003 | Tsutsumi ............. | H10D 84/907 |
| | | | 257/E27.108 |
| 2005/0180076 A1* | 8/2005 | Saito ................... | H01L 27/0266 |
| | | | 361/91.1 |
| 2006/0176628 A1* | 8/2006 | Hasegawa ........... | H01L 27/0266 |
| | | | 361/56 |

(Continued)

FOREIGN PATENT DOCUMENTS

| | | | |
|---|---|---|---|
| CN | 104157604 | * | 11/2014 |
| CN | 105405843 | * | 3/2016 |

(Continued)

*Primary Examiner* — Sheng-Bai Zhu
(74) *Attorney, Agent, or Firm* — Hauptman Ham, LLP

(57) ABSTRACT

A semiconductor device including a first transistor and a second transistor. The first transistor has a first body. The first body of the first transistor is connected to receive a first reference voltage. The second transistor has a second body. The second body of the second transistor is electrically disconnected from the first body of the first transistor. The first transistor and the second transistor are electrically connected in series.

20 Claims, 28 Drawing Sheets

┌─────────────────────────────────────────────┐
│                                             │
│              702                        │
│        generate a layout diagram            │
│                                             │
└─────────────────────────────────────────────┘
                    │
┌─────────────────────────────────────────────┐
│                                             │
│              704                        │
│  make, based on the layout diagram, one or more │
│        photolithographic exposures          │
│                 OR                          │
│  fabricate, based on the layout diagram, one or more masks │
│                 OR                          │
│  fabricate, based on the layout diagram, one or more │
│           components of IC                  │
│                                             │
└─────────────────────────────────────────────┘

⌐ 700

(56)         References Cited

U.S. PATENT DOCUMENTS

| 2007/0108527 | A1* | 5/2007 | Lee ...................... H10D 89/611 |
| | | | 257/356 |
| 2009/0020826 | A1* | 1/2009 | Huang ................. H10D 84/156 |
| | | | 257/371 |
| 2011/0049575 | A1* | 3/2011 | Tanaka .............. H01L 27/11807 |
| | | | 257/E27.013 |
| 2012/0154961 | A1* | 6/2012 | Russ ........................ H02H 3/22 |
| | | | 361/56 |
| 2012/0306013 | A1* | 12/2012 | Donovan ............ H01L 27/0285 |
| | | | 438/210 |
| 2014/0040838 | A1 | 2/2014 | Liu et al. |
| 2014/0070319 | A1* | 3/2014 | Tonomura ........... H01L 27/0629 |
| | | | 438/237 |
| 2015/0214928 | A1* | 7/2015 | Vashishtha ............... H03K 5/12 |
| | | | 327/108 |
| 2015/0278429 | A1 | 10/2015 | Chang |
| 2017/0063369 | A1* | 3/2017 | Boakye .............. H03K 17/0822 |
| 2017/0250178 | A1* | 8/2017 | Chen ................... H01L 23/5223 |
| 2019/0165678 | A1* | 5/2019 | Chen ................... H01L 29/7836 |
| 2019/0379204 | A1* | 12/2019 | Lee ..................... H01L 27/0266 |

FOREIGN PATENT DOCUMENTS

| CN | 105845734 | * | 8/2016 |
| CN | 107910858 | * | 4/2018 |
| DE | 19518550 | * | 12/1998 |
| JP | H09148452 | * | 6/1997 |
| JP | H11154748 | * | 6/1999 |
| KR | 100244287 | * | 2/2000 |

* cited by examiner

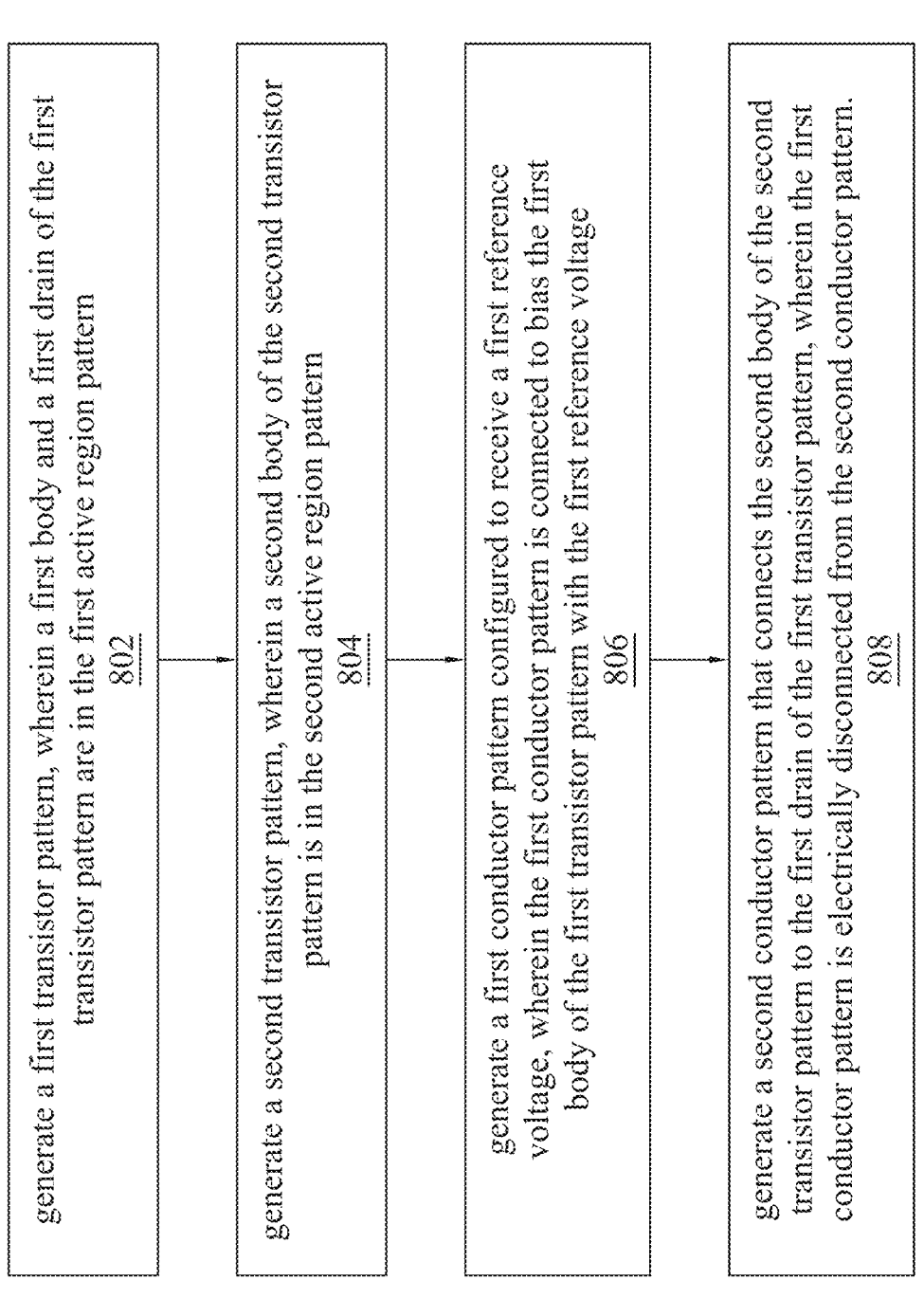

800A generate a first transistor pattern, wherein a first body and a first drain of the first transistor pattern are in the first active region pattern
802 generate a second transistor pattern, wherein a second body of the second transistor pattern is in the second active region pattern
804 generate a first conductor pattern configured to receive a first reference voltage, wherein the first conductor pattern is connected to bias the first body of the first transistor pattern with the first reference voltage
806 generate a second conductor pattern that connects the second body of the second transistor pattern to the first drain of the first transistor pattern, wherein the first conductor pattern is electrically disconnected from the second conductor pattern.
808

FIG. 8A

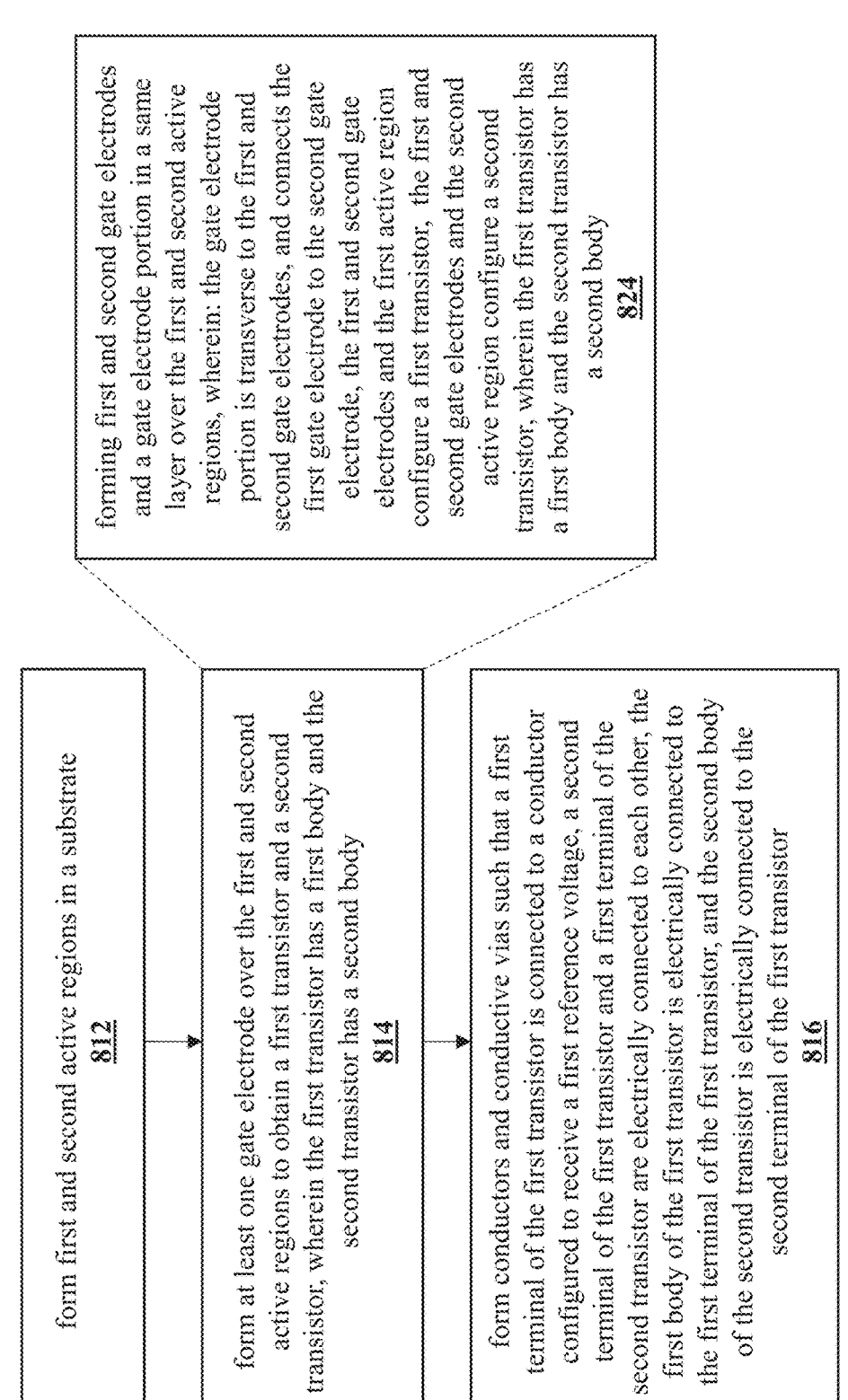

800B form first and second active regions in a substrate
812 form at least one gate electrode over the first and second active regions to obtain a first transistor and a second transistor, wherein the first transistor has a first body and the second transistor has a second body
814 form conductors and conductive vias such that a first terminal of the first transistor is connected to a conductor configured to receive a first reference voltage, a second terminal of the first transistor and a first terminal of the second transistor are electrically connected to each other, the first body of the first transistor is electrically connected to the first terminal of the first transistor, and the second body of the second transistor is electrically connected to the second terminal of the first transistor
816 forming first and second gate electrodes and a gate electrode portion in a same layer over the first and second active regions, wherein: the gate electrode portion is transverse to the first and second gate electrodes, and connects the first gate electrode to the second gate electrode, the first and second gate electrodes and the first active region configure a first transistor, the first and second gate electrodes and the second active region configure a second transistor, wherein the first transistor has a first body and the second transistor has a second body
824

FIG. 8B

SEMICONDUCTOR DEVICE HAVING SERIALLY CONNECTED TRANSISTORS WITH DISCONNECTED BODIES, AND METHOD OF MANUFACTURING THE SAME

BACKGROUND

The recent trend in miniaturizing integrated circuits (ICs) has resulted in smaller devices which consume less power, yet provide more functionality at higher speeds than before. The miniaturization process has also increased the devices' susceptibility to electrostatic discharge (ESD) events due to various factors, such as thinner dielectric thicknesses and associated lowered dielectric breakdown voltages. ESD is one of the causes of electronic circuit damage and is also one of the considerations in semiconductor advanced technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4I is a cross-section diagram along cross-section line 4I in FIG. 4A of a body connection to the PMOS transistor, in accordance with some embodiments.

FIG. 8A is a flowchart of a method of generating a layout diagram, in accordance with some embodiments.

FIG. 8B is a flowchart of a method of fabricating a semiconductor device, in accordance with some embodiments.

DETAILED DESCRIPTION

Figure 2:
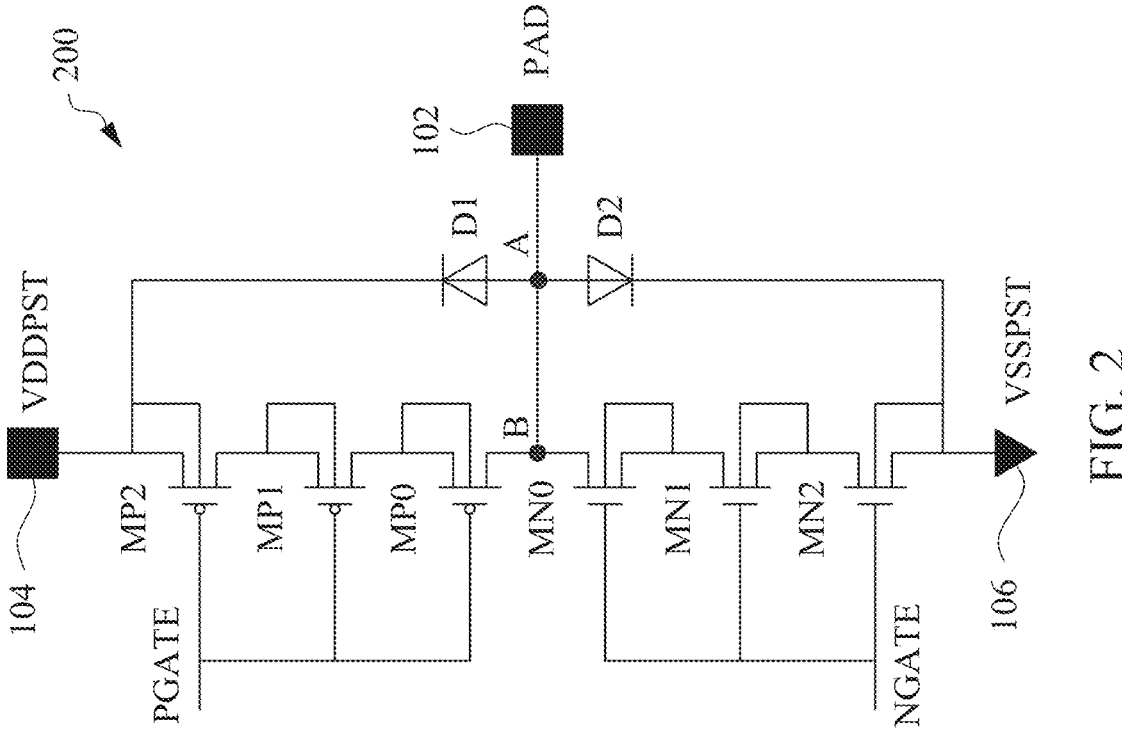
FIG. 2 is a circuit diagram of an IC that includes a semiconductor device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor devices and methods of manufacturing the same are disclosed. In some embodiments, the semiconductor device includes ESD circuits that are configured to protect the semiconductor device from ESD events. Within the ESD circuits, the semiconductor device includes a plurality of transistors that are connected in series in a post-driver. The post-driver is configured to convert signals of a lower voltage level in a functional circuit to and from higher voltage levels at an input/output node. One of the transistors has a source connected to a power reference node and another transistor has a drain connected to an input/output node. At least one diode is included to protect the transistors in the post-driver from ESD events. The plurality of transistors are configured to have a relatively high breakdown voltage and thus block ESD current so that the ESD current passes through the diode. To further protect against an ESD event, the bodies of the transistors are electrically disconnected from one another. The electrical disconnection protects against the breakdown of the transistors and, in particular, protects the transistor that is connected to the input/output node from breaking down during the ESD event so that ESD current safely bypasses the transistors.

Figure 1:
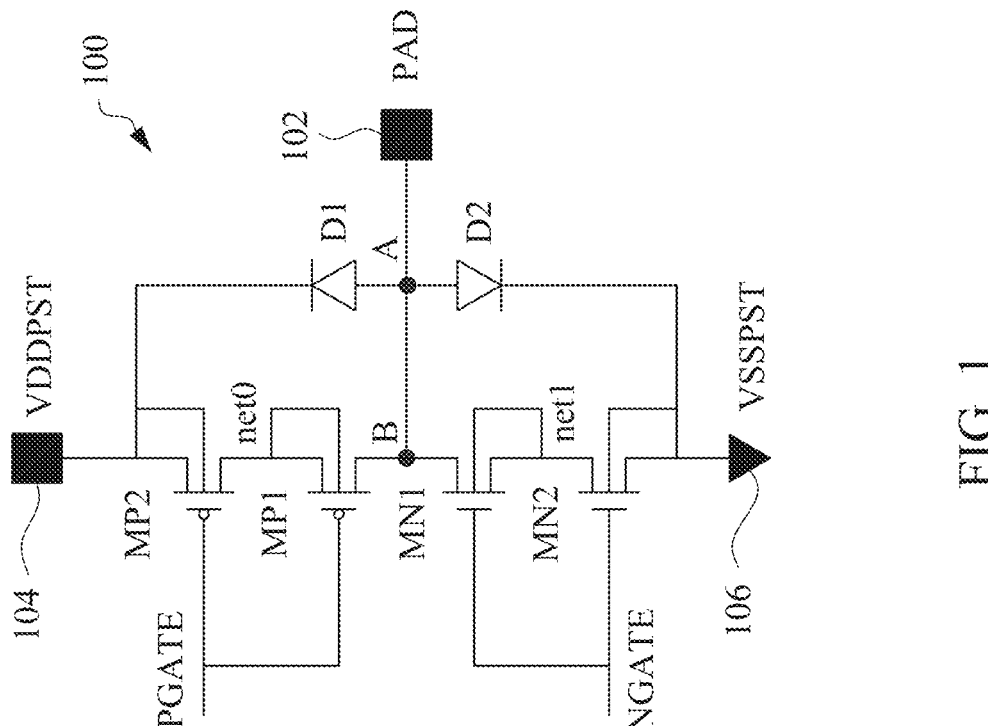
FIG. 1 is a circuit diagram of an integrated circuit (IC) that includes a semiconductor device, in accordance with some embodiments.

FIG. 1 is a circuit diagram of an IC that includes a semiconductor device 100.

Semiconductor device 100 is an ESD circuit with a post-driver. Semiconductor device 100 includes an input/output node 102, a power reference node 104, and a power reference node 106. In some embodiments, input/output node 102 is configured as a contact pad. Input/output node 102 is configured to receive an input/output signal. Semiconductor device 100 is configured to protect input/output node 102 from ESD events. In this embodiment, input/output node 102 is directly connected to node A and node A is directly connected to node B. Power reference node 104 is configured to receive a reference voltage VDDPST. In some embodiments, reference voltage VDDPST is a power supply voltage. Power reference node 106 is configured to receive a reference voltage VSSPST. In some embodiments, reference voltage VSSPST is ground.

Semiconductor device 100 includes a plurality of transistors MP2, MP1 connected in series between power reference node 104 and input/output node 102. Semiconductor device 100 includes a plurality of transistors MN2, MN1 connected in series between power reference node 106 and input/output node 102. Transistors MP2, MP1, MN2, MN1 are configured as a post-driver that is configured to convert lower voltages from a functional circuit (not shown) to and from higher voltages at input/output node 102. In this embodiment, transistor MP2 and transistor MP1 are each PMOS devices and transistors MN2, MN1 are each NMOS devices. As such, transistors MP2, MP1 are of P-type conductivity and transistors MN2, MN1 are of N-type conductivity.

Transistor MP2 has a source that is directly connected to power reference node 104. Thus, source of transistor MP2 is configured to receive reference voltage VDDPST. Gate of transistor MP2 is directly connected to gate of transistor MP1. Gates of transistors MP2, MP1 are configured to receive a control signal PGATE. A source of transistor MP1 is directly connected to drain of transistor MP2. A drain of transistor MP1 is directly connected to node B. A body of transistor MP2 is also directly connected to the source of transistor MP2 and power reference node 104. Accordingly, the source of transistor MP2 and the body of transistor MP2 are configured to receive reference voltage VDDPST. A body of transistor MP1 is directly connected to source of transistor MP1 and drain of transistor MP2. However, body of transistor MP1 is electrically disconnected from the body of transistor MP2 and from the source of transistor MP2. Transistor MP2 and transistor MP1 are thus connected in series between power reference node 106 and node B. In some embodiments, a network net0 of conductors and vias are included to connect the body of transistor MP1, the source of transistor MP1 and the drain of transistor MP2. In some embodiments, the conductors of the network net0 are all located in the same metal layer and in other embodiments the conductors of the network net0 are located in different metal layers. Vias in network net0 connect the conductors to the body of transistor MP1, the source of transistor MP1 and the drain of transistor MP2. In some embodiments, the vias in the network net0 connect the conductors in the network net0 to each other.

Transistor MN2 has a source that is directly connected to power reference node 106. Thus, source of transistor MN2 is configured to receive reference voltage VSSPST. Gate of transistor MN2 is directly connected to gate of transistor MN1. Gates of transistors MN2, MN1 are configured to receive a control signal NGATE. A source of transistor MN1 is directly connected to drain of transistor MN2. A drain of transistor MN1 is directly connected to node B. A body of transistor MN2 is directly connected to power reference node 106 and to the source of transistor MN2. Accordingly, the source of transistor MN2 and the body of transistor MN2 are configured to receive reference voltage VSSPST. A body of transistor MN1 is directly connected to source of transistor MN1 and drain of transistor MN2. However, body of transistor MN1 is electrically disconnected from the body of transistor MN2 and to the source of transistor MN2. Transistor MN2 and transistor MN1 are thus connected in series between power reference node 106 and node B. In some embodiments, a network net1 of conductors and vias are included to connect the body of transistor MN1, the source of transistor MN1 and the drain of transistor MN2. In some embodiments, the conductors of the network net1 are all located in the same metal layer and in other embodiments the conductors of the network net1 are located in different metal layers. Vias in network net1 connect the conductors to the body of transistor MN1, the source of transistor MN1 and the drain of transistor MN2. In some embodiments, the vias in the network net1 connect the conductors in the network net1 to each other.

As shown in FIG. 1, a diode D1 has an anode directly connected to the node A and a cathode directly connected to power reference node 104 and source of transistor MP2. A diode D2 has an anode directly connected to the node A and a cathode directly connected to power reference node 106 and source of transistor MN2. Diodes D1 and D2 are examples of ESD protection devices. Other ESD protection devices are within the scope of various embodiments.

During a negative ESD event, ESD current flows from input/output node 102 to power reference node 104. In contrast, during a positive ESD event, ESD current flows from input/output node 102 to power reference node 106. By connecting the body of each pair of transistors (MP2, MP1) (MN2, MN1) to their source separately, transistors MP2, MP1 are protected from breaking down during a negative ESD event and transistors MN2, MN1 are protected from breaking down during a positive ESD event.

FIG. 2 is a circuit diagram of an IC that includes a semiconductor device 200.

Semiconductor device 200 is similar to semiconductor device 100 shown in FIG. 1. As such, similar components in semiconductor device 200 and semiconductor device 100 has the same elements numbers. The discussion herein concentrates on the differences between semiconductor device 200 and semiconductor device 100.

As shown in FIG. 2, semiconductor device 200 further includes transistor MP0 that is a PMOS device and is therefore of P-type conductivity. Transistor MP0 has a gate, a source, and a drain. The gate of transistor MP0 is directly connected to the gate of transistor MP1 and the gate of transistor MP2. Accordingly, the gate of transistor MP0 is also configured to receive control signal PGATE. Source of transistor MP0 is directly connected to the drain of transistor MP1. The body of transistor MP0 is directly connected to the source of transistor MP0 and to the drain of transistor MP1. The body of transistor MP0 is electrically disconnected from the body and the source of transistor MP1 and the body and the source of transistor MP2. The drain of transistor MP0 is directly connected to node B, which as explained above is connected to input/output node 102 through node A.

Transistors MP2, MP1, MP0 are thus connected in series between power reference node 104 and input/output node 102. While semiconductor device 100 in FIG. 1 included just two PMOS transistors (MP2, MP1), semiconductor device 200 included three PMOS transistors (MP2, MP1, MP0) that are connected in series between power reference node 104 and input/output node 102. In some embodiments, a semiconductor device may include more than three PMOS transistors connected in series between power reference node 104 and input/output node 102. Regardless, each of the PMOS transistors has a body that is electrically disconnected from the body of the other PMOS transistor but rather is connected to its own source and the drain of the PMOS transistor above it except in the case of the highest PMOS transistor (e.g. PMOS transistor MP2 in FIG. 1, FIG. 2) that will have a body directly connected to power reference node 104 and its own source.

As shown in FIG. 2, semiconductor device 200 further includes transistor MN0 that is an NMOS device and is therefore of N-type conductivity. Transistor MN0 has a gate, a source, and a drain. The gate of transistor MN0 is directly connected to the gate of transistor MN1 and the gate of transistor MN2. Accordingly, the gate of transistor MN0 is also configured to receive control signal NGATE. The source of transistor MN0 is directly connected to the drain of transistor MN1. The body of transistor MN0 is directly connected to source of transistor MN0 and the drain of transistor MN1. The body of transistor MN0 is electrically disconnected from the body and the source of transistor MN1 and the body and the source of transistor MN2. The source of transistor MN2 is directly connected to node B, which as explained above is connected to input/output node 102 through node A.

Transistors MN2, MN1, MN0 are thus connected in series between power reference node 106 and input/output node 102. While semiconductor device 100 in FIG. 1 included just two NMOS transistors (MN2, MN1), semiconductor device 200 included three NMOS transistors (MN2, MN1, MN0) that are connected in series between power reference node 106 and input/output node 102. In some embodiments, a semiconductor device may include more than three NMOS transistors connected in series between power reference node 106 and input/output node 102. Each of the NMOS transistors has a body that is electrically disconnected from the body of the other NMOS transistor but rather is connected to its own source and the drain of the NMOS transistor above it except in the case of the highest NMOS transistor (e.g. NMOS transistor MN2 in FIG. 1, FIG. 2) that will have a body directly connected to power reference node 106 and its own source. Since each of transistors MP2, MP1, MP0 and each of transistors MN2, MN1, MN0 have body contacts that are electrically disconnected, each of transistors MP2, MP1, MP0 and transistors MN2, MN1, MN0 have higher breakdown voltages and thus have greater protection from ESD events.

Figure 3A:
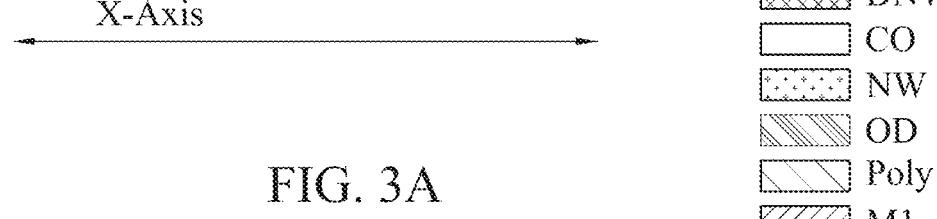
FIG. 3A is a layout diagram of a semiconductor device, in accordance with some embodiments.

FIG. 3A is a layout diagram 300A of a semiconductor device, in accordance with some embodiments.

Layout diagram 300A represents various features of the semiconductor device as shapes. Features of layout diagram 300A are discussed with reference to the semiconductor components that the illustrated shapes represent.

Layout diagram 300A includes circuit 302A(1), circuit 302A(2), circuit 302A(3), and circuit 302A(4). Each of circuit 302A(1), circuit 302A(2), circuit 302A(3), and circuit 302A(4) are an example of the circuit shown in semiconductor device 100 of FIG. 1. It should be noted that the components for circuit 302A(1) are discussed in detail and it should be presumed that circuit 302A(2), circuit 302A(3), and circuit 302A(4) have similar components and arrangement. Furthermore, the diodes D1, D2 in FIG. 1 are not shown in FIG. 3A. In this embodiment, circuit 302A(1), circuit 302A(2), circuit 302A(3), and circuit 302A(4) are connected in parallel.

Figure 3B:
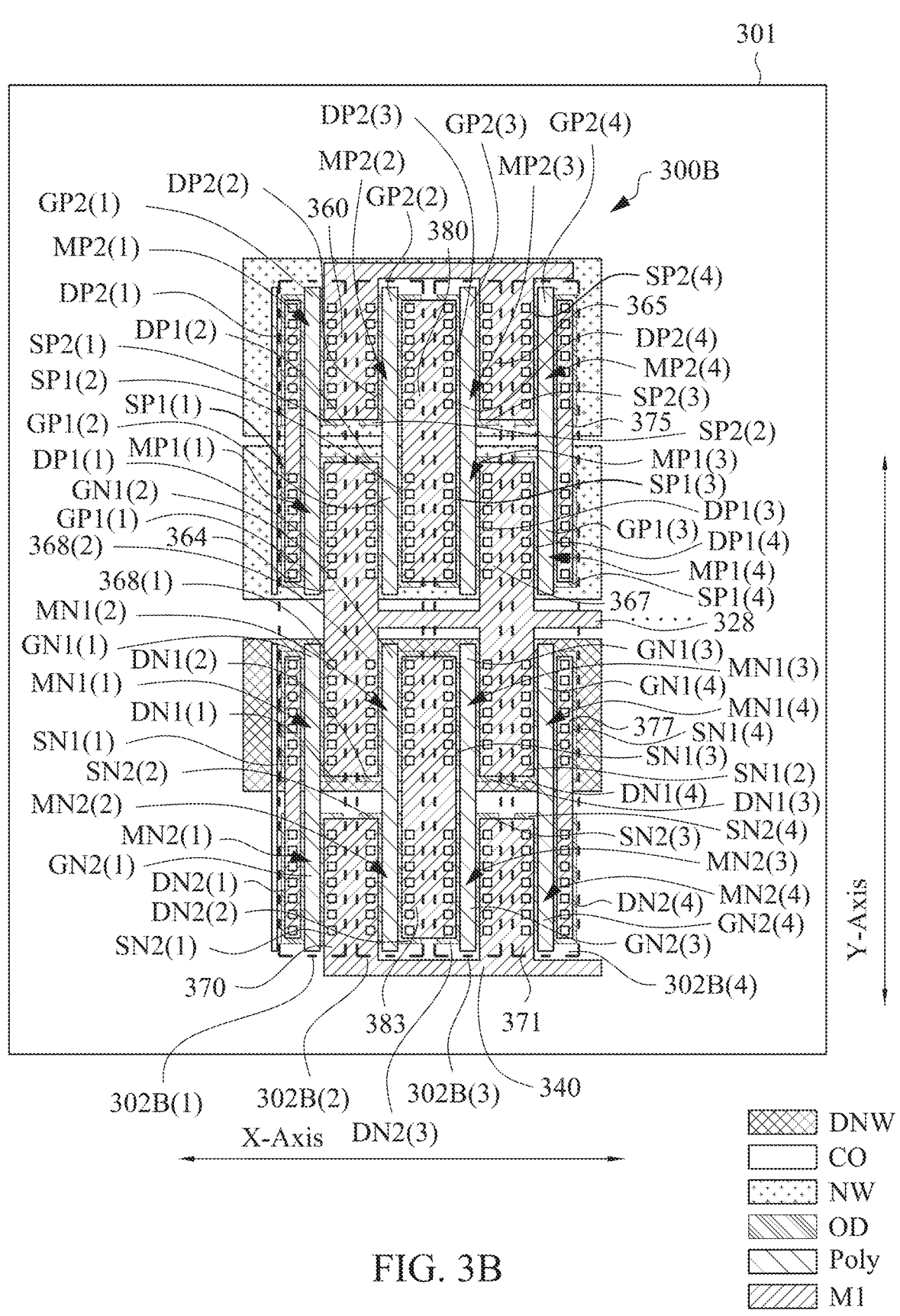
FIG. 3B is a layout diagram of a semiconductor device, in accordance with some embodiments.
Figure 3C:
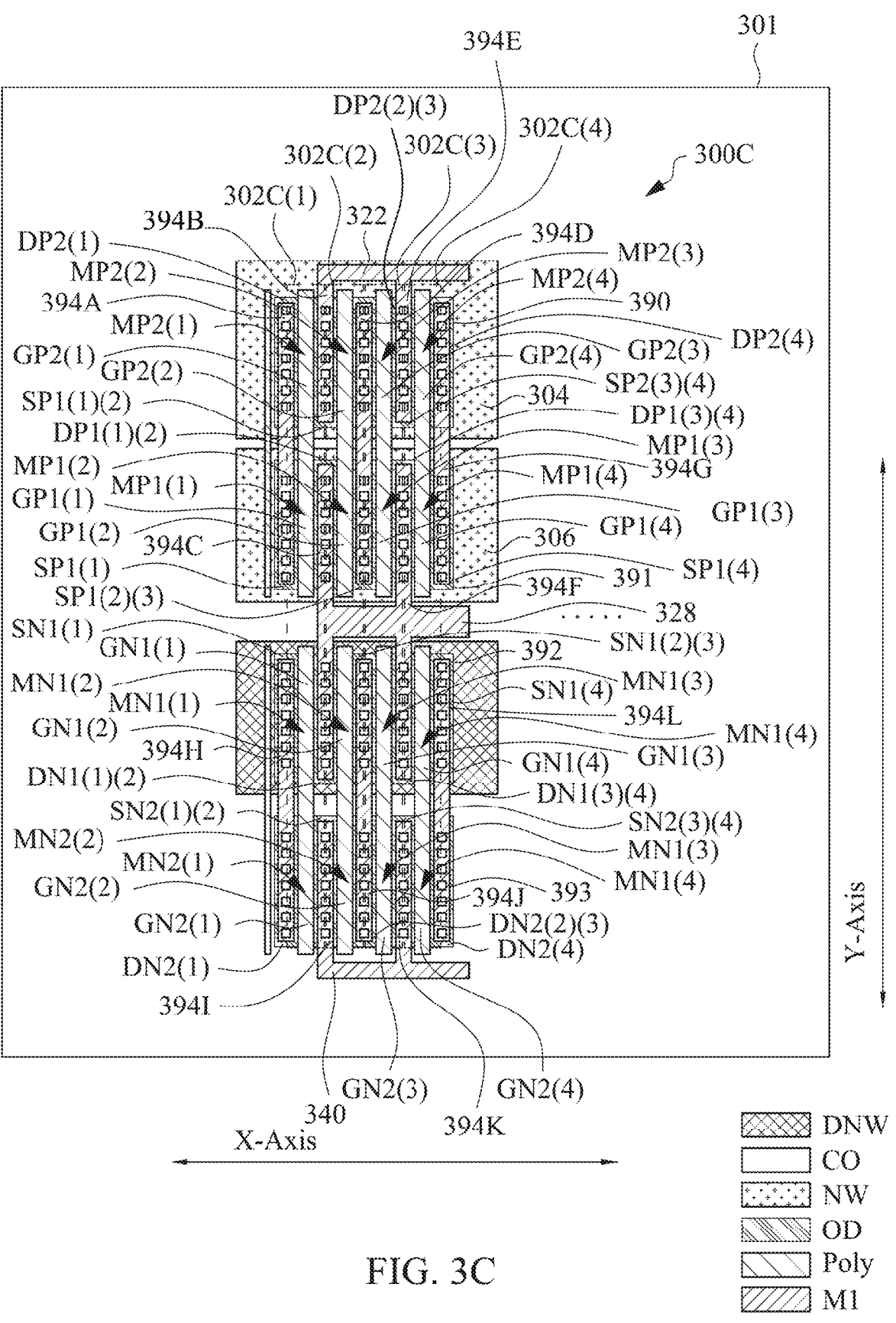
FIG. 3C is a layout diagram of a semiconductor device, in accordance with some embodiments.
Figure 3D:
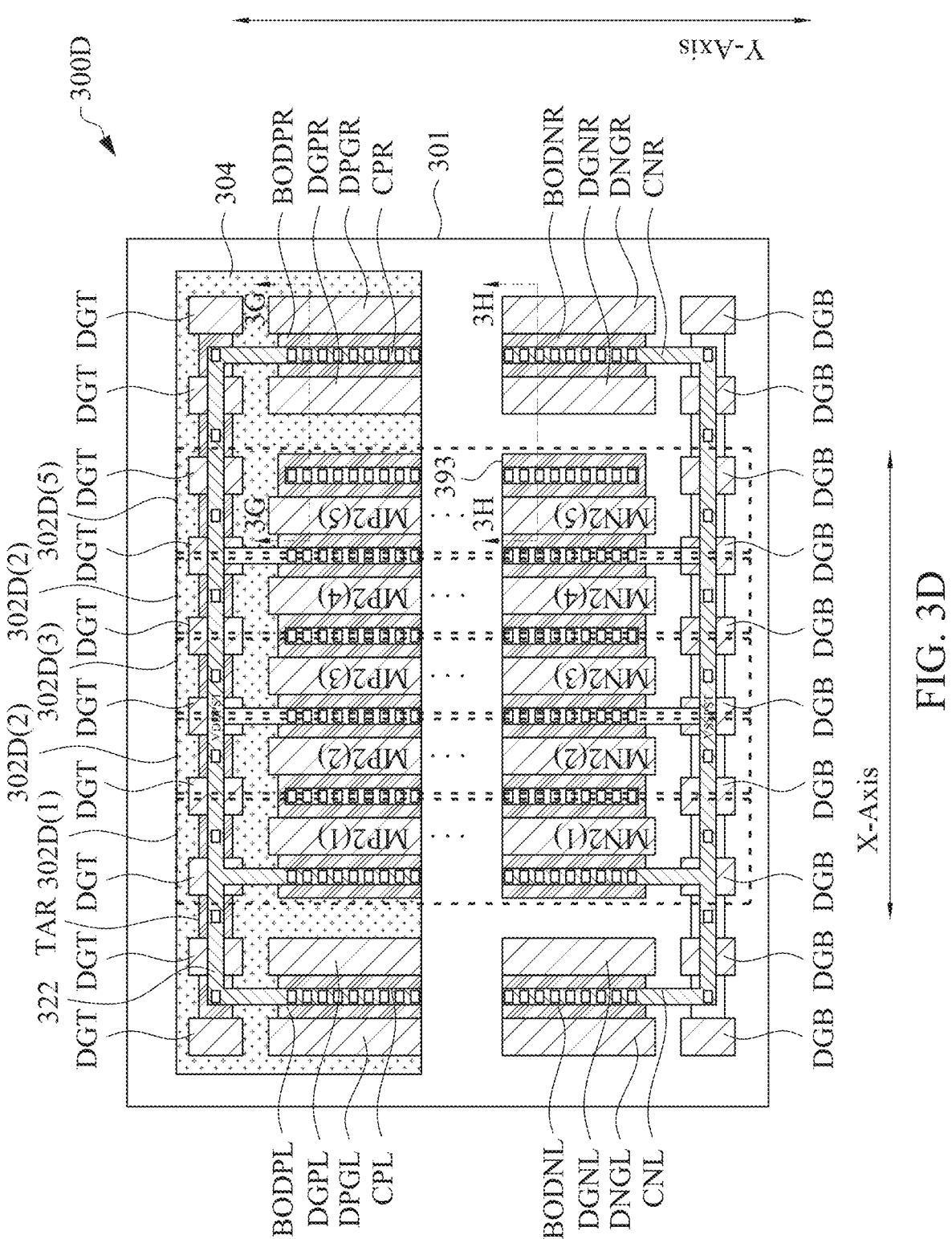
FIG. 3D is a layout diagram of a semiconductor device, in accordance with some embodiments.
Figure 3E:
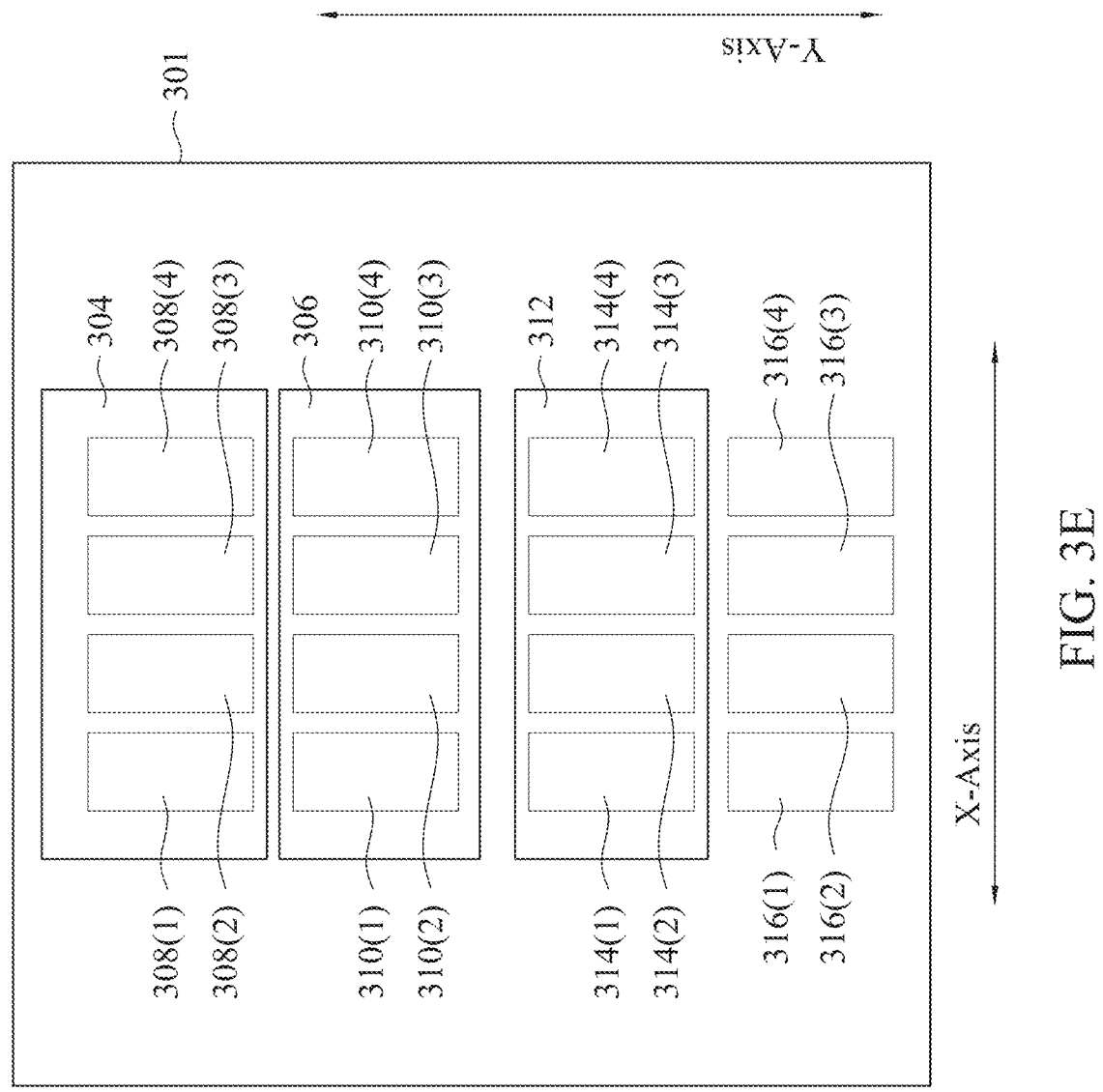
FIG. 3E is a layout diagram that shows the semiconductor substrate in FIG. 3A, in accordance with some embodiments.

Referring now to FIGS. 3A and 3E, layout diagram 300A includes a semiconductor substrate 301. FIG. 3E is a layout diagram that only shows semiconductor substrate 301.

Semiconductor substrate 301 is a bulk-body type semiconductor substrate. Semiconductor substrate 301 defines a first well region 304 and a second well region 306. First well region 304 and second well region 306 are each N-Well regions. First well region 304 has a long axis that extends in a first direction (which in this embodiment is a first horizontal direction that is parallel to the X-axis). Active regions 308(1), 308(2), 308(3), 308(4) are within first well region 304. Active regions 308(1), 308(2), 308(3), 308(4) are sometimes referred to as oxide-definition (OD) regions. Active regions 308(1), 308(2), 308(3), 308(4) are referred to generically or collectively as active region(s) 308. Active regions 308(1), 308(2), 308(3), 308(4) are each separated and are used to form a PMOS transistor that corresponds to PMOS transistor MP2 in FIG. 1 as explained in further detail below. More specifically, active regions 308(1), 308(2), 308(3), 308(4) are separated from one another with respect to the first direction and are aligned with respect to a second direction (the second horizontal direction that is parallel to the Y-axis), wherein the second direction is perpendicular to the first direction. A third direction (a vertical direction parallel to a Z-axis) is not shown in FIG. 3A but comes out of the page with respect to FIG. 3A. A row of PMOS transistors that correspond to PMOS transistor MP2 in FIG. 1 in circuit 302A(1), circuit 302A(2), circuit 302A(3), and circuit 302A(4) are provided by active regions 308(1), 308(2), 308(3), 308(4). Each of active regions 308(1), 308(2), 308(3), 308(4) has P-type conductivity.

Each of active regions 308(1), 308(2), 308(3), 308(4) is aligned with respect to the second direction meaning each of active regions at least partially occupy the same positions with respect to the second direction (parallel to Y-axis). Active regions 308(1), 308(2), 308(3), 308(4) are separated with respect to first direction (parallel to X-axis) meaning that they do not occupy the same positions with respect to the first direction.

Second well region 306 has a long axis that extends in the first direction (parallel to X-axis) and is separated from first well region 304 with respect the second direction (parallel to Y-axis). First well region 304 and second well region 306 are aligned with respect to the first direction. Active regions 310(1), 310(2), 310(3), 310(4) are within second well region 306. Active regions 310(1), 310(2), 310(3), 310(4) are referred to generically or collectively as active region(s) 310. Active regions 310(1), 310(2), 310(3), 310(4) are each separated and are used to form a PMOS transistor that corresponds to PMOS transistor MP1 in FIG. 1 as explained in further detail below. More specifically, active regions 310(1), 310(2), 310(3), 310(4) are separated from one another with respect to the first direction and are aligned with respect to the second direction. A row of PMOS transistors that correspond to PMOS transistor MP1 in FIG. 1 in each of circuit 302A(1), circuit 302A(2), circuit 302A(3), and circuit 302A(4) are provided by active regions 310(1), 310(2), 310(3), 310(4). Each of active regions 310(1), 310(2), 310(3), 310(4) has P-type conductivity.

Each of active regions 310(1), 310(2), 310(3), 310(4) is aligned with respected to the second direction (parallel to Y-axis) and are separated with respect to first direction (parallel to X-axis).

Semiconductor substrate 301 defines a third well region 312. Third well region 312 is a deep N-Well (DNW) region. Deep N-well is a region that serves as a guard ring to suppress noise, in some embodiments. Third well region 312 is separated from first well region 304 and second well region 306 with respect to second direction. Third well region 312 has a long axis that extends in the first direction (parallel to the X-axis). Active regions 314(1), 314(2), 314(3), 314(4) are within third well region 312. Active regions 314(1), 314(2), 314(3), 314(4) are referred to generically or collectively as active region(s) 314.

Active regions 314(1), 314(2), 314(3), 314(4) are each separated and are used to form a NMOS transistor that corresponds to NMOS transistor MN1 in FIG. 1 as explained in further detail below. More specifically, active regions 314(1), 314(2), 314(3), 314(4) are separated from one another with respect to the first direction and are aligned with respect to the second direction. A row of NMOS transistors that correspond to NMOS transistor MN1 in FIG. 1 in each of circuit 302A(1), circuit 302A(2), circuit 302A(3), and circuit 302A(4) are provided by active regions 314(1), 314(2), 314(3), 314(4). Each of active regions 314(1), 314(2), 314(3), 314(4) has N-type conductivity.

Semiconductor substrate 301 also has active regions 316(1), 316(2), 316(3), 316(4). Active regions 316(1), 316(2), 316(3), 316(4) are aligned with respect to the second direction but are separated with respect to the first direction. Active regions 316(1), 316(2), 316(3), 316(4) are each separated and are used to form a NMOS transistor that corresponds to NMOS transistor MN2 in FIG. 1 as explained in further detail below. More specifically, active regions 316(1), 316(2), 316(3), 316(4) are separated from one another with respect to the first direction and are aligned with respect to the second direction. A row of NMOS transistors that correspond to NMOS transistor MN2 in FIG. 1 in each of circuit 302A(1), circuit 302A(2), circuit 302A(3), and circuit 302A(4) are provided by active regions 316(1), 316(2), 316(3), 316(4). Each of active regions 316(1), 316(2), 316(3), 316(4) has N-type conductivity.

Active region 316(1) is separated from active regions 308(1), 310(1), 314(1) with respect to the second direction but aligned with active regions 308(1), 310(1), 314(1) with respect to first direction. Active regions 308(1), 310(1), 314(1), 316(1) thus form a column of active regions. Active regions 308(2), 310(2), 314(2), 316(2) form a column of active regions in a similar manner. Active regions 308(3), 310(3), 314(3), 316(3) also form a column of active regions in a similar manner. Finally, active regions 308(4), 310(4), 314(4), 316(4) also form a column of active regions in a similar manner.

Referring again to FIG. 3A, a detailed explanation is now provided for circuit 302A(1). It should be noted that circuits 302A(2), 302A(3), 302A(4) each have an arrangement that is similar to the arrangement of circuit 302A(1). An explanation of circuits 302A(2), 302A(3), 302A(4) is therefore omitted for the sake of brevity. With respect to circuit 302A(1), circuit 302A(1) includes a transistor MP2(1) that corresponds to transistor MP2 in FIG. 1, a transistor MP1(1) that corresponds to transistor MP1 in FIG. 1, a transistor MN2(1) that corresponds to transistor MN2 in FIG. 1, and a transistor MN1(1) that corresponds to transistor MN1 in FIG. 1.

A gate electrode 318(1) has a long axis that extends in the second direction (parallel to Y-axis) on both first active region 308(1) and second active region 310(1). Gate electrode 318(1) is formed on and over first active region 308(1) and second active region 310(1) in a polysilicon (Poly) layer. The second direction parallel to the Y direction is sometimes referred to as the Poly direction.

Accordingly, a portion of gate electrode 318(1) on first active region 308(1) is gate GP2(1) of transistor MP2(1) and a portion of gate electrode 318(1) on second active region 310(1) is gate GP1(1) of transistor MP1(1). The section of first active region 308(1) to the left of gate GP2(1) is drain DP2(1) of transistor MP2(1) and the section of first active region 308(1) to the right of gate GP2(1) is source SP2(1) of transistor MP2(1). The section of second active region 310(1) to the left of gate GP1(1) is source SP1(1) of transistor MP1(1) and the section of second active region 310(1) to the right of gate GP1(1) is drain DP1(1) of transistor MP1(1).

A gate electrode 320(1) has a long axis that extends in the second direction (parallel to Y-axis) on both third active region 314(1) and fourth active region 316(1). Gate electrode 320(1) is formed on and over third active region 314(1) and fourth active region 316(1) in the Poly layer.

Accordingly, a portion of gate electrode 320(1) on third active region 314(1) is gate GN1(1) of transistor MN1(1) and portion of gate electrode 320(1) on fourth active region 316(1) is gate GN2(1) of transistor MN2(1). The section of third active region 314(1) to the right of gate GN1(1) is drain DN1(1) of transistor MN1(1) and the section of third active region 314(1) to the left of gate GN1(1) is source SN1(1) of transistor MN1(1). The section of fourth active region 316(1) to the right of gate GN1(1) is source SN2(1) of transistor MN2(1) and the section of fourth active region 316(1) to the left of gate GN1(1) is drain DN2(1) of transistor MN2(1). In some embodiments, contacts for source SP2(1), drain DP2(1), source SP1(1), drain DP1(1), source SN2(1), drain DN2(1), source SN1(1), drain DN1(1) are formed on and over active regions 308(1), 310(1), 314(1), 316(1) in a metal-to-device (MD) layer and a via to device layer (MD/VD) layer, which is collectively referred to as MD/VD layer.

A conductor 322 has a long axis that extends in the first direction (parallel to the X-axis). Conductor 322 is configured to receive reference voltage VDDPST and corresponds to power reference node 104 in FIG. 1. A conductor 324(1) has a long axis that extends in the second direction (parallel to the Y-axis). Conductor 324(1) is connected to conductor 322 and thus also is configured to receive reference voltage VDDPST. Conductor 324(1) extends directly over the entire length of source SP2(1) in the second direction (parallel to Y-axis). Conductors 322, 324(1) are each provided in metal layer M0. Metal layer M0 is provided directly above MD/VD layer with respect to the third direction (parallel to the Z-axis). In this embodiment, a plurality of vias in the MD/VD layer are provided across entire length of conductor 324(1) that connect source SP2(1) of transistor MP2(1) to conductor 324(1). Given that vias are provided across entire length of source SP2(1), in effect, body of transistor MP2(1) is also connected to conductor 324(1) and thus also is configured to receive reference voltage VDDPST.

A conductor 328 has a long axis that extends in the first direction (parallel to the X-axis) and is configured to receive an input/output signal and corresponds to node B is FIG. 1. A conductor 330(1) has a long axis that extends in the second direction (parallel to the Y-axis). Conductor 330(1) is connected to conductor 328 and thus also is configured to receive the input/output signal. Conductor 330(1) extends directly over the entire length of drain DP1(1) in the second direction (parallel to Y-axis). Conductors 328, 330(1) are each provided in metal layer M0. In this embodiment, a plurality of vias in the MD/VD layer are provided across entire length of conductor 330(1) that connect to drain DP1(1) of transistor MP1(1) to conductor 330(1). Thus, conductor 330(1) is also configured to receive input/output signal.

A conductor 334(1) has a long axis that extends in the second direction (parallel to Y-axis). Conductor 334(1) extends over the entire length of drain DP2(1) of transistor MP2(1) and over the entire length of source SP1(1) of transistor MP1(1). Conductor 334(1) is provided in metal layer M0. A plurality of vias in the MD/VD layer are provided across the entire length of drain DP2(1) to connect drain DP2(1) to conductor 334(1). A plurality of vias in the MD/VD layer are provided across the entire length of source SP1(1) to connect source SP1(1) to conductor 334(1). Given that vias, are provided across entire length of source SP1(1), in effect, body of transistor MP1(1) is also connected to conductor 334(1). In this manner, body of transistor MP1(1) is connected to source SP1(1) and drain DP2(1). However, conductor 334(1), source SP1(1), and drain DP2(2) are electrically disconnected from body of transistor MP2(1), source SP2(1), and conductors 322, 324(1). Conductor 334 (1) and vias in MD/VD layer provide the network net0, as described in FIG. 1. In some embodiments, conductors in network net0 are connected to each other by one or more conductors in a higher metal layer.

A conductor 340 has a long axis that extends in the first direction (parallel to the X-axis). Conductor 340 is configured to receive the reference voltage VSSPST and corresponds to power reference node 106 in FIG. 1. A conductor 342(1) has a long axis that extends in the second direction (parallel to the Y-axis). Conductor 342(1) is connected to conductor 340 and thus also is configured to receive reference voltage VSSPST. Conductor 342(1) extends directly over the entire length of source SN2(1) in the second direction (parallel to Y-axis). Conductors 340, 342(1) are each provided in metal layer M0. In this embodiment, a plurality of vias in the MD/VD layer are provided across entire length of conductor 342(1) that connect to source SN2(1) of transistor MN2(1) to conductor 342(1). Given that vias are provided across entire length of source SN2(1), in effect, body of transistor MN2(1) is also connected to conductor 342(1) and thus also is configured to receive reference voltage VSSPST.

Conductor 330(1) also extends directly over the entire length of drain DN1(1) in the second direction (parallel to Y-axis). Conductors 328, 330(1) are each provided in metal layer M0. In this embodiment, a plurality of vias in the MD/VD layer are provided across the entire length of drain DN1(1) of transistor MN1(1) to connect drain DN(1) to conductor 330(1).

A conductor 350(1) has a long axis that extends in the second direction (parallel to Y-axis). Conductor 350(1) extends over the entire length of drain DN2(1) of transistor MN2(1) and over the entire length of source SN1(1) of transistor MN1(1). Conductor 350(1) is provided in metal layer M0. A plurality of vias in the MD/VD layer are provided across the entire length of drain DN2(1) to connect drain DN2(1) to conductor 350(1). A plurality of vias in the MD/VD layer are provided across the entire length of source SN1(1) to connect source SN1(1) to conductor 350(1). Given that vias are provided across entire length of source SN1(1), in effect, body of transistor MN1(1) is also connected to conductor 350(1). In this manner, body of transistor MN1(1) is connected to source SN1(1) and drain DN2(1). However, conductor 350(1), source SN1(1), and drain DN2(1) are electrically disconnected from body of transistor MN2(1), source SN2(1), and conductors 340, 342(1). Conductor 350(1) and vias in MD/VD layer provide the network net1, as described in FIG. 1. In some embodiments, conductors in network net1 are connected to each other by one or more conductors in a higher metal layer.

Circuits 302A(2), 302A(3), 302A(4) are arranged in the same manner as circuit 302A(1) and thus a description of their arrangement is not repeated herein. Accordingly, conductor 322, conductor 328, and conductor 340 connect circuits 302A(1), 302A(2), 302A(3), 302A(4) in parallel.

FIG. 3B is a layout diagram 300B of a semiconductor device, in accordance with some embodiments.

Layout diagram 300B represents various features of the semiconductor device as shapes. Features of layout diagram 300B are discussed with reference to the semiconductor components that the illustrated shapes represent.

Layout diagram 300B includes circuit 302B(1), circuit 302B(2), circuit 302B(3), and circuit 302B(4). Each of circuit 302B(1), circuit 302B(2), circuit 302B(3), and circuit 302B(4) are an example of the circuit shown in semiconductor device 100 of FIG. 1.

Semiconductor substrate 301 is arranged in the same manner in layout diagram 300B as in layout diagram 300A from FIG. 3A and FIG. 3E. Accordingly, wells 304, 306, 308 are provided in layout diagram 300B in the same manner as provided in 300A, as shown in FIG. 3A and FIG. 3E. Similarly active regions 308(1), 308(2), 308(3), 308(4), 310(1), 310(2), 310(3), 310(4), 314(1), 314(2), 314(3), 314(4), 316(1), 316(2), 316(3), 316(4) in layout diagram 300B are provided in the same manner as in layout diagram 300A in FIG. 3A and FIG. 3E.

Additionally, the arrangement of transistor MP2(1) with source SP2(1), gate GP2(1), drain DP2(1), transistor MP1(1) with source SP1(1), gate GP1(1), drain DP1(1), transistor MN2(1) with source SN2(1), gate GN2(1), drain DN2(1), transistor MN1(1) with source SN1(1), gate GN1(1), drain DN1(1) are arranged in circuit 302B(1) of FIG. 3A in the same manner as circuit 302A(1) of FIG. 3B. However, circuit 302B(2) is arranged as a mirror image of circuit 302B(1) with respect to the Y-axis. Thus, transistor MP2(2) has source SP2(2) to the left of gate GP2(2) and drain DP2(2) to the right of gate GP2(2). Transistor DP1(2) has source SP1(2) is provided to right of gate GP1(2) and a drain DP1(2) to the left of gate GP1(2). Transistor MN2(2) has a drain DN2(2) to the right of gate GN2(2) and a source SN2(2) to the left of gate GN2(2). Transistor MN1(1) has a drain DN1(2) is provided to the left of gate GN1(2) and source SN1(2) is provided to the right of gate GN1(2). Also, the arrangement of conductors 334(1) (See FIG. 3A) and 350(1) (See FIG. 3A) are the same in FIG. 3A and FIG. 3B and thus are omitted from the discussion and in FIG. 3B.

In FIG. 3B, source SP2(1) is directly adjacent to source SP2(2). As such, conductor 360 is wide enough to be provided over both sources SP2(1), SP2(2) and extend the length of source SP2(1) and the length of source SP2(2) with respect to the second direction (parallel to the Y-axis). A plurality of vias in the MD/VD layer connect conductor 360 to source SP2(1) and a plurality of vias in the MD/VD layer connect conductor 360 to source SP2(2). Conductor 360 is connected to conductor 322 and thus conductor 360 is configured to receive reference voltage VDDPST.

Furthermore, drain DP1(1) is directly adjacent to drain DP1(2). As such, conductor 364 is wide enough to be provided over both drain DP1(1), DP1(2) and extend the length of drain DP1(1) and the length of drain DP1(2) with respect to the second direction (parallel to the Y-axis). A plurality of vias in the MD/VD layer connect conductor 364 to drain DP1(1) and a plurality of vias in the MD/VD layer connect conductor 364 to drain DP1(2). Conductor 364 is connected to conductor 328 and thus conductor 364 is configured to receive the input/output signal.

Also, drain DN1(1) is directly adjacent to drain DN1(2). Conductor 364 is also wide enough to be provided over both drain DN1(1), DN1(2) and extend the length of drain DN1(1) and the length of drain DN1(2) with respect to the second direction (parallel to the Y-axis). A plurality of vias in the MD/VD layer connect conductor 364 to drain DN1(1) and a plurality of vias in the MD/VD layer connect conductor 364 to drain DN1(2).

Finally, source SN2(1) is directly adjacent to source SN2(2). As such, conductor 370 is wide enough to be provided over both source SN2(1), SN2(2) and extend the length of source SN2(1) and the length of source SN2(2) with respect to the second direction (parallel to the Y-axis). A plurality of vias in the MD/VD layer connect conductor 370 to source SN2(1) and a plurality of vias in the MD/VD layer connect conductor 370 to source SN2(2). Conductor 370 is connected to conductor 340 and thus conductor 370 is configured to receive reference voltage VSSPST.

Circuit 300B(3) is arranged as circuit 300B(1) and thus as a mirror image of 300B(2) with respect to the second direction (parallel to the Y-axis).

Thus, transistor MP2(3) has source SP2(3) to the right of gate GP2(3) and drain DP2(3) to the left of gate GP2(3). Transistor DP1(3) has source SP1(3) is provided to left of gate GP1(3) and a drain DP1(3) to the right of gate GP1(3). Transistor MN2(3) has a drain DN2(3) to the left of gate GN2(3) and a source SN2(3) to the right of gate GN2(3). Transistor MN1(1) has a drain DN1(3) is provided to the right of gate GN1(3) and source SN1(3) is provided to the left of gate GN1(3).

In this manner, drain DP2(2) is directly adjacent to drain DP2(3). As such, conductor 380 is wide enough to be provided over both drain DP2(2), DP2(3) and extend the length of drain DP2(2) and the length of drain DP2(3) with respect to the second direction (parallel to the Y-axis). A plurality of vias in the MD/VD layer connect conductor 380 to drain DP1(2) and a plurality of vias in the MD/VD layer connect conductor 380 to drain DP1(3).

Conductor 380 is also wide enough to be provided over both source SP1(2), SP1(3) and extend the length of source SP1(2) and the length of source SP1(3) with respect to the second direction (parallel to the Y-axis). A plurality of vias in the MD/VD layer connect conductor 380 to the entire length of source SP1(2) with respect to the second direction and a plurality of vias in the MD/VD layer connect conductor 380 to the entire length of source SP1(3) with respect to the second direction. In this manner, the bodies of transistors MP1(3), MP1(2) are connected to drain DP2(3), drain DP2(2), source SP1(3), and source SP1(2). Conductor 380, drain DP2(3), drain DP2(2), source SP1(3), and source SP1(2) are electrically disconnected from conductor 322, source SP2(3), and source SP2(2).

Also, source SP1(2) is directly adjacent to source SP1(3). Conductor 380 is also wide enough to be provided over both source SP1(2), SP1(3) and extend the length of source SP1(2) and the length of source SP1(3) with respect to the second direction (parallel to the Y-axis). A plurality of vias in the MD/VD layer connect conductor 380 to source SP1(2) and a plurality of vias in the MD/VD layer connect conductor 380 to source SP1(3).

Additionally, source SN1(2) is directly adjacent to source SN1(3). Conductor 383 is also wide enough to be provided over both source SN1(2), SN1(3) and extend the length of source SN1(2) and the length of source SN1(3) with respect to the second direction (parallel to the Y-axis). A plurality of vias in the MD/VD layer connect conductor 383 to the entire length of source SN1(2) with respect to the second direction and a plurality of vias in the MD/VD layer connect conductor 383 to entire length of source SN1(3) with respect to the second direction. In this manner, the bodies of transistors MN1(3), MN1(2) are connected to drain DN2(3), drain DN2(2), source SN1(3), and source SN1(2).

Finally, drain DN2(2) is directly adjacent to drain DN2(3). As such, conductor 383 is wide enough to be provided over both drain DN2(2), DN2(3) and extend the length of drain DN2(2) and the length of drain DN2(3) with respect to the second direction (parallel to the Y-axis). A plurality of vias in the MD/VD layer connect conductor 383 to drain DN1(2) and a plurality of vias in the MD/VD layer connect conductor 383 to drain DN1(3). Conductor 383, drain DN2(3), drain DN2(2), source SN1(3), and source SN1(2) are electrically disconnected from conductor 322, source SN2(3), and source SN2(2).

Source SP2(3) is directly adjacent to source SP2(4). As such, conductor 365 is wide enough to be provided over both sources SP2(3), SP2(4) and extend the length of source SP2(3) and the length of source SP2(4) with respect to the second direction (parallel to the Y-axis). A plurality of vias in the MD/VD layer connect conductor 365 to source SP2(3) and a plurality of vias in the MD/VD layer connect conductor 365 to source SP2(4). Conductor 365 is connected to conductor 322 and thus conductor 365 is configured to receive reference voltage VDDPST.

Furthermore, drain DP1(3) is directly adjacent to drain DP1(4). As such, conductor 367 is wide enough to be provided over both drain DP1(3), DP1(4) and extend the length of drain DP1(3) and the length of drain DP1(4) with respect to the second direction (parallel to the Y-axis). A plurality of vias in the MD/VD layer connect conductor 367 to drain DP1(3) and a plurality of vias in the MD/VD layer connect conductor 367 to drain DP1(4). Conductor 367 is connected to conductor 328 and thus conductor 367 is configured to receive the input/output signal.

Also, drain DN1(3) is directly adjacent to drain DN1(4). Conductor 367 is also wide enough to be provided over both drain DN1(3), DN1(4) and extend the length of drain DN1(3) and the length of drain DN1(4) with respect to the second direction (parallel to the Y-axis). A plurality of vias in the MD/VD layer connect conductor 367 to drain DN1(3) and a plurality of vias in the MD/VD layer connect conductor 367 to drain DN1(4).

Additionally, source SN2(3) is directly adjacent to source SN2(4). As such, conductor 371 is wide enough to be provided over both source SN2(3), SN2(4) and extend the length of source SN2(3) and the length of source SN2(4) with respect to the second direction (parallel to the Y-axis). A plurality of vias in the MD/VD layer connect conductor 371 to source SN2(3) and a plurality of vias in the MD/VD layer connect conductor 371 to source SN2(4). Conductor 371 is connected to conductor 340 and thus conductor 371 is configured to receive the reference voltage VSSPST.

A conductor 375 has a long axis that extends in the second direction (parallel to Y-axis). Conductor 375 extends over the entire length of drain DP2(4) of transistor MP2(4) and over the entire length of source SP1(4) of transistor MP1(4). Conductor 375 is provided in metal layer M0. A plurality of vias 336(4) are provided across the entire length of drain DP2(4) to connect drain DP2(4) to conductor 375. A plurality of vias in the MD/VD layer are provided across the entire length of source SP1(4) to connect source SP1(4) to conductor 375. Given that vias are provided across entire length of source SP1(4), in effect, body of transistor MP1(4) is also connected to conductor 375. In this manner, body of transistor MP1(4) is connected to source SP1(4) and drain DP2(4). However, conductor 375 is electrically disconnected from body of transistor MP2(4), and source SP2(4). Conductors 334(1) (See FIG. 3A), 375, 380 and vias in MD/VD layer provide the network net0, as described in FIG. 1. In some embodiments, conductors in network net0 are connected to each other by one or more conductors in a higher metal layer.

A conductor 377 has a long axis that extends in the second direction (parallel to Y-axis). Conductor 377 extends over the entire length of drain DN2(4) of transistor MN2(4) and over the entire length of source SN1(4) of transistor MN1(4). Conductor 377 is provided in metal layer M0. A plurality of vias are provided across the entire length of drain DN2(4) to connect drain DN2(4) to conductor 377. A plurality of vias in the MD/VD layer are provided across the entire length of source SN1(4) to connect source SN1(4) to conductor 377. Given that vias are provided across entire length of source SN1(4), in effect, body of transistor MN1(4) is also connected to conductor 377. In this manner, body of transistor MN1(4) is connected to source SN1(4) and drain DN2(4). However, conductor 377 is electrically disconnected from body of transistor MN2(4) and source SN2. Accordingly, conductor 322, conductor 328, and conductor 340 connect circuits 302A(1), 302A(2), 302A(3), 302A(4) in parallel. Conductor 350(1)(See FIG. 3A), 377, 383 and vias in MD/VD layer provide the network net1, as described in FIG. 1. In some embodiments, conductors in network net1 are connected to each other by one or more conductors in a higher metal layer.

FIG. 3C is a layout diagram 300C of a semiconductor device, in accordance with some embodiments.

Layout diagram 300C represents various features of the semiconductor device as shapes. Features of layout diagram 300C are discussed with reference to the semiconductor components that the illustrated shapes represent.

Layout diagram 300C includes circuit 302C(1), circuit 302C(2), circuit 302C(3), and circuit 302C(4). Each of circuit 302C(1), circuit 302C(2), circuit 302C(3), and circuit 302C(4) are an example of the circuit shown in semiconductor device 100 of FIG. 1.

Figure 3F:
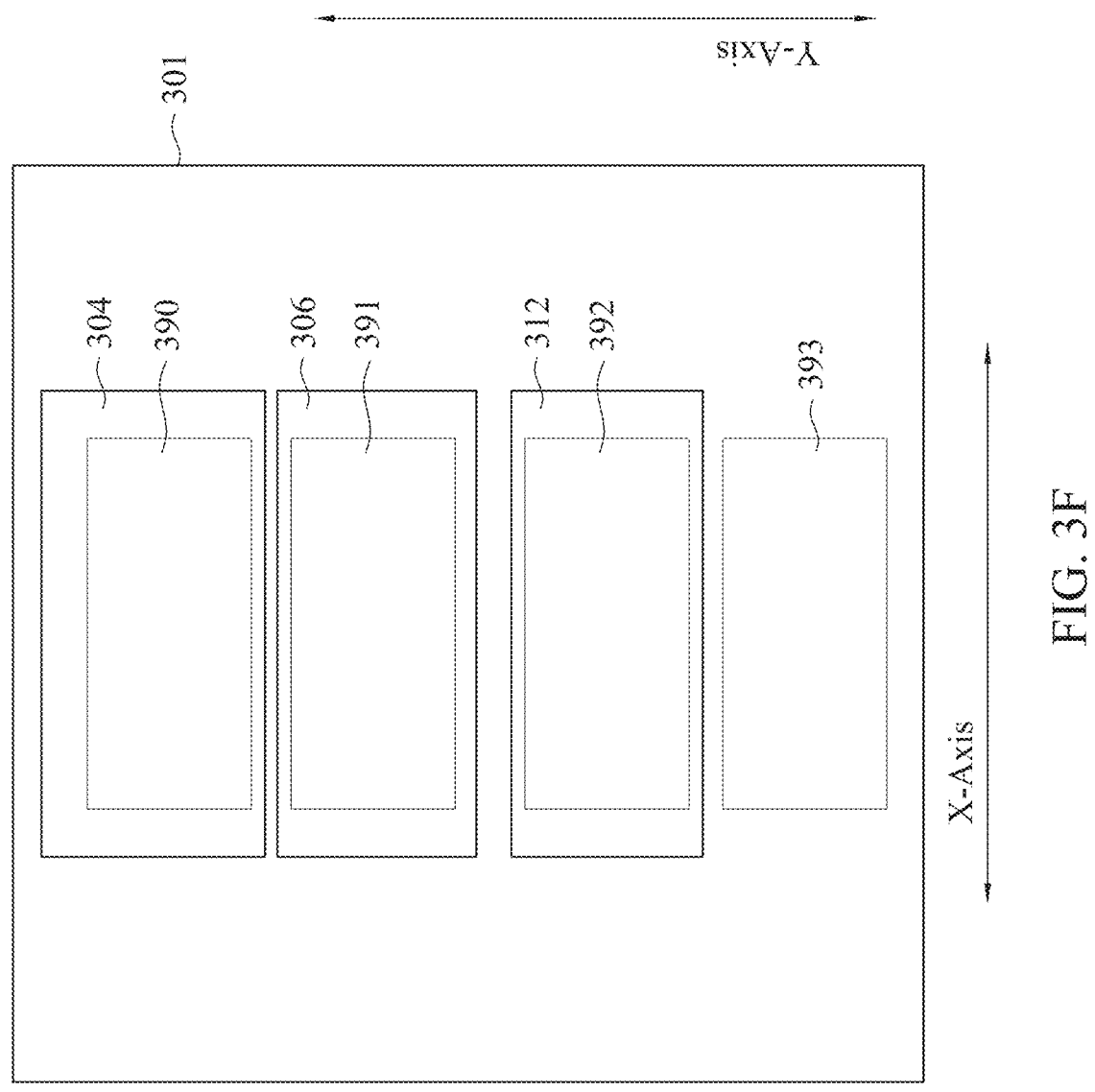
FIG. 3F is a layout diagram that shows the semiconductor substrate in FIG. 3C, in accordance with some embodiments.

Referring now to FIG. 3C and FIG. 3F, FIG. 3F is a diagram illustrating another embodiment of the semiconductor substrate 301, which is the embodiment that is used in FIG. 3C.

Rather than having active regions 308(1), 308(2), 308(3), 308(4) as in FIGS. 3A and 3E where each of transistor MP2(1), MP2(2), MP2(3), MP2(4) are formed on a corresponding one of active regions 308(1), 308(2), 308(3), 308(4), in FIGS. 3C and 3F, transistor MP2(1), MP2(2), MP2(3), MP2(4) are each formed in active region 390. Active region 390 is provided in first well 304.

Additionally, rather than having active regions 310(1), 310(2), 310(3), 310(4) as in FIG. 3A and FIG. 3E where each of transistor MP1(1), MP1(2), MP1(3), MP1(4) are formed on a corresponding one of active regions 310(1), 310(2), 310(3), 310(4), in FIG. 3C and FIG. 3F, transistor MP1(1), MP1(2), MP1(3), MP1(4) are each formed in active region 391. Active region 391 is provided in second well 306.

Also, rather than having active regions 314(1), 314(2), 314(3), 314(4) as in FIG. 3A and FIG. 3E, where each of transistor MN1(1), MN1(2), MN1(3), MN1(4) are formed on a corresponding one of active regions 314(1), 314(2), 314(3), 314(4), in FIG. 3C and FIG. 3F, transistor MN1(1), MN1(2), MN1(3), MN1(4) are each formed in active region 392. Active region 392 is provided in third well 312.

Finally, rather than having active regions 316(1), 316(2), 316(3), 316(4) as in FIG. 3A and FIG. 3E, where each of transistor MN2(1), MN2(2), MN2(3), MN2(4) are formed on a corresponding one of active regions 316(1 316(2), 316(3), 316(4). However, in FIG. 3C, transistor MN2(1), MN2(2), MN2(3), MN2(4) are each formed in active region 393. Active region 393 is below the active region 392 relative to the second direction (parallel to the Y-axis).

Referring again to FIG. 3C, with respect to active regions 390, 391, active regions 390, 391 have P-type conductivity. Within circuit 302C(1), an electrode has a long axis that extends in the second direction (parallel to the Y-axis) on both active regions 390, 391 so that a portion of the electrode on active region 390 forms a gate GP2(1) of transistor MP2(1) and another and portion of the electrode on active region 391 forms a gate GP1(1) of transistor MP1(1). Within circuit 302C(2), an electrode has a long axis that extends in the second direction (parallel to the Y-axis) on both active regions 390, 391 so that a portion of the electrode on active region 390 forms a gate GP2(2) of transistor MP2(2) and another and portion of the electrode on active region 391 forms a gate GP1(2) of transistor MP1(2). Within circuit 302C(3), an electrode has a long axis that extends in the second direction (parallel to the Y-axis) on both active regions 390, 391 so that a portion of the electrode on active region 390 forms a gate GP2(3) of transistor MP2(3) and another and portion of the electrode on active region 391 forms a gate GP1(3) of transistor MP1(3). Within circuit 302C(4), an electrode has a long axis that extends in the second direction (parallel to the Y-axis) on both active regions 390, 391 so that a portion of the electrode on active region 390 forms a gate GP2(4) of transistor MP2(4) and another and portion of the electrode on active region 391 forms a gate GP1(4) of transistor MP1(4).

With respect to active regions 392, 393, active regions 392, 393 have N-type conductivity. Within circuit 302C(1), an electrode has a long axis that extends in the second direction (parallel to the Y-axis) on both active regions 392, 393 so that a portion of the electrode on active region 392 forms a gate GN1(1) of transistor MN1(1) and another and portion of the electrode on active region 393 forms a gate GN2(1) of transistor MN2(1). Within circuit 302C(2), an electrode has a long axis that extends in the second direction (parallel to the Y-axis) on both active regions 392, 393 so that a portion of the electrode on active region 392 forms a gate GN1(2) of transistor MN1(2) and another and portion of the electrode on active region 393 forms a gate GN2(2) of transistor MN2(2). Within circuit 302C(3), an electrode has a long axis that extends in the second direction (parallel to the Y-axis) on both active regions 392, 393 so that a portion of the electrode on active region 392 forms a gate GN1(3) of transistor MN1(3) and another and portion of the electrode on active region 393 forms a gate GN2(3) of transistor MN2(3). Within circuit 302C(4), an electrode has a long axis that extends in the second direction (parallel to the Y-axis) on both active regions 392, 393 so that a portion of the electrode on active region 392 forms a gate GN1(4) of transistor MN1(4) and another and portion of the electrode on active region 393 forms a gate GN2(4) of transistor MN2(4).

The portion of region 390 adjacent to and directly to the left of gate GP2(1) is drain DP2(1) of transistor MP2(1). The portion of region 390 adjacent to and directly to the right of gate GP2(1) and adjacent to and directly to the left of gate GP2(2) is source SP2(1)(2) of both transistor MP2(1) and transistor MP2(2). The portion of region 390 adjacent to and directly to the right of gate GP2(2) and adjacent to and directly to the left of gate GP2(3) is drain DP2(2)(3) of both transistor MP2(2) and transistor MP2(3). The portion of region 390 adjacent to and directly to the right of gate GP2(3) and adjacent to and directly to the left of gate GP2(4) is source SP2(3)(4) of both transistor MP2(3) and transistor MP2(4). The portion of region 390 adjacent to and directly to the right of gate GP2(4) is drain DP2(4) of transistor MP2(4).

The portion of region 391 adjacent to and directly to the left of gate GP1(1) is source SP1(1) of transistor MP1(1). The portion of region 391 adjacent to and directly to the right of gate GP1(1) and adjacent to and directly to the left of gate GP1(2) is drain DP1(1)(2) of both transistor MP1(1) and transistor MP1(2). The portion of region 391 adjacent to and directly to the right of gate GP1(2) and adjacent to and directly to the left of gate GP1(3) is source SP1(2)(3) of both transistor MP1(2) and transistor MP1(3). The portion of region 391 adjacent to and directly to the right of gate GP1(3) and adjacent to and directly to the left of gate GP1(4) is drain DP1(3)(4) of both transistor MP1(3) and transistor MP1(4). The portion of region 391 adjacent to and directly to the right of gate GP1(4) is source SP1(4) of transistor MP1(4).

The portion of region 392 adjacent to and directly to the left of gate GN1(1) is source SN1(1) of transistor MN1(1). The portion of region 392 adjacent to and directly to the right of gate GN1(1) and adjacent to and directly to the left of gate GN1(2) is drain DN1(1)(2) of both transistor MN1(1) and transistor MN1(2). The portion of region 392 adjacent to and directly to the right of gate GN1(2) and adjacent to and directly to the left of gate GN1(3) is source SN1(2)(3) of both transistor MN1(2) and transistor MN1(3). The portion of region 392 adjacent to and directly to the right of gate GN1(3) and adjacent to and directly to the left of gate GN1(4) is drain DN1(3)(4) of both transistor MN1(3) and transistor MN1(4). The portion of region 392 adjacent to and directly to the right of gate GN1(4) is source SN1(4) of transistor MN1(4).

The portion of region 393 adjacent to and directly to the left of gate GN2(1) is drain DN2(1) of transistor MN2(1). The portion of region 393 adjacent to and directly to the right of gate GN2(1) and adjacent to and directly to the left of gate GN2(2) is source SN2(1)(2) of both transistor MN2(1) and transistor MN2(2). The portion of region 393 adjacent to and directly to the right of gate GN2(2) and adjacent to and directly to the left of gate GN2(3) is drain DN2(2)(3) of both transistor MN2(2) and transistor MN2(3). The portion of region 393 adjacent to and directly to the right of gate GN2(3) and adjacent to and directly to the left of gate GN2(4) is source SN2(3)(4) of both transistor MN2(3) and transistor MN2(4). The portion of region 393 adjacent to and directly to the right of gate GN2(4) is drain DN2(4) of transistor MN2(4).

A conductor 394A is provided in metal layer M0 that extends across the length of both drain DP2(1) and source SP1(1). A plurality of vias in the MD/VD layer connects conductor 394A to drain DP2(1) and a plurality of vias in the MD/VD layer connects conductor 394A to source SP1(1). In effect, this also connects the body of transistor MP1(1) to source SP1(1) and drain DP2(1). Source SP1(1) and drain DP2(1) are electrically disconnected from source SP2(1)(2) and conductor 322.

A conductor 394B is provided in metal layer M0 that extends across the length of source SP2(1)(2). A plurality of vias in the MD/VD layer connects conductor 394B to source SP2(1)(2). Conductor 394B is directly connected to conductor 322. As such, conductor 394B is also configured to receive the reference voltage VDDPST.

A conductor 394C is provided in metal layer M0 that extends across the length of both drain DP1(1)(2) and drain DN1(1)(2). A plurality of vias in the MD/VD layer connects conductor 394C to drain DP1(1)(2) and a plurality of vias in the MD/VD layer connects conductor 394C to drain DN1(1)(2). Conductor 394C is directly connected to conductor 328 and is therefore configured to receive the input/output signal.

A conductor 394D is provided in metal layer M0 that extends across the length of both drain DP2(2)(3) and source SP1(2)(3). A plurality of vias in the MD/VD layer connects conductor 394D to drain DP2(2)(3) and a plurality of vias in the MD/VD layer connects conductor 394D to source SP1(2)(3). In effect, this also connects the body of transistors MP1(2), MP1(3) to source SP1(2)(3) and drain DP2(2)(3). Conductor 394D, source SP1(2)(3) and drain DP2(2)(3) are electrically disconnected from conductor 322, source SP2(3)(4), and source SP2(1)(2).

A conductor 394E is provided in metal layer M0 that extends across the length of source SP2(3)(4). A plurality of vias in the MD/VD layer connects conductor 394E to source SP2(3)(4). Conductor 394E is directly connected to conductor 322. As such, conductor 394E is also configured to receive the reference voltage VDDPST.

A conductor 394F is provided in metal layer M0 that extends across the length of both drain DP1(3)(4) and drain DN1(3)(4). A plurality of vias in the MD/VD layer connects conductor 394F to drain DP1(3)(4) and a plurality of vias in the MD/VD layer connects conductor 394F to drain DN1(3)(4). Conductor 394F is directly connected to conductor 328 and is therefore configured to receive the input/output signal.

A conductor 394G is provided in metal layer M0 that extends across the length of both drain DP2(4) and source SP1(4). A plurality of vias in the MD/VD layer connects conductor 394G to drain DP2(4) and a plurality of vias in the MD/VD layer connects conductor 394G to source SP1(4). In effect, this also connects the body of transistor MP1(4) to source SP1(4) and drain DP2(4). Conductor 394G, source SP1(4), and drain DP2(4) are electrically disconnected from source SP2(3)(4) and conductor 322. Conductors 334(1) (See FIG. 3A), 394D, 394G and vias in MD/VD layer provide the network net0, as described in FIG. 1. In some embodiments, conductors in network net0 are connected to each other by one or more conductors in a higher metal layer.

A conductor 394H is provided in metal layer M0 that extends across the length of both drain DN2(1) and source SN1(1). A plurality of vias in the MD/VD layer connects conductor 394H to drain DN2(1) and a plurality of vias in the MD/VD layer connects conductor 394H to source SN1(1). In effect, this also connects the body of transistor MN1(1) to source SN1(1) and drain DN2(1). Source SN1(1) and drain DN2(1) are electrically disconnected from conductor 340 and source SN2(1)(2).

A conductor 394I is provided in metal layer M0 that extends across the length of source SN2(1)(2). A plurality of vias in the MD/VD layer connects conductor 394I to source SN2(1)(2). Conductor 394I is directly connected to conductor 340. As such, conductor 394I is also configured to receive the reference voltage VSSPST.

A conductor 394J is provided in metal layer M0 that extends across the length of both drain DN2(2)(3) and source SN1(2)(3). A plurality of vias in the MD/VD layer connects conductor 394J to drain DN2(2)(3) and a plurality of vias in the MD/VD layer connects conductor 394J to source SN1(2)(3). In effect, this also connects the body of transistors MN1(2), MN1(3) to source SN1(2)(3) and drain DN2(2)(3). Conductor 394J, source SN1(2)(3) and drain DN2(2)(3) are electrically disconnected from conductor 340, source SN2(1)(2) and source SN2(3)(4).

A conductor 394K is provided in metal layer M0 that extends across the length of source SN2(3)(4). A plurality of vias in the MD/VD layer connects conductor 394K to source SN2(3)(4). Conductor 394K is directly connected to conductor 340. As such, conductor 394K is also configured to receive the reference voltage VSSPST.

A conductor 394L is provided in metal layer M0 that extends across the length of both drain DN2(4) and source SN1(4). A plurality of vias in the MD/VD layer connects conductor 394L to drain DN2(4) and a plurality of vias in the MD/VD layer connects conductor 394L to source SN1(4). In effect, this also connects the body of transistor MN1(4) to source SN1(4) and drain DN2(4). Source SN1(4) and drain DN2(4) are electrically disconnected from conductor 340 and source SN2(3)(4). In some embodiments, by using common active regions 390, 391, 392, 393, layout diagram 300C is 30% more spatially efficient. Conductors 350(1) (See FIG. 3A), 394J, 394L and vias in MD/VD layer provide the network net1, as described in FIG. 1. In some embodiments, conductors in network net1 are connected to each other by one or more conductors in a higher metal layer.

With respect to FIGS. 3A-3C, layout diagrams 300A, 300B, 300C represent semiconductor devices with the same circuit design. A semiconductor device fabricated in accordance with layout diagram 300A consumes the most area while a semiconductor device fabricated in accordance with layout diagram 300B consumes less area than the semiconductor device fabricated in accordance with layout diagram 300A. A semiconductor device fabricated in accordance with layout diagram 300C consumes less area than a semiconductor device fabricated in accordance with layout diagram 300B. In some embodiments, a semiconductor device fabricated in accordance with layout diagram 300C consumes 30% less area compared to the semiconductor device fabricated in accordance with layout diagram 300A.

FIG. 3D is a layout diagram 300D of a semiconductor device, in accordance with some embodiments.

Layout diagram 300D represents various features of the semiconductor device as shapes. Features of layout diagram 300D are discussed with reference to the semiconductor components that the illustrated shapes represent.

Layout diagram 300D includes circuit 302D(1), circuit 302D(2), circuit 302D(3), circuit 302D(4), and circuit 302D(5). Each of circuit 302D(1), circuit 302D(2), circuit 302D(3), 302D(4), and circuit 302D(5) is an example of the circuit shown in semiconductor device 100 of FIG. 1.

FIG. 3F is a diagram of another embodiment of the semiconductor substrate 301, which corresponds to the embodiment of FIG. 3C.

Rather than having active regions 308(1), 308(2), 308(3), 308(4) as in FIGS. 3A and 3E where each of transistors MP2(1), MP2(2), MP2(3), MP2(4) are formed on a corresponding one of active regions 308(1), 308(2), 308(3), 308(4), in FIG. 3D and 3F, transistors MP2(1), MP2(2), MP2(3), MP2(4), MP2(5) are each formed in active region 390. Active region 390 is provided in first well 304 above active region 391 (See FIG. 3F). Transistor MP2(1) in FIG. 3D is arranged as a mirror image transistor MP2(1) in FIG. 3C. A transistor MP1(1) (not shown in FIG. 3D) is arranged with a mirror image of transistor MP2(1) in FIG. 3C but is not shown for the sake of convenience. Transistor MP2(2) in FIG. 3D is arranged as a mirror image transistor MP2(2) in FIG. 3C. A transistor MP1(2) (not shown in FIG. 3D) is arranged with transistor MP2(2) in the same manner as a mirror image of transistor MP1(2) in FIG. 3C but is not shown for the sake of convenience. Transistor MP2(3) in FIG. 3D is arranged with a mirror image transistor MP2(3) in FIG. 3C. A transistor MP1(3) (not shown in FIG. 3D) is arranged with transistor MP2(3) as a mirror image of transistor MP1(3) in FIG. 3C but is not shown for the sake of convenience. Transistor MP2(4) in FIG. 3D is arranged as transistor MP2(3) in FIG. 3C. A transistor MP1(4) (not shown in FIG. 3D) is arranged with transistor MP2(4) in the same manner as transistor MP1(3) in FIG. 3C but is not shown for the sake of convenience. Transistor MP2(5) in FIG. 3D is arranged as transistor MP2(4) in FIG. 3C. A transistor MP1(5) (not shown in FIG. 3D) is arranged with transistor MP2(5) in the same manner as transistor MP1(4) in FIG. 3C but is not shown for the sake of convenience.

Rather than having active regions 316(1), 316(2), 316(3), 316(4) as in FIG. 3A and FIG. 3E, where each of transistors MN2(1), MN2(2), MN2(3), MN2(4) are formed on a corresponding one of active regions 316(1), 316(2), 316(3), 316(4). However, in FIG. 3C, transistors MN2(1), MN2(2), MN2(3), MN2(4), MN2(5) are each formed in active region 393. Active region 393 is below the active region 392 (See FIG. 3F) relative to the second direction (parallel to the Y-axis). Transistor MN2(1) in FIG. 3D is arranged as a mirror image transistor MN2(1) in FIG. 3C. A transistor MN1(1) (not shown in FIG. 3D) is arranged with transistor MN2(1) as a mirror image of transistor MN1(1) in FIG. 3C but is not shown for the sake of convenience. Transistor MN2(2) in FIG. 3D is arranged as a mirror image of transistor MN2(2) in FIG. 3C. A transistor MN1(2) (not shown in FIG. 3D) is arranged with transistor MN2(2) as a mirror image of transistor MN1(2) in FIG. 3C but is not shown for the sake of convenience. Transistor MN2(3) in FIG. 3D is arranged as a mirror image of transistor MN2(3) in FIG. 3C. A transistor MN1(3) (not shown in FIG. 3D) is arranged with transistor MN2(3) as a mirror image of transistor MN1(3) in FIG. 3C but is not shown for the sake of convenience. Transistor MN2(4) in FIG. 3D is arranged as transistor MN2(3) in FIG. 3C. A transistor MN1(4) (not shown in FIG. 3D) is arranged with transistor MN2(4) in the same manner as transistor MN1(3) in FIG. 3C but is not shown for the sake of convenience. Transistor MN2(5) in FIG. 3D is arranged as transistor MN2(4) in FIG. 3C. A transistor MN1(5) (not shown in FIG. 3D) is arranged with transistor MN2(5) in the same manner as transistor MN1(4) in FIG. 3C but is not shown for the sake of convenience.

In FIG. 3D, a body region BODPL is formed within the N-Well 304 as an active region. The body region BODPL is separated and to the left of active region 390. Body region BODPL is doped to have n-type conductivity and is provided as a body connection of the transistors MP2(1), MP2(2), MP2(3), MP2(4), MP2(5). Dummy gates DGPL are displaced with respect to the X-axis and are formed on either side of the body region BODPL. Dummy gates DGPL are configured to provide isolation. A conductor CPL is formed in metal layer M0 over body region BODPL. Vias in interconnect layer MD/VD connect the conductor CPL to the conductor 322, where the conductor 322 is configured to receive the voltage VDDPST.

In FIG. 3D, a body region BODPR is formed within the N-Well 304 as an active region. The body region BODPR is separated and to the right of active region 390. Body region BODPR is doped to have n-type conductivity and is provided as a body connection of the transistors MP2(1), MP2(2), MP2(3), MP2(4), MP2(5). Dummy gates DGPR are displaced with respect to the X-axis and are formed on either side of the body region BODPR. Dummy gates DGPR are configured to provide isolation. A conductor CPR is formed in metal layer M0 over body region BODPR. Vias in interconnect layer MD/VD connect the conductor CPR to the conductor 322, where the conductor 322 is configured to receive the voltage VDDPST.

In FIG. 3D, a body region BODNL is formed as an active region. The body region BODNL is separated and to the left of active region 393. Body region BODNL is doped to have p-type conductivity and is provided as a body connection of the transistors MN2(1), MN2(2), MN2(3), MN2(4), MN2(5). Dummy gates DGNL are displaced with respect to the X-axis and are formed on either side of the body region BODNL. Dummy gates DGNL are configured to provide isolation. A conductor CNL is formed in metal layer M0 over body region BODNL. Vias in interconnect layer MD/VD connect the conductor CNL to the conductor 340, where the conductor 340 is configured to receive the voltage VSS.

In FIG. 3D, a body region BODNR is formed as an active region. The body region BODNR is separated and to the right of active region 393. Body region BODNR is doped to have p-type conductivity and is provided as a body connection of the transistors MN2(1), MN2(2), MN2(3), MN2(4), MN2(5). Dummy gates DGNR are displaced with respect to the X-axis and are formed on either side of the body region BODNR. Dummy gates DGNR are configured to provide isolation. A conductor CNR is formed in metal layer M0 over body region BODNR. Vias in interconnect layer MD/VD connect the conductor CNR to the conductor 340, where the conductor 340 is configured to receive the voltage VSS.

In FIG. 3D, a body region BODNL is formed as an active region. The body region BODNL is separated and to the left of active region 393. Body region BODNL is doped to have n-type conductivity and is provided as a body connection of the transistors MN2(1), MN2(2), MN2(3), MN2(4), MN2(5). Dummy gates DGNL are displaced with respect to the X-axis and are formed on either side of the body region BODNL. Dummy gates DGNL are configured to provide isolation. A conductor CNL is formed in metal layer M0 over body region BODNL. Vias in interconnect layer MD/VD connect the conductor CNL to the conductor 340, where the conductor 340 is configured to receive the voltage VSS.

In FIG. 3D, a body region BODNR is formed as an active region. The body region BODNR is separated and to the right of active region 393. Body region BODNR is doped to have n-type conductivity and is provided as a body connection of the transistors MN2(1), MN2(2), MN2(3), MN2(4), MN2(5). Dummy gates DGNR are displaced with respect to the X-axis and are formed on either side of the body region BODNR. Dummy gates DGNR are configured to provide isolation. A conductor CNR is formed in metal layer M0 over body region BODNR. Vias in interconnect layer MD/VD connect the conductor CNR to the conductor 340, where the conductor 340 is configured to receive the voltage VSS.

In FIG. 3D, the conductor 322 extends over an active region TAR. Active region TAR is an active region within the N-Well 304. Active region TAR has n-type conductivity also serves as a body connection for transistors MP2(1), MP2(2), MP2(3), MP2(4), MP2(5). Vias in interconnection layer MD/VD connect the conductor 322 to the active region TAR. Each of the vias that connect the conductor 322 to the active region TAR are located between dummy gates DGT.

In FIG. 3D, the conductor 340 extends over an active region TAB. Active region TAB is an active region. Active region TAB has P-type conductivity also serves as a body connection for transistors MN2(1), MN2(2), MN2(3), MN2(4), MN2(5). Vias in interconnection layer MD/VD connect the conductor 340 to the active region TAB. Each of the vias that connect the conductor 340 to the active region TAB are located between dummy gates DGB.

Figure 3G:
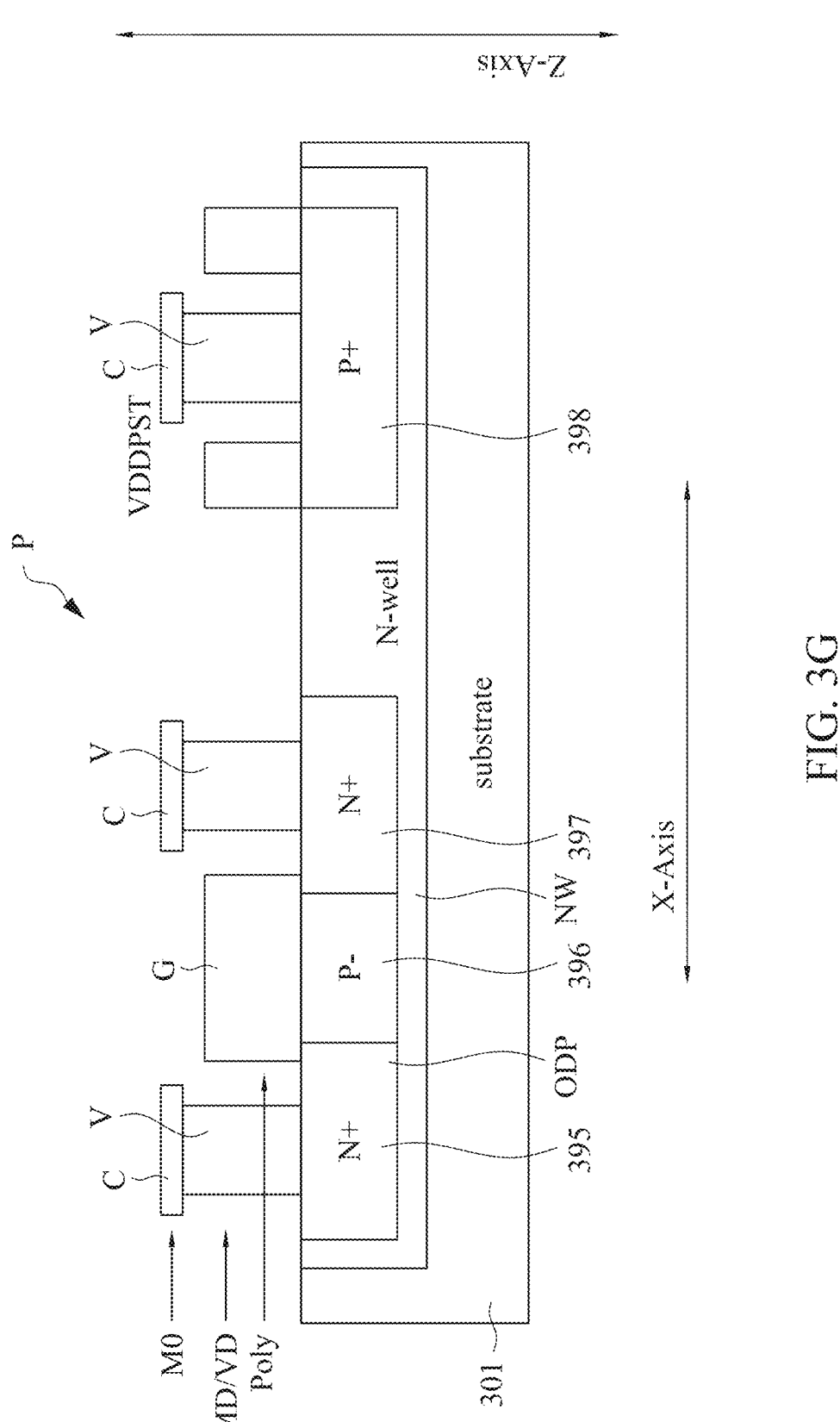
FIG. 3G is a cross-section diagram along cross-section line 3G in FIG. 3D of a PMOS transistor, in accordance with some embodiments.

FIG. 3G is a cross-section diagram along cross-section line 3G in FIG. 3D of a PMOS transistor P.

PMOS transistor P provides one embodiment of a configuration of PMOS transistors MP2, MP1 in FIG. 3A, 3B, 3C and 3D. As shown, PMOS transistor P is formed in semiconductor substrate 301. The semiconductor substrate is formed from, in at least one embodiment, silicon, silicon germanium (SiGe), gallium arsenic, or other suitable semiconductor materials.

An N-Well NW is formed within semiconductor substrate 301. The N-Well NW is a region diffused with N-type impurities. Within the N-Well NW, an active region ODP is formed. The active region ODP includes a heavily doped P region 395, a lightly doped N region 396, and a heavily doped P region 397. Heavily doped P regions 395 are used to form drain/source regions. Lightly doped N region 396 is between the heavily doped P regions 395, 397.

A heavily doped N region 398 is provided in the N-Well NW that is separated from heavily doped P region 395, a lightly doped N region 396, and a heavily doped P region 397. Heavily doped N region 398 is configured to provide a connection to the body of PMOS transistor P. The heavily doped N region 398 corresponds to body regions BODPL, BODPR in FIG. 3D.

In some embodiments, the active region ODP include epitaxially grown silicon (epi Si), silicon carbide, or silicon germanium. The active region ODP of the IC device associated with the gate structure are in-situ doped or undoped during the epi process in some instances. When the active region ODP are undoped during the epi process, the active region ODP are doped during a subsequent process in some instances.

Vias V are located on heavily doped P regions 395, 397 in the MD/VD layer. MD/VD layer is located over semiconductor substrate 301 relative to a third direction that is parallel to the Z-axis. A gate G is located on lightly doped N region 396 in Poly layer. Conductors C are located in metal layer M0, which is directly over MD/VD layer relative to the third direction. Vias V connect conductors C to their respective sections of active region ODP. Via V and conductor C on heavily doped N region 398 are connected to the body of PMOS transistor P. With respect to the PMOS transistors MP1 discussed above, conductor C is connected to the source of PMOS transistor MP1 and the drain of PMOS transistor MP2. With respect to PMOS transistor MP2, conductor C is configured to receive the reference voltage VDDPST.

Figure 3H:
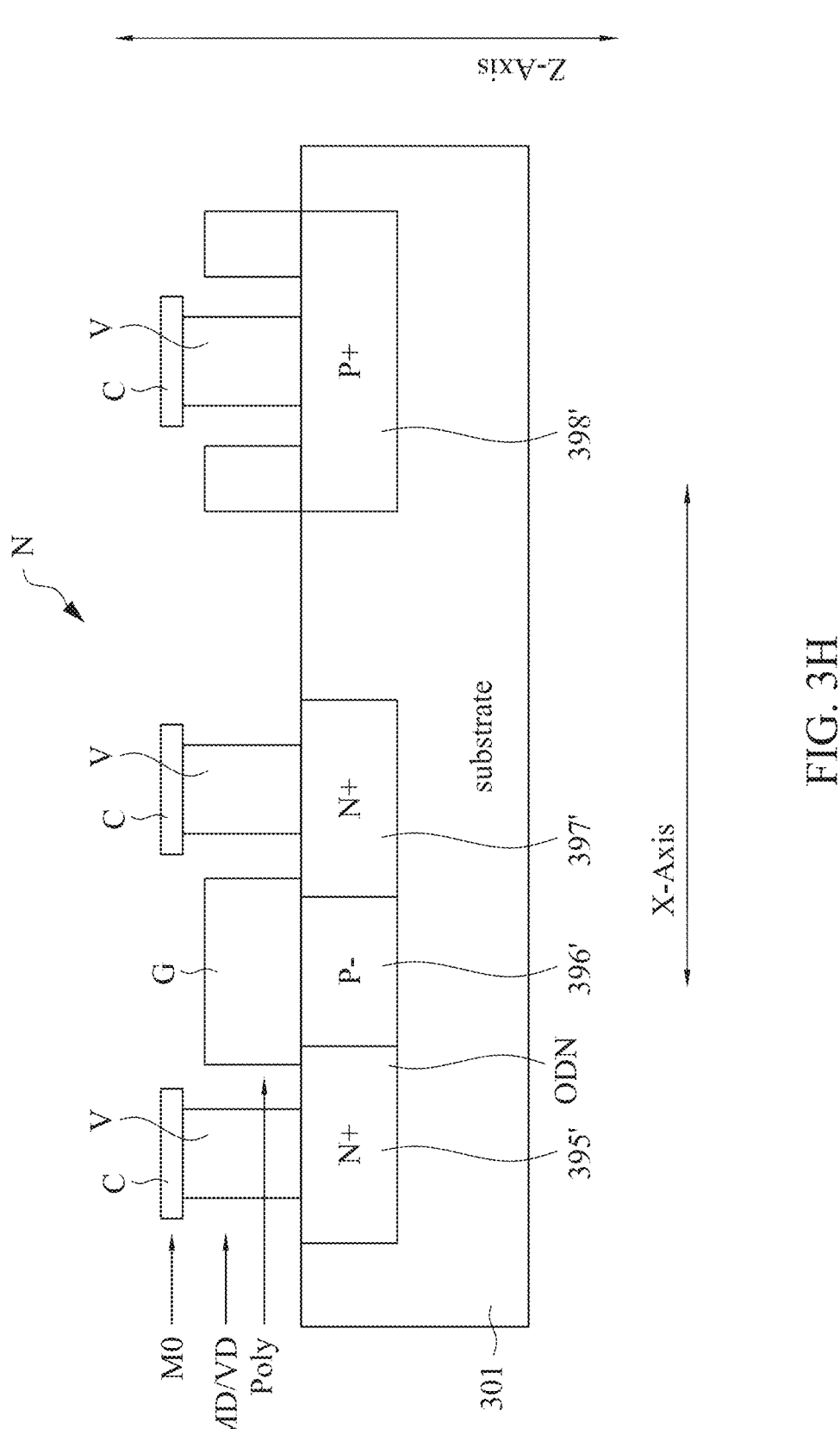
FIG. 3H is a cross-section diagram along cross-section line 3H in FIG. 3D of a NMOS transistor, in accordance with some embodiments.

FIG. 3H is a cross-section diagram along cross-section line 3H in FIG. 3D of a NMOS transistor N.

NMOS transistor N provides one embodiment of a configuration of PMOS transistors MN2, MN1 in FIG. 3A, 3B, 3C and 3D. As shown, NMOS transistor N is formed in semiconductor substrate 301. The semiconductor substrate is formed from, in at least one embodiment, silicon, silicon germanium (SiGe), gallium arsenic, or other suitable semiconductor materials.

An active region ODN is formed. The active region ODN includes a heavily doped N region 395', a lightly doped P region 396', and a heavily doped N region 397'. Heavily doped N regions 395' are used to form drain/source regions. Lightly doped P region 396' is between the heavily doped N regions 395', 397'.

A heavily doped P region 398' is provided in the N-Well NW that is separated from heavily doped N region 395', lightly doped P region 396', and heavily doped N region 397'. Heavily doped P region 398' is configured to provide a connection to the body of NMOS transistor N. The heavily doped P region 398' corresponds to body regions BODNL, BODNR in FIG. 3D.

In some embodiments, the active region ODN include epitaxially grown silicon (epi Si), silicon carbide, or silicon germanium. The active region ODN of the IC device associated with the gate structure are in-situ doped or undoped during the epi process in some instances. When the active region ODN are undoped during the epi process, the active region ODN are doped during a subsequent process in some instances.

Vias V are located on heavily doped N regions 395', 397' in the MD/VD layer. MD/VD layer is located over semiconductor substrate 301 relative to a third direction that is parallel to the Z-axis. A gate G is located on lightly doped P region 396' in Poly layer. Conductors C are located in metal layer M0, which is directly over MD/VD layer relative to the third direction. Vias V connect the conductors C to their respective sections of active region ODN. Via V and conductor C on heavily doped P region 398' are connected to the body of NMOS transistor N. With respect to the NMOS transistors MN1 discussed above, conductor C is connected to the source of NMOS transistor MN1 and the drain of NMOS transistor MN2. With respect to NMOS transistor NP2, conductor C is configured to receive the reference voltage VSSPST.

Figure 4A:
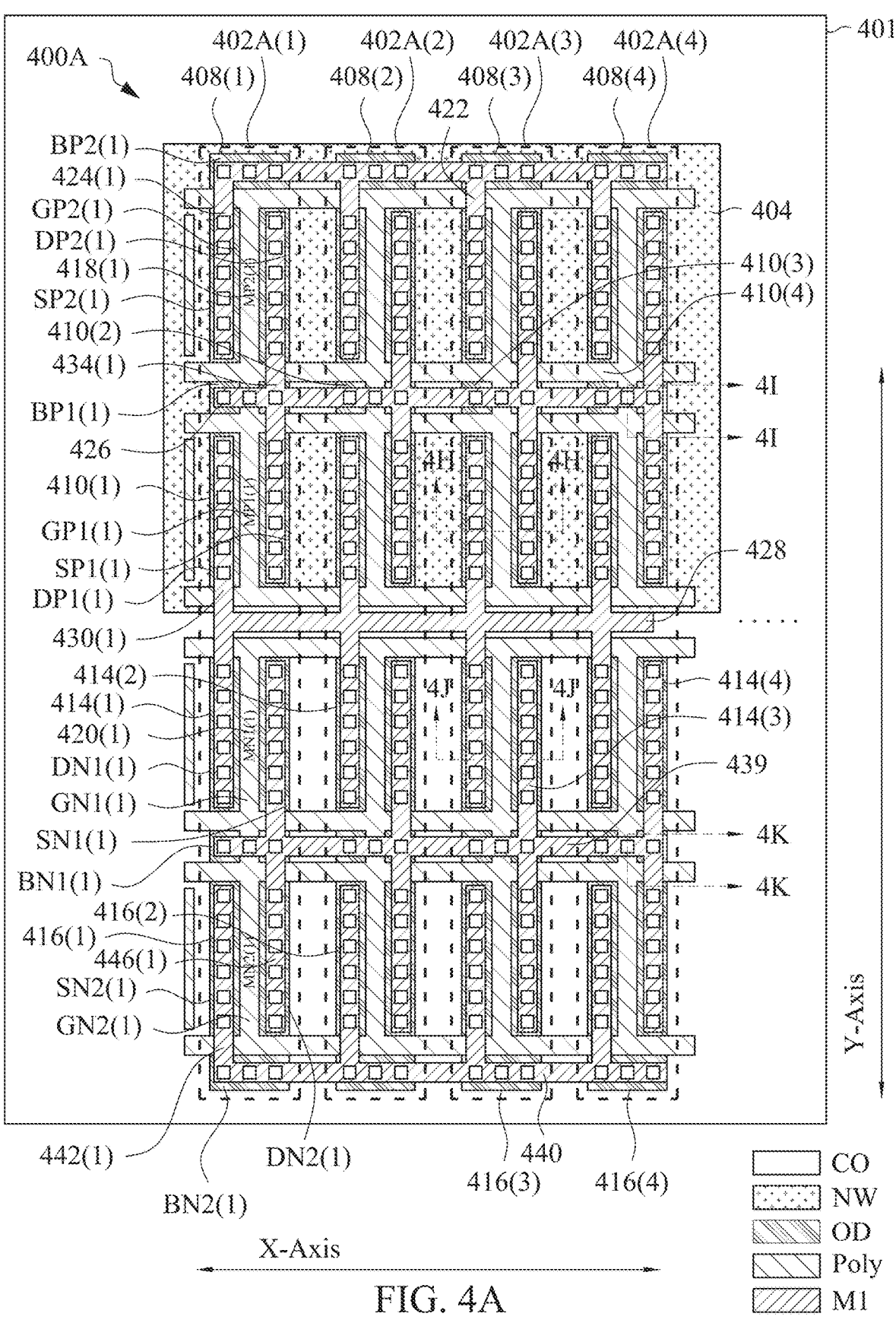
FIG. 4A is a layout diagram of a semiconductor device, in accordance with some embodiments.

FIG. 4A is a layout diagram 400A of a semiconductor device, in accordance with some embodiments.

Layout diagram 400A represents various features of the semiconductor device as shapes. Features of layout diagram 400A are discussed with reference to the semiconductor components that the illustrated shapes represent.

Layout diagram 400A includes circuit 402A(1), circuit 402A(2), circuit 402A(3), and circuit 402A(4). Each of circuit 402A(1), circuit 402A(2), circuit 402A(3), and circuit 402A(4) are an example of the circuit shown in semiconductor device 100 of FIG. 1. It should be noted that the components for circuit 402A(1) are discussed in detail and it should be presumed that circuit 402A(2), circuit 402A(3), and circuit 402A(4) have similar components and arrangement. Furthermore, the diodes D1, D2 in FIG. 1 are not shown in FIG. 4A.

Figure 4B:
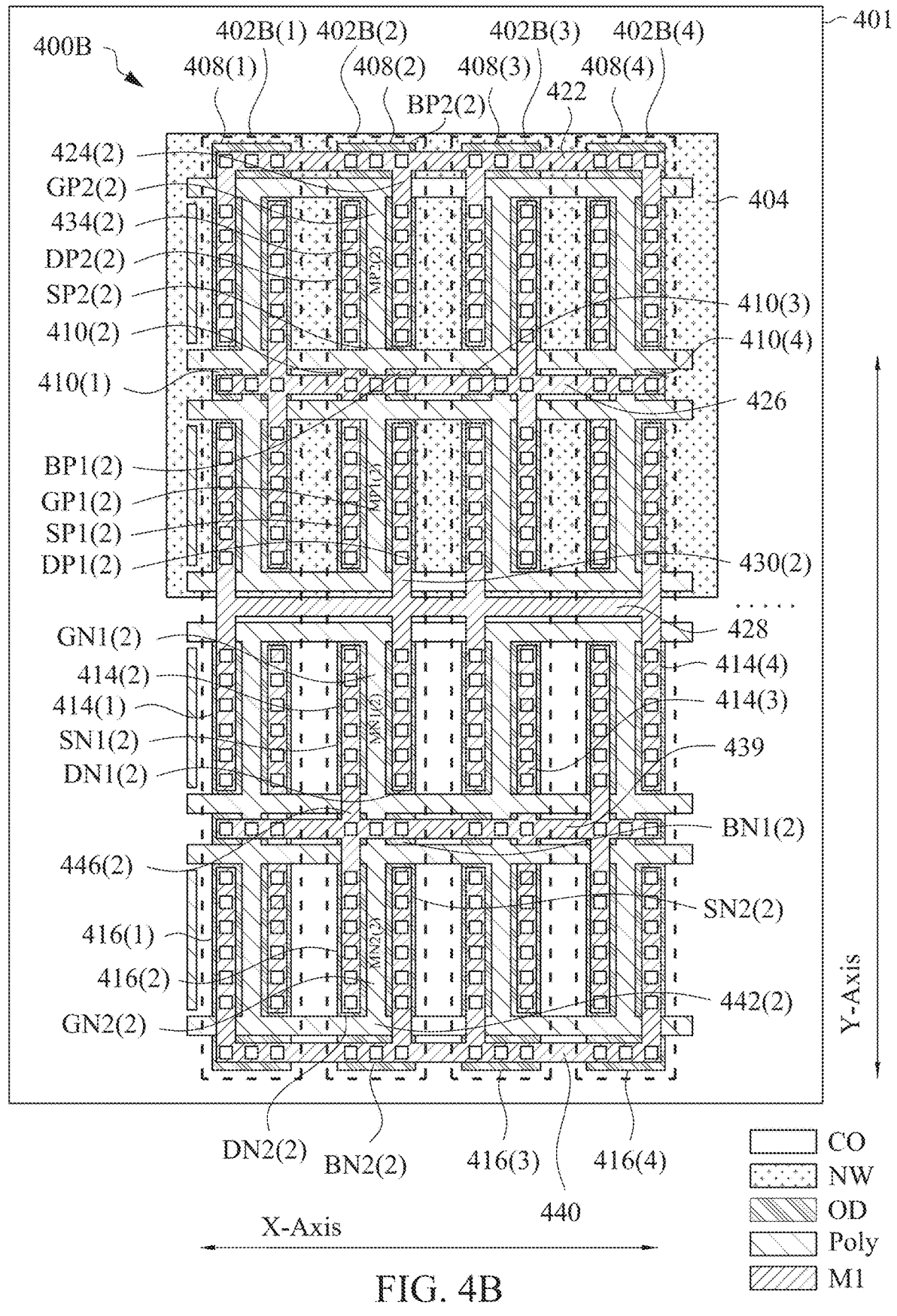
FIG. 4B is a layout diagram of a semiconductor device, in accordance with some embodiments.
Figure 4C:
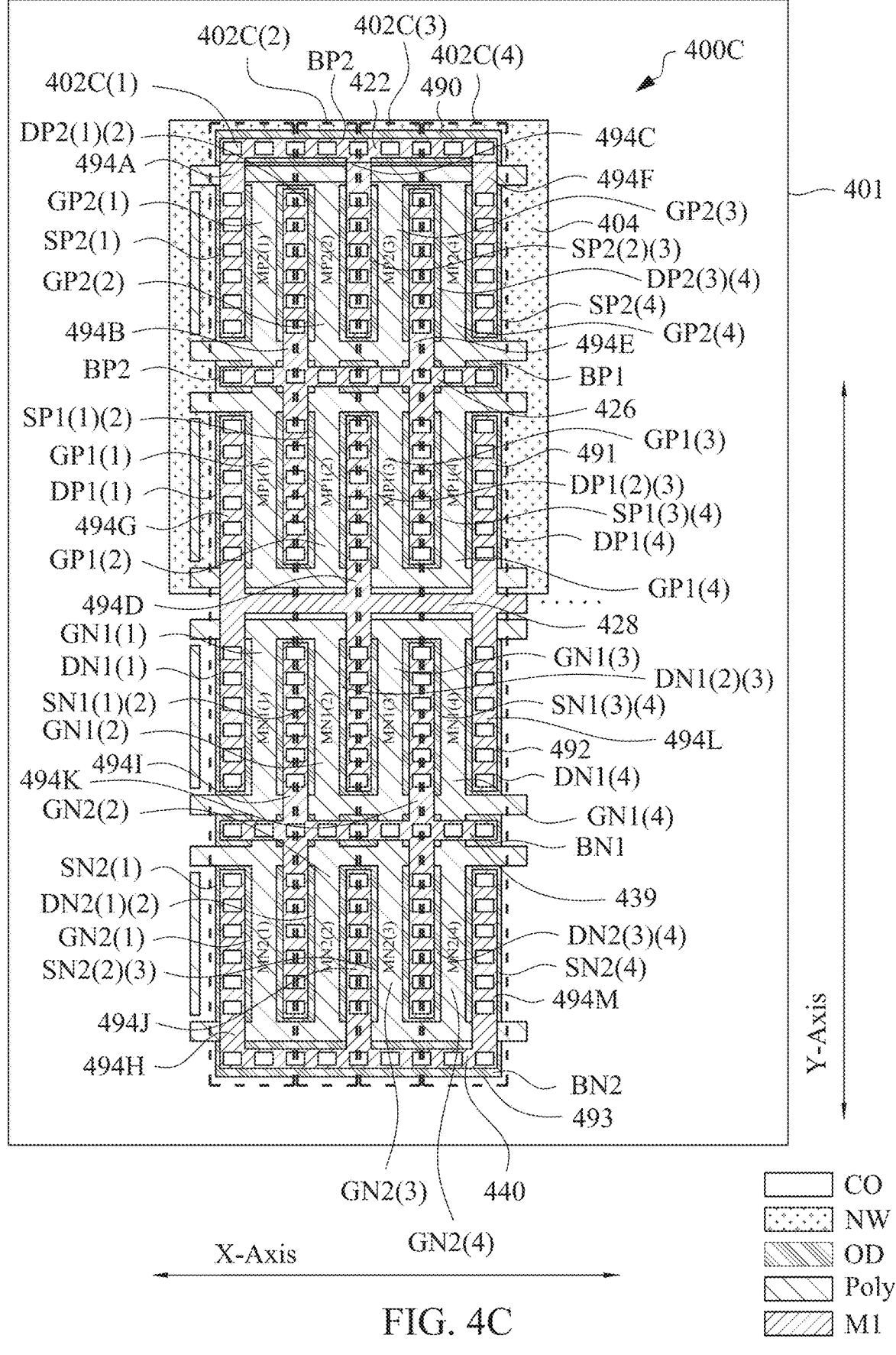
FIG. 4C is a layout diagram of a semiconductor device, in accordance with some embodiments.
Figure 4D:
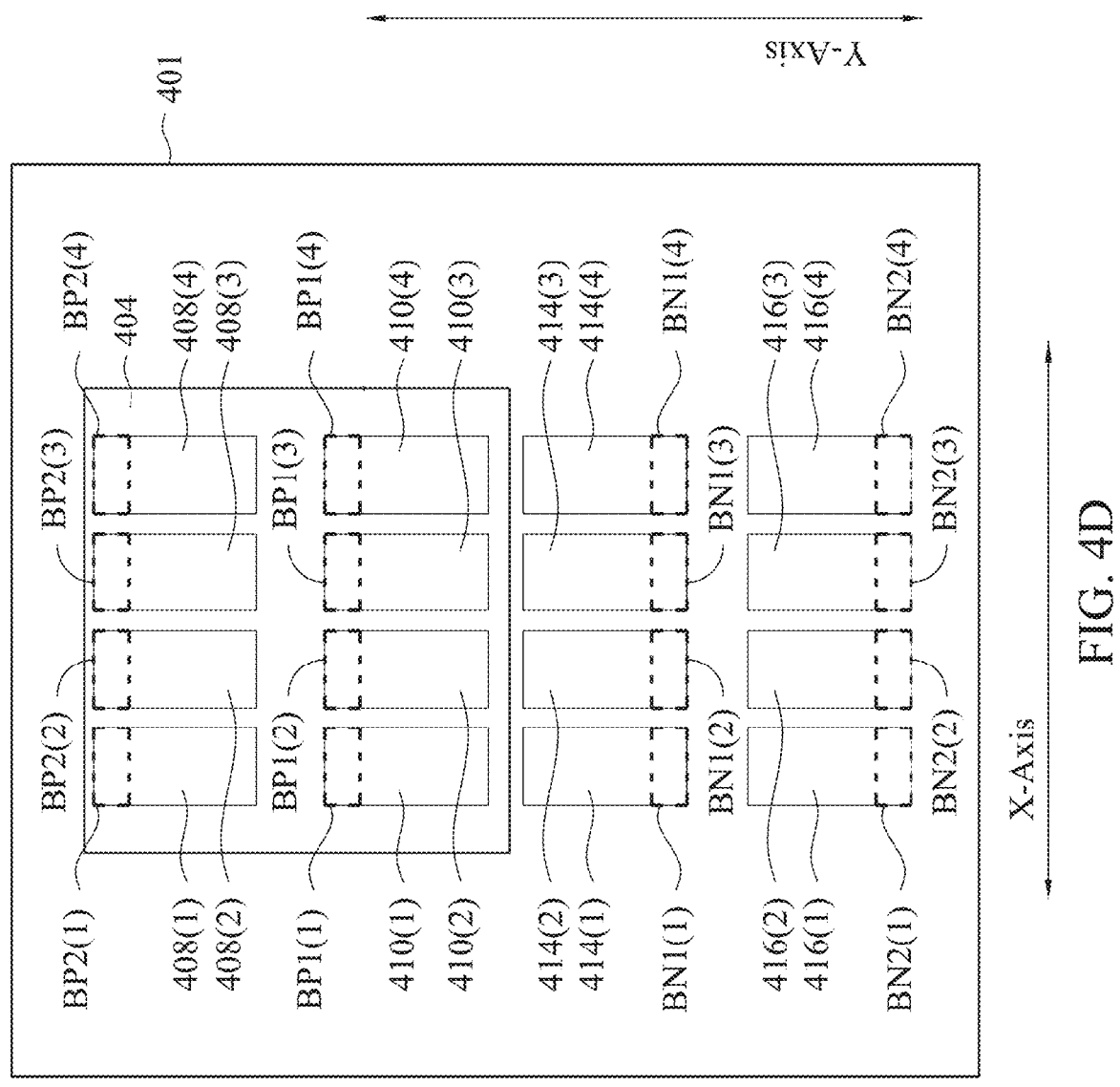
FIG. 4D is a layout diagram that shows the semiconductor substrate in FIG. 4A, in accordance with some embodiments.

Referring now to FIG. 4A and FIG. 4D, layout diagram 400A includes a semiconductor substrate 401. FIG. 4D is a layout diagram that shows the semiconductor substrate 401, in accordance with some embodiments.

Semiconductor substrate 401 is a silicon on insulator type semiconductor substrate. Semiconductor substrate 401 defines a first well region 404. First well region 404 is an N-Well region. First well region 404 has a long axis that extends in the first direction (which in this embodiment is a first horizontal direction that is parallel to the X-axis). Within first well region 404 is a first row of active regions 408(1), 408(2), 408(3), 408(4) and a second row of active regions 410(1), 410(2), 410(3), 410(4). First row of active regions 408(1), 408(2), 408(3), 408(4) and second row of active regions 410(1), 410(2), 410(3), 410(4) are spaced apart with respect to a second direction (which in this embodiment is parallel to the Y-axis).

Active regions 408(1), 408(2), 408(3), 408(4) are each separated and are used to form a PMOS transistor that corresponds to the PMOS transistor MP2 in FIG. 1 in circuit 402A(1), circuit 402A(2), circuit 402A(3), and circuit 402A (4), as explained in further detail below. More specifically, active regions 408(1), 408(2), 408(3), 408(4) are separated from one another with respect to the first direction (parallel to the X-axis), and are aligned with respect to a second direction (parallel to Y-axis). Thus a row of PMOS transistors that correspond to the PMOS transistor MP2 in FIG. 1 in circuit 402A(1), circuit 402A(2), circuit 402A(3), and circuit 402A(4) are provided by the active regions 408(1), 408(2), 408(3), 408(4). Each of active regions 408(1), 408(2), 408(3), 408(4) has P-type conductivity.

Within first well region 404 are active regions 410(1), 410(2), 410(3), 410(4), which are separated from active regions 408(1), 408(2), 408(3), 408(4) with respect to the second direction. Active regions 410(1), 410(2), 410(3), 410(4) are each separated and are used to form a PMOS transistor that corresponds to the PMOS transistor MP1 in FIG. 1 in circuit 402A(1), circuit 402A(2), circuit 402A(3), and circuit 402A(4) as explained in further detail below. More specifically, active regions 410(1), 410(2), 410(3), 410(4) are separated from one another with respect to the first direction and are separated from one another with respect to the second direction. Thus a row of PMOS transistors that correspond to the PMOS transistor MP1 in FIG. 1 in circuit 402A(1), circuit 402A(2), circuit 402A(3), and circuit 402A(4) are provided by the active regions 410(1), 410(2), 410(3), 410(4). Each of the active regions 410(1), 410(2), 410(3), 410(4) has P-type conductivity. Each of active regions 410(1), 410(2), 410(3), 410(4) is aligned with respected to the second direction (parallel to Y-axis) and are separated with respect to first direction (parallel to X-axis).

Active regions 414(1), 414(2), 414(3), 414(4) are separated below active regions 410(1), 410(2), 410(3), 410(4) with respect to the second direction. Active regions 414(1), 414(2), 414(3), 414(4) are each separated and are used to form a NMOS transistor that corresponds to the NMOS transistor MN1 in FIG. 1 in circuit 402A(1), circuit 402A(2), circuit 402A(3), and circuit 402A(4), as explained in further detail below. More specifically, active regions 414(1), 414 (2), 414(3), 414(4) are separated from one another with respect to the first direction (parallel to the X-axis) and aligned with respect to the second direction (parallel to Y-axis). Thus a row of NMOS transistors that correspond to the NMOS transistor MN1 in FIG. 1 in each of circuit 402A(1), circuit 402A(2), circuit 402A(3), and circuit 402A(4) are provided by the active regions 414(1), 414(2), 414(3), 414(4). Each of active regions 414(1), 414(2), 414(3), 414(4) has N-type conductivity.

Semiconductor substrate 401 also has active regions 416(1), 416(2), 416(3), 416(4) that are separated below active regions 414(1), 414(2), 414(3), 414(4) with respect to the second direction. Active regions 416(1), 416(2), 416(3), 416(4) are aligned with respect to the first direction. Active regions 416(1), 416(2), 416(3), 416(4) are each separated and are used to form a NMOS transistor that corresponds to the NMOS transistor MN2 in FIG. 1 in circuit 402A(1), circuit 402A(2), circuit 402A(3), and circuit 402A(4), as explained in further detail below. Thus a row of NMOS transistors that correspond to the NMOS transistor MN2 in FIG. 1 in each of circuit 402A(1), circuit 402A(2), circuit 402A(3), and circuit 402A(4) are provided by the active regions 416(1), 416(2), 416(3), 416(4). Each of active regions 416(1), 416(2), 416(3), 416(4) has N-type conductivity.

Active region 416(1) is separated from active regions 408(1), 410(1), 414(1) with respect to the second direction but aligned with active regions 408(1), 410(1), 414(1) with respect to first direction. Active regions 408(1), 410(1), 414(1), 416(1) thus form a column of active regions. Active regions 408(2), 410(2), 414(2), 416(2) form a column of active regions in a similar manner. Active regions 408(3), 410(3), 414(3), 416(3) also form a column of active regions in a similar manner. Finally, active regions 408(4), 410(4), 414(4), 416(4) also form a column of active regions in a similar manner. This example embodiment does not include a deep N-well region.

Referring again to FIG. 4A, a detailed explanation is now provided for circuit 402A(1). It should be noted that circuits 402A(2), 402A(3), 402A(4) each have an arrangement that is similar to the arrangement of circuit 402A(1). An explanation of circuits 402A(2), 402A(3), 402A(4) is therefore omitted for the sake of brevity. With respect to circuit 402A(1), circuit 402A(1) includes a transistor MP2(1) that corresponds to transistor MP2 in FIG. 1, a transistor MP1(1) that corresponds to transistor MP1 in FIG. 1, a transistor MN2(1) that corresponds to transistor MN2 in FIG. 1, and a transistor MN1(1) that corresponds to transistor MN1 in FIG. 1.

A gate electrode 418(1) has a long axis that extends in the second direction (parallel to Y-axis) on both first active region 408(1) and second active region 410(1). Gate electrode 418(1) is formed on and over first active region 408(1) and second active region 410(1) in the Poly layer. The second direction parallel to the Y direction is sometimes referred to as the Poly direction.

Accordingly, portion GP2(1) of gate electrode 418(1) on first active region 408(1) is the gate of transistor MP2(1) and portion GP1(1) of gate electrode 418(1) on second active region 410(1) is the gate of transistor MP1(1). The section of first active region 408(1) to the right of portion GP2(1) of gate electrode 418(1) is drain DP2(1) of transistor MP2(1) and the section of first active region 408(1) to the left of portion GP2(1) of gate electrode 418(1) is source SP2(1) of transistor MP2(1). Note that a section BP2(1) of active region 408(1) extends past the gate GP2(1) relative to the second direction. This section BP2(1) is for connecting to the body of transistor MP2(1).

The section of second active region 410(1) to the right of gate GP1(1) is source SP1(1) of transistor MP1(1) and the section of second active region 410(1) to the left of gate GP1(1) is drain DP1(1) of transistor MP1(1). Note that a section BP1(1) of active region 408(1) extends past the gate GP1(1) relative to the second direction. This section BP1(1) is for connecting to the body of transistor MP1(1).

A gate electrode 420(1) has a long axis that extends in the second direction (parallel to Y-axis) on both third active region 414(1) and fourth active region 416(1). Gate electrode 420(1) is formed on and over third active region 414(1) and fourth active region 416(1) in the Poly layer.

Accordingly, portion of gate electrode 420(1) on third active region 414(1) is the gate GN1(1) of transistor MN1(1) and portion of gate electrode 420(1) on fourth active region 416(1) is the gate GN1(1) of transistor MN1(1). The section of third active region 414(1) to the left of the gate GN1(1) is drain DN1(1) of transistor MN1(1) and the section of third active region 414(1) to the right of gate GN1(1) is source SN1(1) of transistor MN1(1). Note that a section BN1(1) of active region 414(1) extends past the gate GN2(1) relative to the second direction. This section BN1(1) is for connecting to the body of transistor MN1(1).

The section of fourth active region 416(1) to the left of gate GN2(1) is source SN2(1) of transistor MN2(1) and the section of fourth active region 416(1) to the right of gate GN2(1) is drain DN2(1) of transistor MN2(1). Note that a section BN2(1) of active region 416(1) extends past the gate GN2(1) relative to the second direction. This section BN2(1) is for connecting to the body of transistor MN2(1).

Contacts for source SP2(1), drain DP2(1), source SP1(1), drain DP1(1), source SN2(1), drain DN2(1), source SN1(1), drain DN1(1) are formed on and over active regions 408(1), 410(1), 414(1), 416(1) in MD/VD layer.

A conductor 422 has a long axis that extends in the first direction (parallel to the X-axis). Conductor 422 is configured to receive the reference voltage VDDPST and corresponds to the power reference node 104 in FIG. 1. Conductor 422 extends over section BP2(1) of transistor MP2(1). A plurality of vias in the MD/VD layer connect conductor 422 to the section BP2(1). As such, section BP2(1) (and thus the body of transistor MP2(1) is configured to receive the reference voltage VDDPST.

A conductor 424(1) has a long axis that extends in the second direction (parallel to the Y-axis). Conductor 424(1) is connected to conductor 422 and thus also is configured to receive the reference voltage VDDPST. Conductor 424(1) extends directly over the entire length of source SP2(1) in the second direction (parallel to Y-axis). Conductors 422, 424(1) are each provided in metal layer M0. In this embodiment, a plurality of vias are provided in MD/VD layer across entire length of conductor 424(1) that connect to source SP2(1) of transistor MP2(1) to conductor 424(1).

A conductor 426 extends in the first direction across section BP1(1). Conductor 426 in in the metal layer M0. A plurality of vias in the MD/VD layer connect conductor 426 to section BP1(1). In this manner, conductor 426 is connected to the body of the transistor MP1(1). Conductor 426 and section BP1(1) are electrically disconnected from conductor 422 and source SP2(1).

A conductor 428 has a long axis that extends in the first direction (parallel to the X-axis) and is configured to receive an input/output signal and corresponds to node B is FIG. 1. Conductor 426 and conductor 428 are both located in metal layer M0.

A conductor 430(1) has a long axis that extends in the second direction (parallel to the Y-axis). Conductor 430(1) is connected to conductor 428 and thus also is configured to receive the input/output signal. Conductor 430(1) extends directly over the entire length of drain DP1(1) in the second direction (parallel to Y-axis) and over entire length of drain DN1(1) in the second direction. Conductor 430(1) is provided in metal layer M0. In this embodiment, a plurality of vias in MD/VD layer are provided across entire length of drain DP1(1) that connect to drain DP1(1) of transistor MP1(1) to conductor 430(1) and a plurality of vias in MD/VD layer are provided across entire length of DN1(1) that connect to drain DN1(1) of transistor MN1(1) to conductor 430(1). Conductor 430(1) is directly connected to conductor 428.

A conductor 434(1) has a long axis that extends in the second direction (parallel to Y-axis). Conductor 434(1) extends over the entire length of drain DP2(1) of transistor MP2(1) and over the entire length of source SP1(1) of transistor MP1(1). Conductor 434(1) is provided in metal layer M0. A plurality of vias in the MD/VD layer are provided across the entire length of drain DP2(1) to connect drain DP2(1) to conductor 434(1). A plurality of vias in the MD/VD layer are provided across the entire length of source SP1(1) to connect source SP1(1) to conductor 434(1). Conductor 434(1) is directly connected to conductor 426. In this manner, drain DP2(1) of transistor MP2(1), source SP1(1) of transistor MP1(1), and body of transistor MP1(1) are connected to one another. However, conductor 434(1) is electrically disconnected from body of transistor MP2(1), source SP2(1), and conductors 422, 424(1). Conductors 426, 434(1) and vias in MD/VD layer provide the network net0, as described in FIG. 1. In some embodiments, conductors in network net0 are connected to each other by one or more conductors in a higher metal layer.

A conductor 439 is located in the metal layer M0 and extends in the first direction over section BN1(1). A plurality of vias in MD/VD layer connect conductor 439 to the section BN1(1). In this manner, conductor 439 provides a connection to the body of transistor MN1(1).

A conductor 440 has a long axis that extends in the first direction (parallel to the X-axis). Conductor 440 is configured to receive the reference voltage VSSPST and corresponds to the power reference node 106 in FIG. 1. Conductor 440 is located in metal layer M0. Conductor 440 extends over section BN2(1) of transistor MN2(1). A plurality of vias in MD/VD layer connect section BN2(1) to conductor 440. In this manner, the body of transistor MN2(1) is configured to receive reference voltage VSSPST. Conductor 439 and section BN1(1) are electrically disconnected from conductor 440 and source SN2(1).

A conductor 442(1) has a long axis that extends in the second direction (parallel to the Y-axis). Conductor 442(1) is connected to conductor 440 and thus also is configured to receive the reference voltage VSSPST. Conductor 442(1) extends directly over the entire length of source SN2(1) in the second direction (parallel to Y-axis). Conductor 442(1) is located in metal layer M0. In this embodiment, a plurality of vias in MD/VD layer are provided across entire length of conductor 442(1) that connect to source SN2(1) of transistor MN2(1) to conductor 442(1).

A conductor 446(1) has a long axis that extends in the second direction (parallel to the Y-axis). Conductor 446(1) is connected to conductor 439 and is connected to the body of transistor MN1(1). Conductor 446(1) extends directly over the entire length of drain DN2(1) in the second direction (parallel to Y-axis) and over the entire length of drain DN2(1) and of source SN1(1) of transistor MN1(1). Conductor 446(1) is provided in metal layer M0. In this embodiment, a plurality of vias are provided across entire length of conductor 446(1) that connect drain DN2(1) of transistor MN2(1) to conductor 446(1). A plurality of vias are provided across entire length of source SN1(1) of transistor MN1(1). In this manner, body of transistor MN1(1) is connected to source SN1(1) and drain DN2(1). However, conductor 446(1) is electrically disconnected from body of transistor MN2(1), source SN2(1), and conductors 440, 442(1). Conductors 439, 446(1) and vias in MD/VD layer provide the network net1, as described in FIG. 1. In some embodiments, conductors in network net1 are connected to each other by one or more conductors in a higher metal layer.

Circuits 402A(2), 402A(3), 402A(4) are arranged in the same manner as circuit 402A(1) and thus a description of their arrangement is not repeated herein. Conductors 422, 426, 439, and 440 connect the circuits 402A(1), 402A(2), 402A(3), 402A(4) in parallel.

FIG. 4B is a layout diagram 400B of a semiconductor device, in accordance with some embodiments.

Layout diagram 400B represents various features of the semiconductor device as shapes. Features of layout diagram 400B are discussed with reference to the semiconductor components that the illustrated shapes represent.

Layout diagram 400B includes circuit 402B(1), circuit 402B(2), circuit 402B(3), and circuit 402B(4). Each of circuit 402B(1), circuit 402B(2), circuit 402B(3), and circuit 402B(4) are an example of the circuit shown in semiconductor device 100 of FIG. 1.

Semiconductor substrate 401 is arranged in the same manner in layout diagram 400B as in layout diagram 400A from FIG. 4A and FIG. 4D. Accordingly, well 404 is provided in layout diagram 400B in the same manner as provided in layout diagram 400A, as shown in FIG. 4A and FIG. 4D. Similarly active regions 408(1), 408(2), 408(3), 408(4), 410(1), 410(2), 410(3), 410(4), 414(1), 414(2), 414(3), 414(4), 416(1), 416(2), 416(3), 416(4) in layout diagram 400B are provided in the same manner as in layout diagram 400A in FIG. 4A and FIG. 4D.

Additionally, the arrangement of transistor MP2(1) with source SP2(1), gate GP2(1), drain DP2(1), transistor MP1(1) with source SP1(1), gate GP1(1), drain DP1(1), transistor MN2(1) with source SN2(1), gate GN2(1), drain DN2(1), transistor MN1(1) with source SN1(1), gate GN1(1), drain DN1(1) are arranged in circuit 402B(1) of FIG. 4A in the same manner as circuit 402A(1) of FIG. 4B. These element numbers for circuit 402B(1) are not repeated in FIG. 4B for the sake of clarity.

However, circuit 402B(2) is arranged as a mirror image of circuit 402B(1) with respect to the Y-axis. Thus, transistor MP2(2) has source SP2(2) to the right of gate GP2(2) and drain DP2(2) to the left of gate GP2(2). Transistor DP1(2) has source SP1(2) is provided to left of gate GP1(2) and a drain DP1(2) to the right of gate GP1(2). Transistor MN1(2) has a drain DN1(2) to the right of gate GN1(2) and a source SN1(2) to the left of gate GN1(2).

Transistor MN2(1) has a drain DN2(2) is provided to the left of gate GN2(2) and source SN2(2) is provided to the right of gate GN2(2).

A conductor 424(2) has a long axis that extends in the second direction (parallel to the Y-axis). Conductor 424(2) is connected to conductor 422 and thus also is configured to receive the reference voltage VDDPST. Conductor 424(2) extends directly over the entire length of source SP2(2) in the second direction (parallel to Y-axis). Conductors 422, 424(2) are each provided in metal layer M0. In this embodiment, a plurality of vias are provided in MD/VD layer across entire length of conductor 424(2) that connect to source SP2(2) of transistor MP2(2) to conductor 424(2). A plurality of vias in the MD/VD layer also connect conductor 422 to section BP2(2). In this manner, the body of transistor MP2(2) is configured to receive reference voltage VDDPST.

Conductor 426 extends over section BP1(2) of transistor MP1(2). A plurality of vias in the MD/VD layer connect conductor 426 to section BP1(2) In this manner, conductor 426 provides a connection to the body of transistor MP1(2).

A conductor 430(2) has a long axis that extends in the second direction (parallel to the Y-axis). Conductor 430(2) is connected to conductor 428 and thus also is configured to receive the input/output signal. Conductor 430(2) extends directly over the entire length of drain DP1(2) in the second direction (parallel to Y-axis) and over entire length of drain DN1(2) in the second direction. Conductor 430(2) is provided in metal layer M0. In this embodiment, a plurality of vias in MD/VD layer are provided across entire length of drain DP1(2) that connect to drain DP1(2) of transistor MP1(2) to conductor 430(2) and a plurality of vias in MD/VD layer are provided across entire length of drain DN1(2) that connect to drain DN1(2) of transistor MN1(2) to conductor 430(2). Conductor 430(2) is directly connected to conductor 428.

A conductor 434(2) has a long axis that extends in the second direction (parallel to Y-axis). Conductor 434(2) extends over the entire length of drain DP2(2) of transistor MP2(2) and over the entire length of source SP1(2) of transistor MP1(2). Conductor 434(2) is provided in metal layer M0. A plurality of vias in the MD/VD layer are provided across the entire length of drain DP2(2) to connect drain DP2(2) to conductor 434(2). A plurality of vias in the MD/VD layer are provided across the entire length of source SP1(2) to connect source SP1(2) to conductor 434(2). Conductor 434(2) is directly connected to conductor 426. In this manner, drain DP2(2) of transistor MP2(2), source SP1(2) of transistor MP1(2), and body of transistor MP1(2) are connected to one another. However, conductor 434(2) is electrically disconnected from body of transistor MP2(2), source SP2(2), and conductors 422, 424(2). Conductors 426, 434(2) and vias in MD/VD layer provide the network net0, as described in FIG. 1. In some embodiments, conductors in network net0 are connected to each other by one or more conductors in a higher metal layer.

Conductor 439 also extends in the first direction over section BN1(2). A plurality of vias in MD/VD layer connect conductor 439 to the section BN1(2). In this manner, conductor 439 provides a connection to the body of transistor MN1(2). Conductor 439 and section BN1(2) is also electrically disconnected from source SN2(2) and conductor 440.

Conductor 440 also extends over section BN2(2) of transistor MN2(2). A plurality of vias in MD/VD layer connect section BN2(2) to conductor 440. In this manner, the body of transistor MN2(2) is configured to receive reference voltage VSSPST.

A conductor 442(2) has a long axis that extends in the second direction (parallel to the Y-axis). Conductor 442(2) is connected to conductor 440 and thus also is configured to receive the reference voltage VSSPST. Conductor 442(2) extends directly over the entire length of source SN2(2) in the second direction (parallel to Y-axis). Conductor 442(2) is located in metal layer M0. In this embodiment, a plurality of vias in MD/VD layer are provided across entire length of conductor 442(2) that connect to source SN2(2) of transistor MN2(2) to conductor 442(2).

A conductor 446(2) has a long axis that extends in the second direction (parallel to the Y-axis). Conductor 446(2) is connected to conductor 439 and is connected to the body of transistor MN1(2). Conductor 446(2) extends directly over the entire length of drain DN2(2) in the second direction (parallel to Y-axis) and over the entire length of source SN1(2) of transistor MN1(2). Conductor 446(2) is provided in metal layer M0. In this embodiment, a plurality of vias are provided across entire length of conductor 446(2) that connect drain DN2(2) of transistor MN2(2) to conductor 446(2). A plurality of vias are provided across entire length of source SN1(2) of transistor MN1(2). In this manner, body of transistor MN1(2) is connected to source SN1(2) and drain DN2(2). However, conductor 446(2) is electrically disconnected from body of transistor MN2(2), source SN2 (2), and conductors 440, 442(2). Conductors 439, 446(2) and vias in MD/VD layer provide the network net1, as described in FIG. 1. In some embodiments, conductors in network net1 are connected to each other by one or more conductors in a higher metal layer.

The relationship between the arrangements of circuits 402B(3) and 402B(4) is the same as the relationship between the circuits 402B(1) and 402B(2) and thus will not be repeated. Conductors 422, 426, 439, and 440 connect the circuits 402B(1), 402B(2), 402B(3), 402B(4) in parallel.

FIG. 4C is a layout diagram 400C of a semiconductor device, in accordance with some embodiments.

Layout diagram 400C represents various features of the semiconductor device as shapes. Features of layout diagram 400C are discussed with reference to the semiconductor components that the illustrated shapes represent.

Layout diagram 400C includes circuit 402C(1), circuit 402C(2), circuit 402C(3), and circuit 402C(4). Each of circuit 402C(1), circuit 402C(2), circuit 402C(3), and circuit 402C(4) are an example of the circuit shown in semiconductor device 100 of FIG. 1.

Figure 4E:
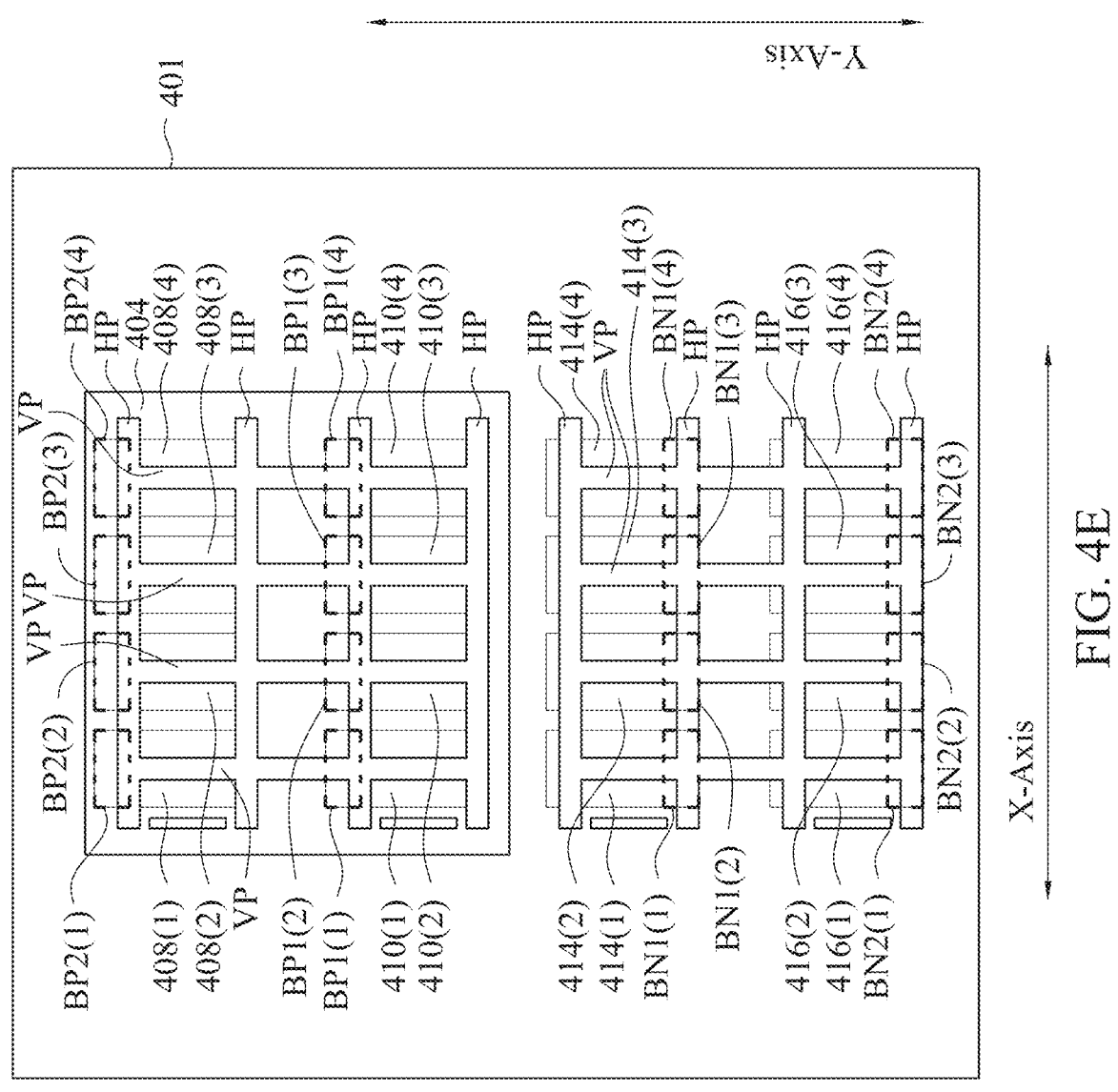
FIG. 4E is a layout diagram that shows the semiconductor substrate of FIG. 4D with a polysilicon (PO) layer.
Figure 4F:
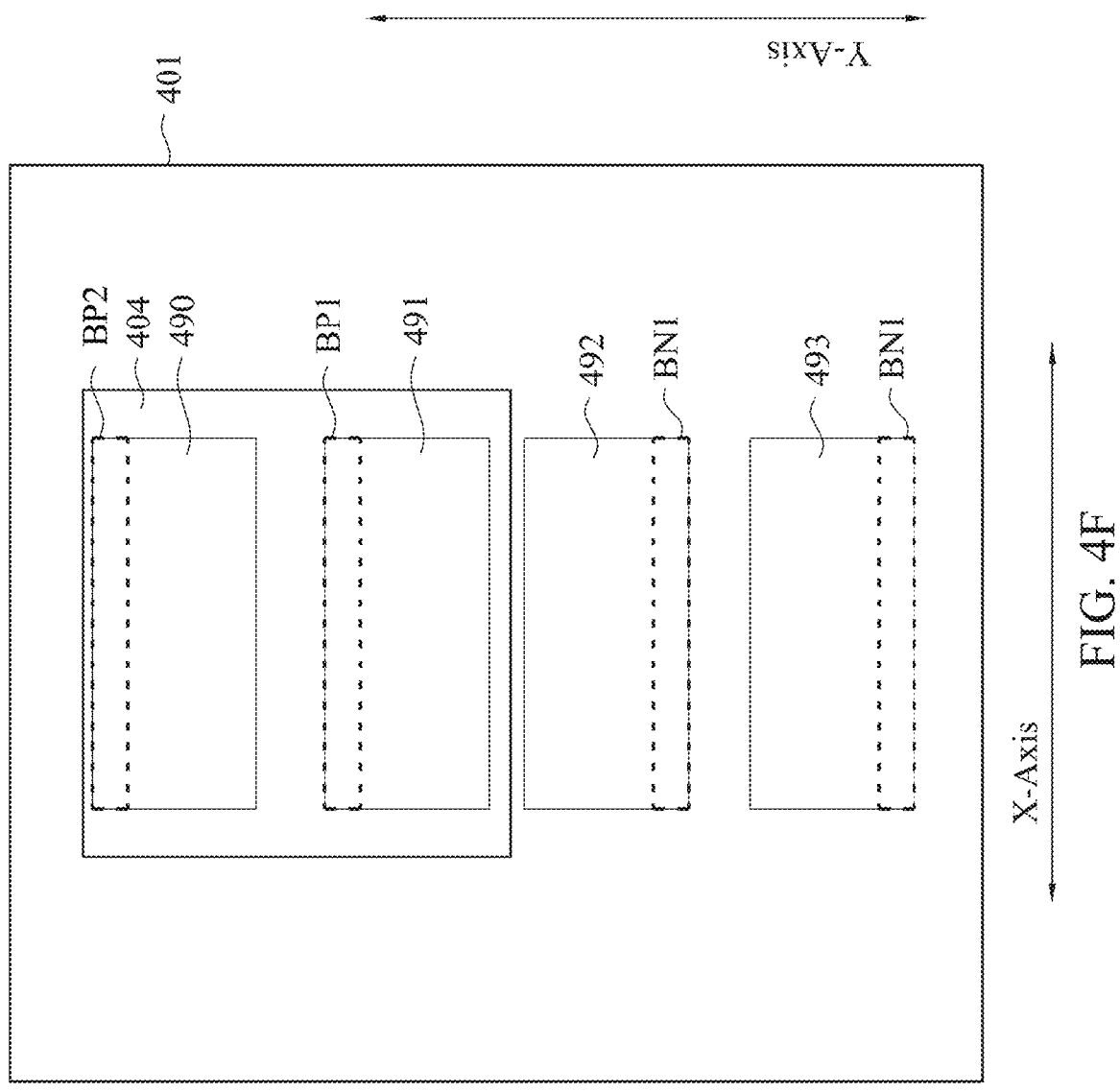
FIG. 4F is a layout diagram that shows the semiconductor substrate in FIG. 4C, in accordance with some embodiments.

Referring to FIG. 4C and FIG. 4F, FIG. 4F is a layout diagram that illustrates another embodiment of the semiconductor substrate 401, which is the embodiment used in FIG. 4C.

Rather than having active regions 408(1 08(2), 408(3), 408(4) as in FIG. 4A and FIG. 4F, where each of transistor MP2(1), MP2(2), MP2(3), MP2(4) are formed on a corresponding one of active regions 408(1 08(2), 408(3), 408(4), in FIG. 4C and FIG. 4F, transistors MP2(1), MP2(2), MP2 (3), MP2(4) are each formed in active region 490. Active region 490 is provided in well 404. Active region 490 has a section BP2 that past gates GP2(1), GP2(2), GP2(3), GP2(4) with respect to the second direction. Section BP2 provides a connection to the bodies of transistors MP2(1), MP2(2), MP2(3), MP2(4). Conductor 422 includes a plurality of vias across an entire length of section BP2 with respect to the first direction. In this manner, the bodies of transistors MP2(1), MP2(2), MP2(3), MP2(4) are each configured to receive reference voltage VDDPST.

Additionally, rather than having active regions 410(1 10(2), 410(3), 410(4) as in FIG. 4A where each of transistor MP1(1), MP1(2), MP1(3), MP1(4) are formed on a corresponding one of active regions 410(1 10(2), 410(3), 410(4). However, in FIG. 4C, transistor MP1(1), MP1(2), MP1(3), MP1(4) are each formed in active region 491. Active region 491 is provided in well 404. Section BP1 provides a connection to the bodies of transistors MP1(1), MP1(2), MP1 (3), MP1(4). Conductor 426 includes a plurality of vias across an entire length of section BP1 with respect to the first direction. In this manner, conductor 426 is connected to the bodies of transistors MP1(1), MP1(2), MP1(3), MP1(4).

Also, rather than having active regions 414(1), 414(2), 414(3), 414(4) as in FIG. 4A where each of transistor MN1(1), MN1(2), MN1(3), MN1(4) are formed on a corresponding one of active regions 414(1 14(2), 414(3), 414

(4). However, in FIG. 4C, transistor MN1(1), MN1(2), MN1(3), MN1(4) are each formed in active region 492.

Finally, rather than having active regions 416(1 16(2), 416(3), 416(4) as in FIG. 4A where each of transistor MN2(1), MN2(2), MN2(3), MN2(4) are formed on a corresponding one of active regions 416(1 16(2), 416(3), 416 (4). However, in FIG. 4C, transistor MN2(1), MN2(2), MN2(3), MN2(4) are each formed in active region 493.

With respect to active regions 490, 491, active regions 490, 491 have P-type conductivity. Within circuit 402C(1), an electrode has a long axis that extends in the second direction (parallel to the Y-axis) on both active regions 490, 491 so that a portion of the electrode on active region 490 forms a gate GP2(1) of transistor MP2(1) and another and portion of the electrode on active region 491 forms a gate GP1(1) of transistor MP1(1). Within circuit 402C(2), an electrode has a long axis that extends in the second direction (parallel to the Y-axis) on both active regions 490, 491 so that a portion of the electrode on active region 490 forms a gate GP2(2) of transistor MP2(2) and another and portion of the electrode on active region 491 forms a gate GP1(2) of transistor MP1(2). Within circuit 402C(3), an electrode has a long axis that extends in the second direction (parallel to the Y-axis) on both active regions 490, 491 so that a portion of the electrode on active region 490 forms a gate GP2(3) of transistor MP2(3) and another and portion of the electrode on active region 491 forms a gate GP1(3) of transistor MP1(3). Within circuit 402C(4), an electrode has a long axis that extends in the second direction (parallel to the Y-axis) on both active regions 490, 491 so that a portion of the electrode on active region 490 forms a gate GP2(4) of transistor MP2(4) and another and portion of the electrode on active region 491 forms a gate GP1(4) of transistor MP1(4). This example embodiment does not include a deep N-well region.

With respect to active regions 492, 493, active regions 492, 493 have N-type conductivity. Within circuit 402C(1), an electrode has a long axis that extends in the second direction (parallel to the Y-axis) on both active regions 492, 493 so that a portion of the electrode on active region 492 forms a gate GN1(1) of transistor MN1(1) and another and portion of the electrode on active region 493 forms a gate GN2(1) of transistor MN2(1). Within circuit 402C(2), an electrode has a long axis that extends in the second direction (parallel to the Y-axis) on both active regions 492, 493 so that a portion of the electrode on active region 492 forms a gate GN1(2) of transistor MN1(2) and another and portion of the electrode on active region 493 forms a gate GN2(2) of transistor MN2(2). Within circuit 402C(3), an electrode has a long axis that extends in the second direction (parallel to the Y-axis) on both active regions 492, 493 so that a portion of the electrode on active region 492 forms a gate GN1(3) of transistor MN1(3) and another and portion of the electrode on active region 493 forms a gate GN2(3) of transistor MN2(3). Within circuit 402C(4), an electrode has a long axis that extends in the second direction (parallel to the Y-axis) on both active regions 492, 493 so that a portion of the electrode on active region 492 forms a gate GN1(4) of transistor MN1(4) and another and portion of the electrode on active region 493 forms a gate GN2(4) of transistor MN2(4).

The portion of region 490 adjacent to and directly to the left of gate GP2(1) is source SP2(1) of transistor MP2(1). The portion of region 490 adjacent to and directly to the right of gate GP2(1) and adjacent to and directly to the left of gate GP2(2) is drain DP2(1)(2) of both transistor MP2(1) and transistor MP2(2). The portion of region 490 adjacent to and directly to the right of gate GP2(2) and adjacent to and directly to the left of gate GP2(3) is source SP2(2)(3) of both transistor MP2(2) and transistor MP2(3). The portion of region 490 adjacent to and directly to the right of gate GP2(3) and adjacent to and directly to the left of gate GP2(4) is drain DP2(3)(4) of both transistor MP2(3) and transistor MP2(4). The portion of region 490 adjacent to and directly to the right of gate GP2(4) is source SP2(4) of transistor MP2(4).

The portion of region 491 adjacent to and directly to the left of gate GP1(1) is drain DP1(1) of transistor MP1(1). The portion of region 491 adjacent to and directly to the right of gate GP1(1) and adjacent to and directly to the left of gate GP1(2) is source SP1(1)(2) of both transistor MP1(1) and transistor MP1(2). The portion of region 491 adjacent to and directly to the right of gate GP1(2) and adjacent to and directly to the left of gate GP1(3) is drain DP1(2)(3) of both transistor MP1(2) and transistor MP1(3). The portion of region 491 adjacent to and directly to the right of gate GP1(3) and adjacent to and directly to the left of gate GP1(4) is source SP1(3)(4) of both transistor MP1(3) and transistor MP1(4). The portion of region 491 adjacent to and directly to the right of gate GP1(4) is drain DP1(4) of transistor MP1(4).

The portion of region 492 adjacent to and directly to the left of gate GN1(1) is drain DN1(1) of transistor MN1(1). The portion of region 492 adjacent to and directly to the right of gate GN1(1) and adjacent to and directly to the left of gate GN1(2) is source SN1(1)(2) of both transistor MN1(1) and transistor MN1(2). The portion of region 492 adjacent to and directly to the right of gate GN1(2) and adjacent to and directly to the left of gate GN1(3) is drain DN1(2)(3) of both transistor MN1(2) and transistor MN1(3). The portion of region 492 adjacent to and directly to the right of gate GN1(3) and adjacent to and directly to the left of gate GN1(4) is source SN1(3)(4) of both transistor MN1(3) and transistor MN1(4). The portion of region 492 adjacent to and directly to the right of gate GN1(4) is drain DN1(4) of transistor MN1(4).

The portion of region 493 adjacent to and directly to the left of gate GN2(1) is source SN2(1) of transistor MN2(1). The portion of region 493 adjacent to and directly to the right of gate GN2(1) and adjacent to and directly to the left of gate GN2(2) is drain DN2(1)(2) of both transistor MN2 (1) and transistor MN2(2). The portion of region 493 adjacent to and directly to the right of gate GN2(2) and adjacent to and directly to the left of gate GN2(3) is source SN2(2)(3) of both transistor MN2(2) and transistor MN2(3). The portion of region 493 adjacent to and directly to the right of gate GN2(3) and adjacent to and directly to the left of gate GN2(4) is drain DN2(3)(4) of both transistor MN2(3) and transistor MN2(4). The portion of region 493 adjacent to and directly to the right of gate GN2(4) is source SN2(4) of transistor MN2(4).

A conductor 494A is provided in metal layer M0 that extends across the length of source SP2(1). A plurality of vias in the MD/VD layer connects conductor 494A to source SP2(1). Conductor 494A is directly connected to conductor 422. In this manner, source SP2(1) is configured to receive reference voltage VDDPST.

A conductor 494B is provided in metal layer M0 that extends across the length of drain DP2(1)(2) and source SP1(1)(2). A plurality of vias in the MD/VD layer connects conductor 494B to drain DP2(1)(2) and a plurality of vias in the MD/VD layer connects conductor 494B to source SP1 (1)(2). In this manner, conductor 494B connects drain DP2 (1)(2) to source SP1(1)(2).

A conductor 494C is provided in metal layer M0 that extends across the length of source SP2(2)(3). A plurality of vias in the MD/VD layer connects conductor 494C to source SP2(2)(3). Conductor 494C is directly connected to conductor 422. In this manner, source SP2(2)(3) is configured to receive reference voltage VDDPST.

A conductor 494D is provided in metal layer M0 that extends across the length of both drain DP2(2)(3) and drain DN1(2)(3). A plurality of vias in the MD/VD layer connects conductor 494D to drain DP2(2)(3) and a plurality of vias in the MD/VD layer connects conductor 494D to drain DN1(2)(3). Conductor 494D is connected to conductor 428. In this manner, drain DP2(2)(3) and drain DN1(2)(3) are configured to receive input/output signal.

A conductor 494E is provided in metal layer M0 that extends across the length of drain DP2(3)(4) and across the length of source SP1(3)(4). A plurality of vias in the MD/VD layer connects conductor 494E to drain DP2(3)(4) and a plurality of vias in the MD/VD layer connects conductor 494E to source SP1(3)(4). In this manner, conductor 494E connects drain DP2(3)(4) to source SP1(3)(4). Conductors 426, 494B, 494E and vias in MD/VD layer provide the network net0, as described in FIG. 1. In some embodiments, conductors in network net0 are connected to each other by one or more conductors in a higher metal layer.

A conductor 494F is provided in metal layer M0 that extends across the length of source SP2(4). A plurality of vias in the MD/VD layer connects conductor 494F to source SP2(4). Conductor 494F is directly connected to conductor 422. In this manner, source SP2(4) is configured to receive reference voltage VDDPST.

A conductor 494G is provided in metal layer M0 that extends across the length of both drain DP1(1) and drain DN1(1). A plurality of vias in the MD/VD layer connects conductor 494G to drain DP1(1) and a plurality of vias in the MD/VD layer connects conductor 494G to drain DN1(1). In this manner, conductor 494G connects drain DP1(1) to drain DN1(1).

A conductor 494H is provided in metal layer M0 that extends across the length of source SN2(1). A plurality of vias in the MD/VD layer connects conductor 494H to source SN2(1). Conductor 494H is directly connected to conductor 440. In this manner, source SN2(1) is configured to receive reference voltage VSSPST.

A conductor 494I is provided in metal layer M0 that extends across the length of drain DN2(1)(2) and source SN1(1)(2). A plurality of vias in the MD/VD layer connects conductor 494I to drain DN2(1)(2) and a plurality of vias in the MD/VD layer connects conductor 494I to source SN1(1)(2). In this manner, conductor 494I connects drain DN2(1)(2) and source SN1(1)(2) to one another.

A conductor 494J is provided in metal layer M0 that extends across the length of source SN2(2)(3). A plurality of vias in the MD/VD layer connects conductor 494J to source SN2(2)(3). Conductor 494J is directly connected to conductor 440. In this manner, SN2(2)(3) is configured to receive reference voltage VSSPST.

A conductor 494K is provided in metal layer M0 that extends across the length of drain DN2(3)(4) and source SN1(3)(4). A plurality of vias in the MD/VD layer connects conductor 494K to drain DN2(3)(4) and a plurality of vias in the MD/VD layer connects conductor 494K to source SN1(3)(4). In this manner, conductor 494K connects drain DN2(3)(4) and source SN1(3)(4) to one another. Conductors 439, 494I, 494K and vias in MD/VD layer provide the network net1, as described in FIG. 1. In some embodiments, conductors in network net1 are connected to each other by one or more conductors in a higher metal layer.

A conductor 494L is provided in metal layer M0 that extends across the length of both drain DP1(4) and drain DN1(4). A plurality of vias in the MD/VD layer connects conductor 494L to drain DP1(4) and a plurality of vias in the MD/VD layer connects conductor 494L to drain DN1(4). In this manner, conductor 494G connects drain DP1(1) to drain DN1(4).

Conductor 422 sources SP2(1), SP2(4), SP2(2)(3) are electrically disconnected from conductor 426 and section BP1. Conductor 440, sources SN2(1), SN2(4), SN2(2)(3) are electrically disconnected from conductor 426 and section BN1. This provides the isolation between transistors BP1, BP2 and transistors BN2, BN1 that raises the breakdown voltage of transistors BP1, BN1.

With respect to FIGS. 4A-4C, layout diagrams 400A, 400B, 400C represent semiconductor devices with the same circuit design. A semiconductor device fabricated in accordance with layout diagram 400A consumes the most area while a semiconductor device fabricated in accordance with layout diagram 400B consumes less area than the semiconductor device fabricated in accordance with layout diagram 400A. A semiconductor device fabricated in accordance with layout diagram 400C consumes less area than a semiconductor device fabricated in accordance with layout diagram 400B. In some embodiments, a semiconductor device fabricated in accordance with layout diagram 400C consumes 30% less area compared to the semiconductor device fabricated in accordance with layout diagram 400A.

FIG. 4E illustrates the substrate 401 shown in FIG. 4A, 4B, and FIG. 4D with the PO layer formed on the substrate 401.

Accordingly, well 404 is provided in substrate 401 in the same manner as provided in layout diagram 400A, as shown in FIG. 4A, FIG. 4B, and FIG. 4D. Similarly active regions 408(1), 408(2), 408(3), 408(4), 410(1), 410(2), 410(3), 410(4), 414(1), 414(2), 414(3), 414(4), 416(1), 416(2), 416(3), 416(4) are provided in the same manner as in layout diagram 400A in FIG. 4A, FIG. 4B, and FIG. 4D. As shown, portions VP of the PO layer extend in the second direction (parallel to the Y-axis) and form gates of the PMOS transistors and NMOS transistors, as described above with respect to FIG. 4A, 4B. Portions HP in the PO layer extend in the first direction (parallel to the X-axis) and connect the portions VP.

Figure 4G:
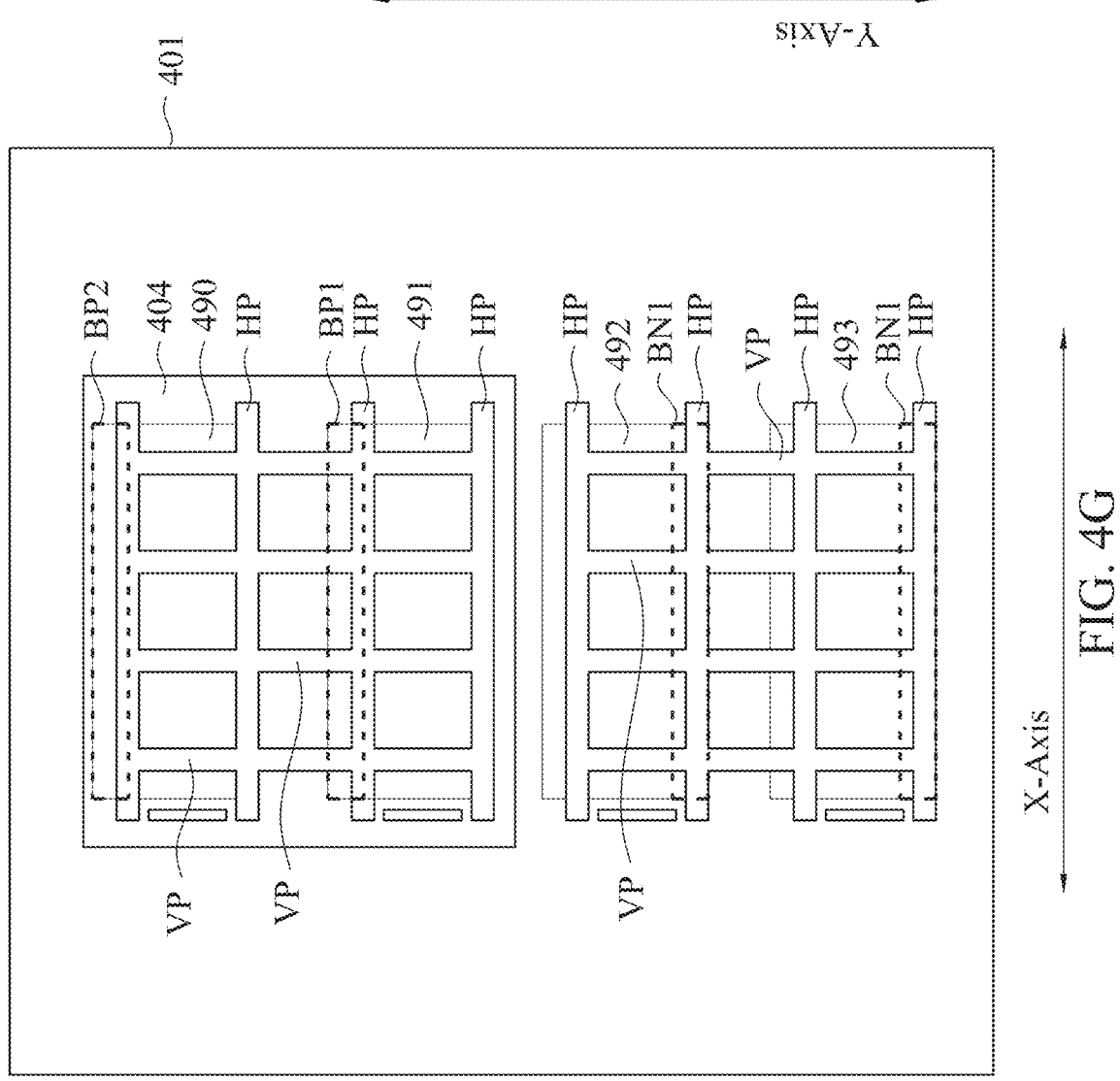
FIG. 4G is a layout diagram that shows the semiconductor substrate in FIG. 4F with a PO layer.

FIG. 4G illustrates the substrate 401 shown in FIG. 4C and FIG. 4F with the PO layer formed on the substrate 401.

Accordingly, well 404 is provided in substrate 401 in the same manner as provided in layout diagram 400A, as shown in FIG. 4C and FIG. 4F. Similarly active regions 490, 491, 492, 493 are provided in the same manner as in layout diagram 400A in FIG. 4C and FIG. 4F. As shown, portions VP of the PO layer extend in the second direction (parallel to the Y-axis) and form gates of the PMOS transistors and NMOS transistors, as described above with respect to FIG. 4C. Portions HP in the PO layer extend in the first direction (parallel to the X-axis) and connect the portions VP.

Figure 4H:
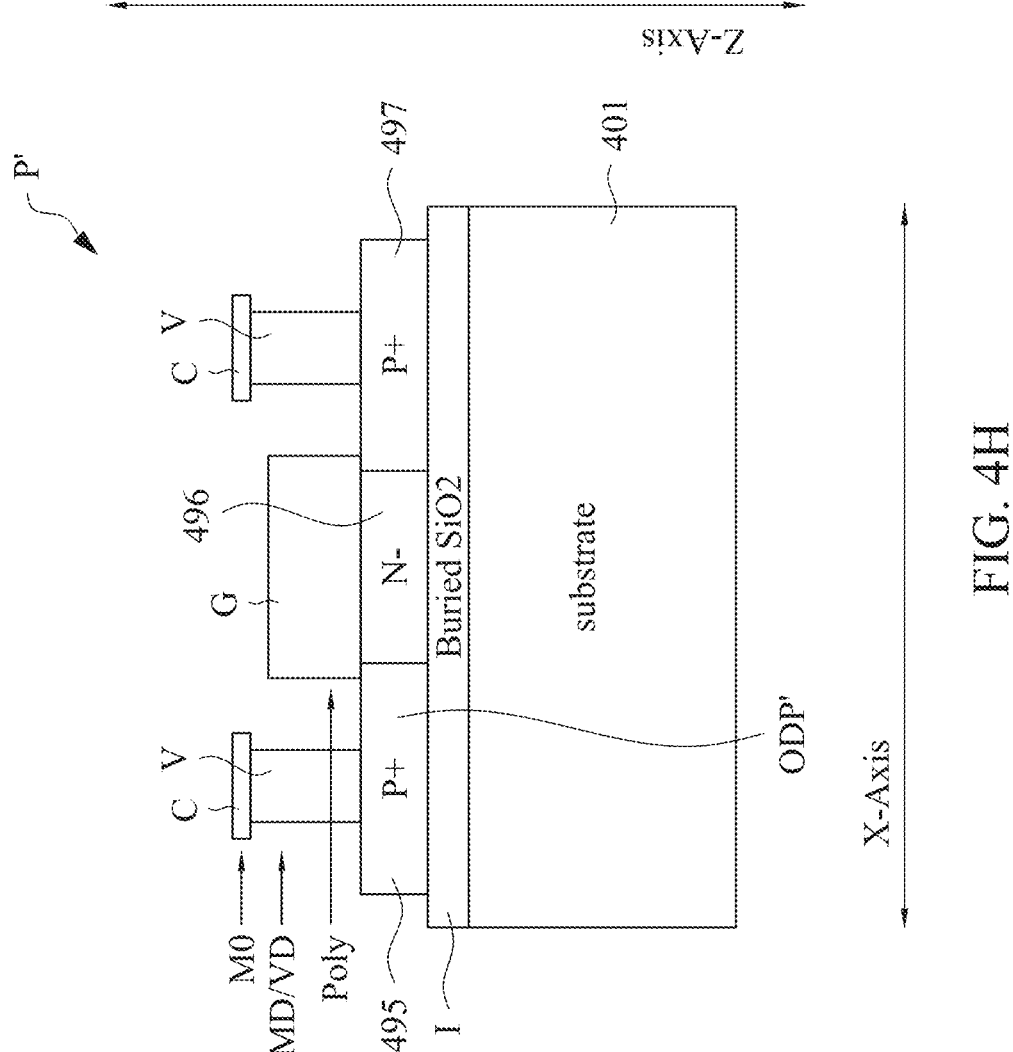
FIG. 4H is a cross-section diagram along cross-section line 4H in FIG. 4A of a PMOS transistor, in accordance with some embodiments.

FIG. 4H is a cross-section diagram along cross-section line 4H in FIG. 4A of a PMOS transistor P′.

PMOS transistor P′ provides one embodiment of a configuration of PMOS transistors MP2, MP1 in FIGS. 4A, 4B, and 4C. As shown, PMOS transistor P′ is formed in semiconductor substrate 401. Semiconductor substrate 401 is formed from, in at least one embodiment, silicon, silicon germanium (SiGe), gallium arsenic, or other suitable semiconductor materials.

An insulating layer is formed on top of semiconductor substrate 401 to define an insulation layer I with respect to the third direction (parallel to the Z-axis). In some embodiments, the insulating layer is includes a silicon oxide, such as silicon dioxide ($SiO_2$). An active region ODP' is located on insulating layer I. Active region ODP' includes a heavily doped P region 495, a lightly doped N region 496, and a heavily doped P region 497. Heavily doped P regions 495 are used to form drain/source regions. Lightly doped N region 496 is between heavily doped P regions 495, 497.

In some embodiments, active region ODP' include epitaxially grown silicon (epi Si), silicon carbide, or silicon germanium. active region ODP' of the IC device associated with the gate structure are in-situ doped or undoped during the epi process in some instances. When active region ODP' are undoped during the epi process, active region ODP' are doped during a subsequent process in some instances.

Vias V are located on heavily doped P regions 495, 497 in the MD/VD layer. MD/VD layer is located over semiconductor substrate 401 relative to a third direction that is parallel to the Z-axis. A gate G is located on lightly doped N region 496 in Poly layer. Conductors C are located in metal layer M0, which is directly over MD/VD layer relative to the third direction. Vias V connect conductors C to their respective sections of active region ODP'.

FIG. 4I is a cross-section diagram along cross-section line 4I in FIG. 4A of a body connection to PMOS transistor P'.

As shown, adjacent to lightly doped N region 496 with respect to the second direction (parallel to the Y-axis) active region ODP' includes a heavily doped N region BP. Heavily doped N region BP is located on and over insulation layer I with respect to the third direction (parallel to Z-axis). Heavily doped N region BP is configured to provide a body connection to transistor P'. A via V in the MD/VD layer is located on heavily doped region BP next to gate G in Poly layer of transistor P'. Via V on heavily doped region BP connects heavily doped region BP to a conductor C in metal layer MD/VD. Conductor C and corresponding via V define a body connection for transistor MP1, and are connected to the source of transistor MP1. A body connection for transistor MP2 is similarly configured, except that conductor C in the body connection for transistor MP2 is connected to VDDPST.

Figure 4J:
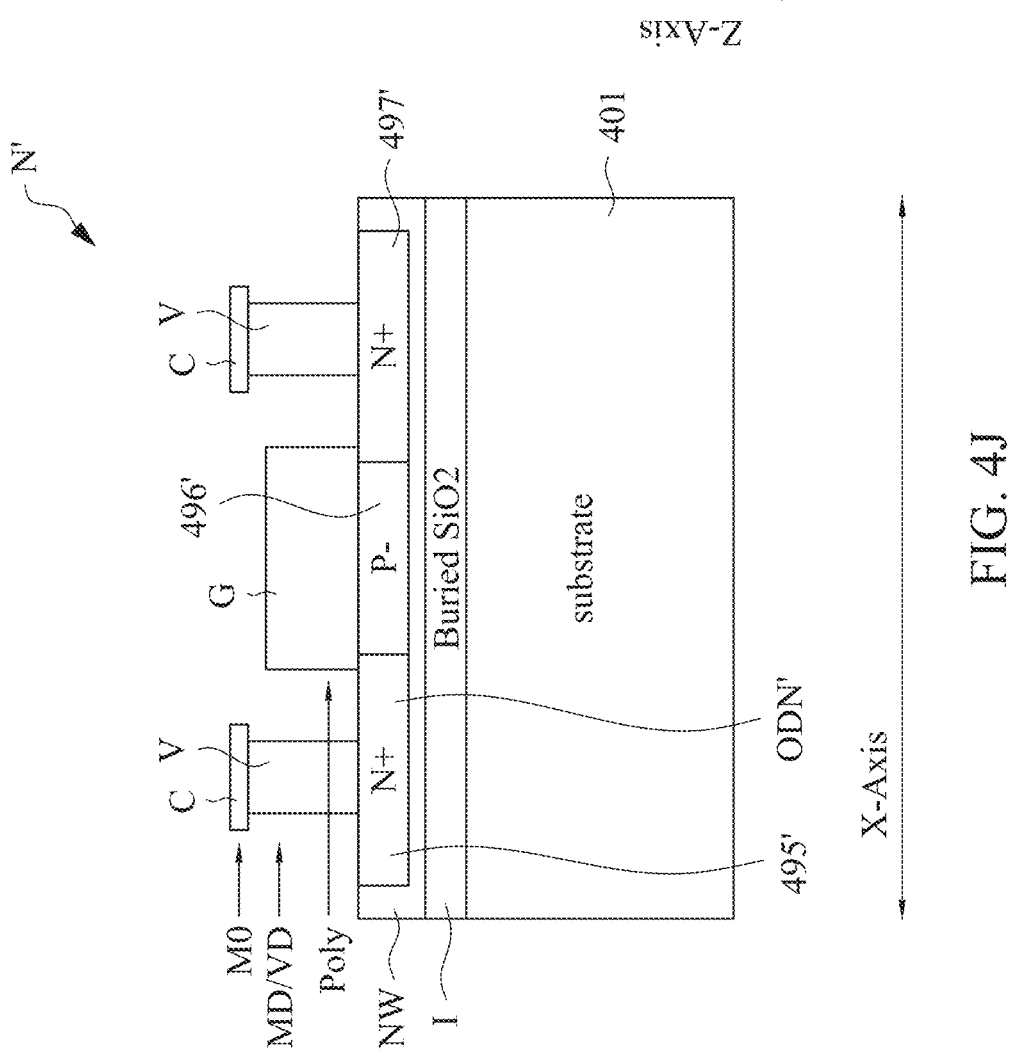
FIG. 4J is a cross-section diagram along cross-section line 4J in FIG. 4A of a NMOS transistor, in accordance with some embodiments.

FIG. 4J is a cross-section diagram along cross-section line 4J in FIG. 4A of a NMOS transistor N'.

NMOS transistor N' provides one embodiment of a configuration of PMOS transistors MN2, MN1 in FIGS. 4A, 4B, and 4C. As shown, NMOS transistor N' is formed in semiconductor substrate 401.

An active region ODN' is located on insulating layer I. Active region ODN' includes a heavily doped N region 495', a lightly doped P region 496', and a heavily doped N region 497'. Heavily doped N regions 495' are used to form drain/source regions. Lightly doped P region 496' is between heavily doped N regions 495', 497'. Heavily doped N region 495', lightly doped P region 496', and heavily doped N region 497' are formed in N-well NW.

In some embodiments, active region ODN' include epitaxially grown silicon (epi Si), silicon carbide, or silicon germanium. active region ODN' of the IC device associated with the gate structure are in-situ doped or undoped during the epi process in some instances. When active region ODN' are undoped during the epi process, active region ODN' are doped during a subsequent process in some instances. active region ODN' is also formed in N-well NW.

Vias V are located on heavily doped N regions 495', 497' in the MD/VD layer. MD/VD layer is located over semi-conductor substrate 401 relative to a third direction that is parallel to the Z-axis. A gate G is located on lightly doped P region 496' in Poly layer. Conductors C are located in metal layer M0, which is directly over MD/VD layer relative to the third direction. Vias V connect conductors C to their respective sections of Active region ODN'.

Figure 4K:
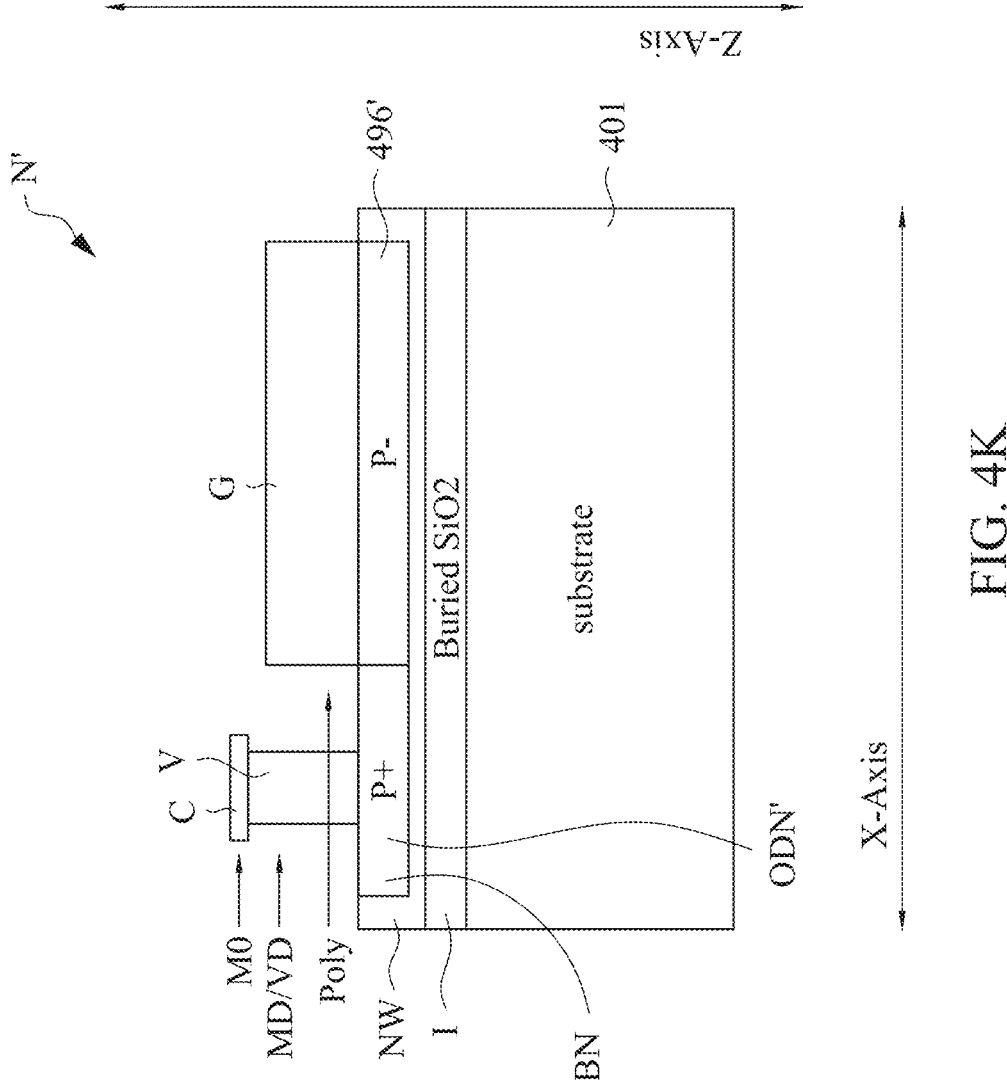
FIG. 4K is a cross-section diagram along cross-section line 4K in FIG. 4A of a body connection to a NMOS transistor, in accordance with some embodiments.

FIG. 4K is a cross-section diagram along cross-section line 4K in FIG. 4A of a body connection to NMOS transistor N'.

As shown, adjacent to lightly doped P region 496' with respect to the second direction (parallel to the Y-axis) active region ODN' includes a heavily doped N region BN. Heavily doped N region BN is located on and over insulation layer I with respect to the third direction (parallel to Z-axis). Heavily doped N region BN is configured to provide a body connection to transistor N'. A via V in the MD/VD layer is located on heavily doped region BP next to gate G in Poly layer of transistor N'. Via V on heavily doped region BP connects heavily doped region BP to a conductor C in metal layer MD/VD. Conductor C and corresponding via V define a body connection for transistor MN1, and are connected to the source of transistor MN1. A body connection for transistor MN2 is similarly configured, except that conductor C in the body connection for transistor MN2 is connected to VSSPST.

Figure 5A:
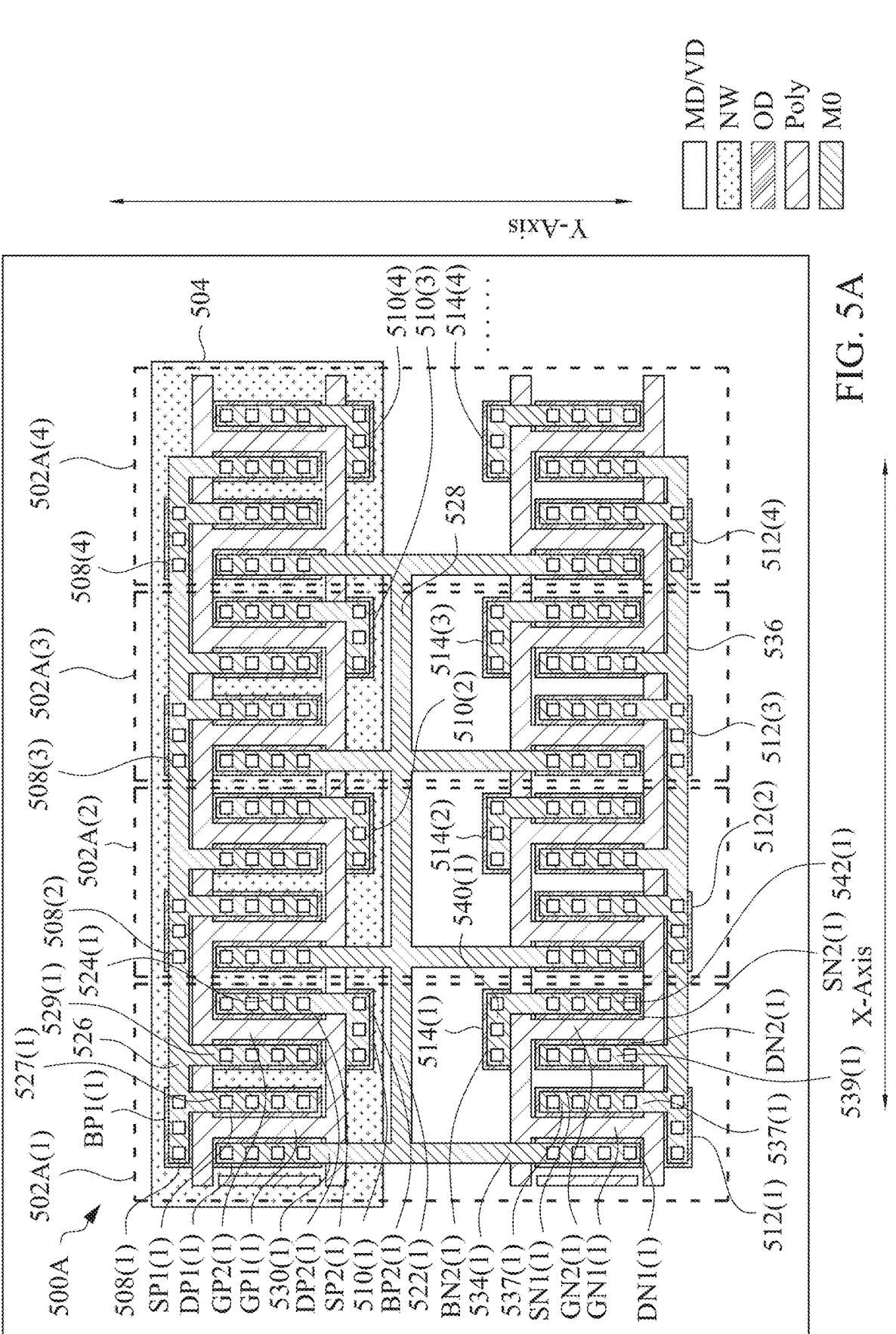
FIG. 5A is a layout diagram of a semiconductor device, in accordance with some embodiments.

FIG. 5A is a layout diagram 500A of a semiconductor device, in accordance with some embodiments.

Layout diagram 500A represents various features of the semiconductor device as shapes. Features of layout diagram 500A are discussed with reference to the semiconductor components that the illustrated shapes represent.

Layout diagram 500A includes circuit 502A(1), circuit 502A(2), circuit 502A(3), and circuit 502A(4). Each of circuit 502A(1), circuit 502A(2), circuit 502A(3), and circuit 502A(4) are an example of the circuit shown in semiconductor device 100 of FIG. 1. It should be noted that the components for circuit 502A(1) are discussed in detail and it should be presumed that circuit 502A(2), circuit 502A(3), and circuit 502A(4) have similar components and arrangement. Furthermore, the diodes D1, D2 in FIG. 1 are not shown in FIG. 5A.

Layout diagram 500A includes a semiconductor substrate 501. Semiconductor substrate 501 is a silicon on insulator type semiconductor substrate. Semiconductor substrate 501 defines a first well region 504. First well region 504 is an N-Well region. First well region 504 has a long axis that extends in the first direction (which in this embodiment is a first horizontal direction that is parallel to the X-axis). Within first well region 504 is a row of active regions 508(1), 508(2), 508(3), 508(4) (generically active regions 508), and active regions 510(1), 510(2), 510(3), 510(4) (generically active regions 510). Active regions 508 and 510 alternate in the row. Thus, the order of the active regions from left to right is 508(1), 510(1), 508(2), 510(2), 508(3), 510(3), 508(4), 510(4). Each of active regions 508, 510 has P-type conductivity. Active regions 508(1), 508(2), 508(3), 508(4) and active regions 510(1), 510(2), 510(3), 510(4) have P-type conductivity. Active regions 508(1), 508(2), 508(3), 508(4) are used to form a PMOS transistor that corresponds to PMOS transistor MP2 in FIG. 1 in circuit 502A(1), circuit 502A(2), circuit 502A(3), and circuit 502A(4), as explained in further detail below. More specifically, active regions 508(1), 508(2), 508(3), 508(4) are separated from one another with respect to the first direction (parallel to the X-axis), and are aligned with respect to a second direction, wherein the second direction is perpendicular to the first direction. Thus, PMOS transistors that correspond to PMOS transistor MP1 in FIG. 1 in circuit 502A(1), circuit 502A(2), circuit 502A(3), and circuit 502A(4) are provided by active regions 508(1), 508(2), 508(3), 508(4).

Within first well region 504 are active regions 510(1), 510(2), 510(3), 510(4), which are interleaved with active regions 508(1), 508(2), 508(3), 508(4) with respect to the first direction. Active regions 510(1), 510(2), 510(3), 510(4) are slightly offset with respect to active regions 508(1), 508(2), 508(3), 508(4) with respect to the second direction so that a majority of the area of active regions 508(1), 508(2), 508(3), 508(4) and a majority of the area of active regions 510(1), 510(2), 510(3), 510(4) are aligned with respect to the second direction. A PMOS transistor is provided that corresponds to PMOS transistor MP2 in FIG. 1 in circuit 502A(1), circuit 502A(2), circuit 502A(3), and circuit 502A(4) as explained in further detail below. Each of active regions 508(1), 508(2), 508(3), 508(4), 510(1), 510(2), 510(3), 510(4) is aligned with respected to the second direction meaning each of active regions at least partially occupy the same position with respect to the second direction (parallel to Y-axis).

Layout diagram 500A includes a row of active regions 512(1), 512(2), 512(3), 512(4) (generically active regions 512) and active regions 514(1), 514(2), 514(3), 514(4) (generically active regions 514). Active regions 512 and 514 alternate in the row. Thus, the order of the active regions from left to right is 512(1), 514(1), 512(2), 514(2), 512(3), 514(3), 512(4), 514(4). Each of active regions 512, 514 has N-type conductivity. Active regions 512(1), 512(2), 512(3), 512(4) and active regions 514(1), 514(2), 514(3), 514(4) have N-type conductivity. Active regions 512(1), 512(2), 512(3), 512(4) are used to form a NMOS transistor that corresponds to NMOS transistor MN1 in FIG. 1 in circuit 502A(1), circuit 502A(2), circuit 502A(3), and circuit 502A(4), as explained in further detail below. More specifically, active regions 512(1), 512(2), 512(3), 512(4) are separated from one another with respect to the first direction (parallel to the X-axis), and are aligned with respect to a second direction, wherein the second direction is perpendicular to the first direction. Thus, NMOS transistors that correspond to NMOS transistor MN2 in FIG. 1 in circuit 502A(1), circuit 502A(2), circuit 502A(3), and circuit 502A(4) are provided by active regions 512(1), 512(2), 512(3), 512(4).

Active regions 514(1), 514(2), 514(3), 514(4) are interleaved with active regions 512(1), 512(2), 512(3), 512(4) with respect to the first direction. Active regions 514(1), 514(2), 514(3), 514(4) are slightly offset with respect to active regions 512(1), 512(2), 512(3), 512(4) with respect to the second direction so that a majority of the area of active regions 512(1), 512(2), 512(3), 512(4) and a majority of the area of active regions 514(1), 514(2), 514(3), 514(4) are aligned with respect to the second direction. An NMOS transistor is provided that corresponds to NMOS transistor MN2 in FIG. 1 in circuit 502A(1), circuit 502A(2), circuit 502A(3), and circuit 502A(4) as explained in further detail below. Each of active regions 512(1), 512(2), 512(3), 512(4), 514(1), 514(2), 514(3), 514(4) is aligned with respected to the second direction meaning each of active regions at least partially occupy the same position with respect to the second direction (parallel to Y-axis).

A detailed explanation is now provided for circuit 502A(1). It should be noted that circuits 502A(2), 502A(3), 502A(4) each have an arrangement that is similar to the arrangement of circuit 502A(1). An explanation of circuits 502A(2), 502A(3), 502A(4) is therefore omitted for the sake of brevity. With respect to circuit 502(A)(1), circuit 502A(1) includes a transistor MP2(1) that corresponds to transistor MP2 in FIG. 1, a transistor MP1(1) that corresponds to transistor MP1 in FIG. 1, a transistor MN2(1) that corresponds to transistor MN2 in FIG. 1, and a transistor MN1(1) that corresponds to transistor MN1 in FIG. 1.

A gate electrode has a long axis that extends in the second direction (parallel to Y-axis) on active region 508(1) to form a gate GP1(1) of transistor MP1(1). A gate electrode has a long axis that extends in the second direction (parallel to Y-axis) on active region 510(1) to form a gate GP2(1) of transistor MP2(1). Gate GP1(1) and gate GP2(2) are aligned with respect to the second direction and separated with respect to the first direction.

The section of active region 508(1) to the left of gate GP1(1)) is drain DP1(1) of transistor MP1(1) and the section of active region 510(1) to the right of gate GP1(1) is source SP1(1) of transistor MP1(1). Note that a section BP1(1) of active region 508(1) extends past and above gate GP1(1) relative to the second direction. This section BP1(1) is for connecting to the body of transistor MP1(1).

The section of active region 510(1) to the right of gate GP2(1) is source SP2(1) of transistor MP2(1) and the section of active region 510(1) to the left of gate GP2(1) is drain DP2(1) of transistor MP2(1). Note that a section BP2(1) of active region 510(1) extends past and below gate GP2(1) relative to the second direction. This section BP2(1) is for connecting to the body of transistor MP2(1).

A gate electrode has a long axis that extends in the second direction (parallel to Y-axis) on active region 512(1) to form a gate GN1(1) of transistor MN1(1). A gate electrode has a long axis that extends in the second direction (parallel to Y-axis) on active region 514(1) to form a gate GN2(1) of transistor MN2(1). Gate GN1(1) and gate GN2(2) are aligned with respect to the second direction and separated with respect to the first direction. Note that a section BN1(1) of active region 512(1) extends past and below the gate GN1(1) relative to the second direction. This section BN1(1) is for connecting to the body of transistor MN1(1). Furthermore, note that a section BN2(1) of active region 514(1) extends past and above gate GN2(1) relative to the second direction. This section BN2(1) is for connecting to the body of transistor MN2(1).

The section of active region 512(1) to the left of gate GN1(1)) is drain DN1(1) of transistor MN1(1) and the section of active region 514(1) to the right of gate GN1(1) is source SN1(1) of transistor MN1(1). Note that a section BN1(1) of active region 512(1) extends past and above gate GN1(1) relative to the second direction. This section BN1(1) is for connecting to the body of transistor MN1(1).

The section of active region 514(1) to the right of gate GN2(1) is source SN2(1) of transistor MN2(1) and the section of active region 514(1) to the left of gate GN2(1) is drain DN2(1) of transistor MN2(1). Note that a section BN2(1) of active region 514(1) extends past and below gate GN2(1) relative to the second direction. This section BN2(1) is for connecting to the body of transistor MN2(1).

Contacts for source SP2(1), drain DP2(1), source SP1(1), drain DP1(1), source SN2(1), drain DN2(1), source SN1(1), drain DN1(1) are formed on and over active regions 508(1), 510(1), 514(1), 516(1) in the MD/VD layer.

A conductor 522(1) has a long axis that extends in the first direction (parallel to the X-axis). Conductor 522(1) is configured to receive reference voltage VDDPST and corresponds to the power reference node 104 in FIG. 1. Conductor 522(1) extends over section BP2(1) of transistor MP2(1). A plurality of vias in the MD/VD layer connect conductor

522(1) to section BP2(1). As such, section BP2(1) (and thus the body of transistor MP2(1)) is configured to receive reference voltage VDDPST.

A conductor 524(1) has a long axis that extends in the second direction (parallel to the Y-axis). Conductor 524(1) is connected to conductor 522(1) and thus also is configured to receive reference voltage VDDPST. Conductor 524(1) extends directly over the entire length of source SP2(1) in the second direction (parallel to Y-axis). Conductors 522(1), 524(1) are each provided in metal layer M0. In this embodiment, a plurality of vias are provided in MD/VD layer across entire length of conductor 524(1) that connect to source SP2(1) of transistor MP2(1) to conductor 524(1). In this manner, source SP2(1) and body of transistor MP2(2) (through section BP2(1)) are configured to receive reference voltage VDDPST.

A conductor 526 extends in the first direction across section BP1(1). Conductor 526 in in the metal layer M0. A plurality of vias in the MD/VD layer connect conductor 526 to section BP1(1). In this manner, conductor 526 is connected to the body of transistor MP1(1).

A conductor 527(1) extends in the second direction across the entire length of source SP1(1). Conductor 527(1) in in the metal layer M0 and is directly connected to conductor 526. A plurality of vias in the MD/VD layer connect conductor 527(1) to source SP1(1) of transistor MP1(1).

A conductor 528 has a long axis that extends in the first direction (parallel to the X-axis) and is configured to receive an input/output signal and corresponds to node B is FIG. 1. Conductor 526 and conductor 528 are both located in metal layer M0.

A conductor 529(1) extends in the second direction across the entire length of drain DP2(1). Conductor 529(1) in in the metal layer M0 and is directly connected to conductor 529(1). A plurality of vias in the MD/VD layer connect conductor 529(1) to drain DP2(2) of transistor MP2(1). Thus, conductors 526, 527(1), 529(1) connect body of transistor MP1(1) (through section BP1(1)), source SP1(1) of transistor MP1(1), and drain DP2(2) of transistor MP2(2). In this embodiment, conductors 526, 527(1), 529(1) and vias in MD/VD layer provide the network net0, as described in FIG. 1. In other embodiments, conductors in network net0 can be provided in higher metal layers that are connected to each other.

A conductor 530(1) has a long axis that extends in the second direction (parallel to the Y-axis). Conductor 530(1) is connected to conductor 528 and thus also is configured to receive the input/output signal. Conductor 530(1) extends directly over the entire length of drain DP1(1) in the second direction (parallel to Y-axis) and over entire length of drain DN1(1) in the second direction. Conductor 530(1) is provided in metal layer M0. In this embodiment, a plurality of vias in MD/VD layer are provided across entire length of drain DP1(1) that connect to drain DP1(1) of transistor MP1(1) to conductor 530(1) and a plurality of vias in MD/VD layer are provided across entire length of DN1(1) that connect to drain DN1(1) of transistor MN1(1) to conductor 530(1).

A conductor 534(1) has a long axis that extends in the second direction (parallel to Y-axis) and is provided in the metal layer M0. Conductor 534(1) extends over the entire length of drain DP2(1) of transistor MP2(1) and extends over the entire length of drain DN1(1) of transistor MN1(1). Conductor 534(1) is connected to conductor 528 and is thus configured to receive input/output signal. In this manner, both drain DP2(1) and drain DN1(1) are configured to receive input/output signal that propagates along conductor 528.

A conductor 536 extends in the first direction across section BN1(1). Conductor 536 in in the metal layer M0. A plurality of vias in the MD/VD layer connect conductor 536 to section BN1(1). In this manner, conductor 536 is connected to the body of transistor MN1(1).

A conductor 537(1) extends in the second direction across the entire length of source SN1(1). Conductor 537(1) in in the metal layer M0 and is directly connected to conductor 536. A plurality of vias in the MD/VD layer connect conductor 537(1) to source SN1(1) of transistor MN1(1). Thus, conductors 536, 537(1), 539(1) connect body of transistor MN1(1) (through section BN1(1)), source SN1(1) of transistor MN1(1), and drain DN2(2) of transistor MN2 (2).

A conductor 539(1) extends in the second direction across the entire length of drain DN2(1). Conductor 539(1) in in the metal layer M0 and is directly connected to conductor 536. A plurality of vias in the MD/VD layer connect conductor 539(1) to drain DN2(1) of transistor MN2(1). In this embodiment, conductors 536, 537(1), 539(1) and vias in MD/VD layer provide the network net1, as described in FIG. 1. In other embodiments, conductors in network net1 can be provided in higher metal layers that are connected to each other.

A conductor 540(1) has a long axis that extends in the first direction (parallel to the X-axis). Conductor 540(1) is configured to receive reference voltage VSSPST and corresponds to the power reference node 106 in FIG. 1. Conductor 540(1) extends over section BN2(1) of transistor MN2 (1). A plurality of vias in the MD/VD layer connect conductor 540(1) to section BN2(1). As such, section BN2 (1) (and thus the body of transistor MN2(1)) is configured to receive reference voltage VSSPST.

A conductor 542(1) has a long axis that extends in the second direction (parallel to the Y-axis). Conductor 542(1) is connected to conductor 540(1) and thus also is configured to receive reference voltage VSSPST. Conductor 542(1) extends directly over the entire length of source SN2(1) in the second direction (parallel to Y-axis). Conductors 540(1), 542(1) are each provided in metal layer M0. In this embodiment, a plurality of vias are provided in MD/VD layer across entire length of conductor 542(1) that connect to source SN2(1) of transistor MN2(1) to conductor 542(1). In this manner, source SN2(1) and body of transistor MN2(2) (through section BN2(1)) are configured to receive reference voltage VSSPST.

Circuits 502A(2), 502A(3), 502A(4) are arranged in the same manner as circuit 502A(1) and thus a description of their arrangement is not repeated herein.

Figure 5B:
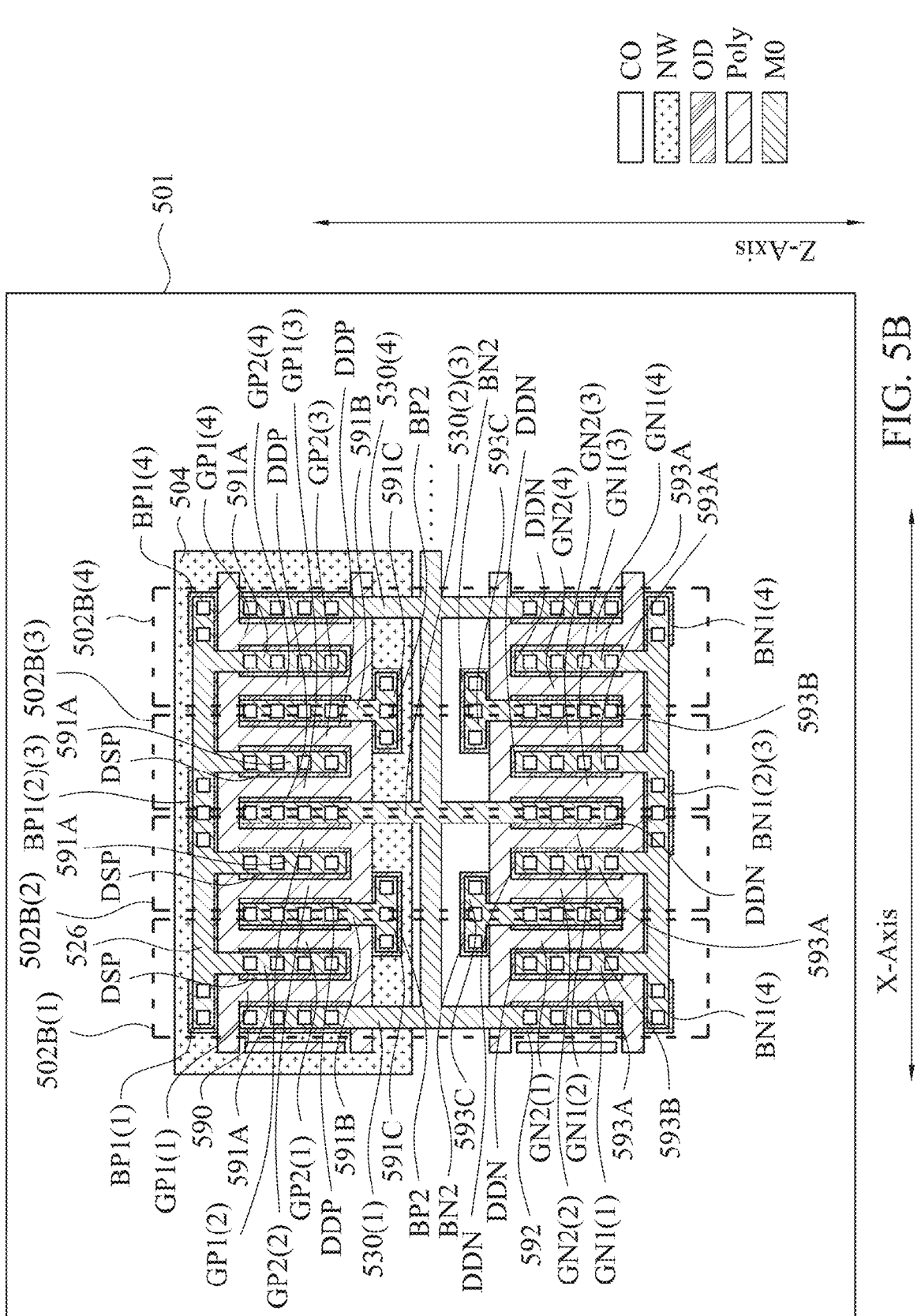
FIG. 5B is a layout diagram of a semiconductor device, in accordance with some embodiments.

FIG. 5B is a layout diagram 500B of a semiconductor device, in accordance with some embodiments.

Layout diagram 500B represents various features of the semiconductor device as shapes. Features of layout diagram 500B are discussed with reference to the semiconductor components that the illustrated shapes represent.

Layout diagram 500B includes circuit 502B(1), circuit 502B(2), circuit 502B(3), and circuit 502B(4). Each of circuit 502B(1), circuit 502B(2), circuit 502B(3), and circuit 502B(4) are an example of the circuit shown in semiconductor device 100 of FIG. 1.

Rather than having active regions 508(1), 508(2), 508(3), 508(4), 510(2), 510(3), 510(4) as in FIG. 5A where each of transistor MP2(1), MP2(2), MP2(3), MP2(4), MP1(1), MP1 (2), MP1(3), MP1(4) are formed on a corresponding one of active regions 508(1), 508(2), 508(3), 508(4), 510(1), 510(2), 510(3), 510(4). However, in FIG. 5B, transistors MP1(1), MP1(2), MP1(3), MP1(4) (referred to collectively or generically as transistor(s) MP1) and transistors MP2(1), MP2(2), MP2(3), MP2(4) (referred to collectively or generically as transistor(s) MP2) are each formed in active region 590. For convenience, gates GP1(1), GP1(2), GP1(3), GP1(4) are referred to collectively or generically as gate(s) GP1 and gates GP2(1), GP2(2), GP2(3), GP2(4) are referred to collectively or generically as gate(s) GP2.

Also, rather than having active regions 514(1), 514(2), 514(3), 514(4), 516(1), 516(2), 516(3), 516(4) as in FIG. 5A where each of transistor MN1(1), MN1(2), MN1(3), MN1(4), MN2(1), MN2(2), MN2(3), MN2(4) are formed on a corresponding one of active regions 514(1), 514(2), 514(3), 514(4), 516(1), 516(2), 516(3), 516(4). However, in FIG. 5B, transistors MN1(1), MN1(2), MN1(3), MN1(4) (referred to collectively or generically as transistor(s) MN1) and transistors MN2(1), MN2(2), MN2(3), MN2(4) (referred to collectively or generically as transistor(s) MN2) are each formed in active region 592. For convenience, gates GN1(1), GN1(2), GN1(3), GN1(4) are referred to collectively or generically as gate(s) GN1 and gates GN2(1), GN2(2), GN2(3), GN2(4) are referred to collectively or generically as gate(s) GN2.

The order of transistors in active region 590 from left to right is as follows transistor MP1(1), MP2(1), MP2(2), MP1(2), MP1(3), MP2(3), MP2(4), MP1(4). With respect to drains and sources, each of transistors MP1(1), MP2(1), MP2(2), MP1(2), MP1(3), MP2(3), MP2(4), MP1(4) is a mirror image (with respect to the second direction that is parallel to the Y-axis) of transistors MP1(1), MP2(1), MP2(2), MP1(2), MP1(3), MP2(3), MP2(4), MP1(4) that are directly adjacent to it. Furthermore, drain/sources of transistors directly adjacent to one another with respect to the first direction are collapsed into a single drain/source region. When a transistor MP1 is adjacent to a transistor MP2, the shared drain/source region is the source of transistor MP1 and a drain of transistor MP2. Each of these types of regions is referred to as drain/source region DSP. For example, the portion of active region 590 to the right of gate GP1(1) and to the left of gate GP2(1) is one of the drain/source regions DSP.

Conductors 591A each have a long axis that extends in the second direction (parallel to the Y-axis) and each is connected to conductor 540. Each of conductors 591A is located in metal layer M0 and extends across the length of drain/source regions DSP. For each of conductors 591A, a plurality of vias are located in the MD/VD layer that connects each respective conductor 591A with their respective drain/source regions DSP. Conductors 526, 591A and vias in MD/VD layer provide the network net0, as described in FIG. 1. In some embodiments, conductors in network net0 are connected to each other by one or more conductors in a higher metal layer.

When a transistor MP2 is adjacent to another transistor MP2, the shared drain/source region is a drain of one of transistors MP2 and a drain of the other MP2 transistor. Each of these types of regions is referred to as drain/source region DDP. For example, the portion of active region 590 to the right of gate GP2(1) and to the left of gate GP2(2) is one of the drain/source regions DDPs.

Conductors 591B each have a long axis that extends in the second direction (parallel to the Y-axis). Each of conductors 591B is located in metal layer M0 and extends across the length of drain/source regions DDPs. For each of conductors 591B, a plurality of vias are located in the MD/VD layer that connects each respective conductor 591B with their respective drain/source regions DDPs.

Also, when a transistor MP2 is adjacent to another transistor MP2, a section BP2 of active region 590 extends past and below gates GPS of both of transistors MP2 relative to the second direction. In this example, a section BP2 is provided past and below gates GP2(1), GP2(2) and a section BP2 is provided past and below gates GP2(3), GP2(4). Sections BP2 are for connecting to the bodies of the adjacent transistors MP2. For each of sections BP2, a conductor 591C is located in metal layer M0 that has a long axis that extends in the first direction (parallel to the X-axis). For each of sections BP2, conductor 591C extends across the entire length of section BP2 relative to the first direction (parallel to the X-axis). Also for each of sections BP2, a plurality of vias located in the MD/VD layer connects conductor 591C to section BP2.

The order of transistors in active region 592 from left to right is as follows transistor MN1(1), MN2(1), MN2(2), MN1(2), MN1(3), MN2(3), MN2(4), MN1(4). With respect to drains and sources, each of transistors MN1(1), MN2(1), MN2(2), MN1(2), MN1(3), MN2(3), MN2(4), MN1(4) is a mirror image (with respect to the second direction that is parallel to the Y-axis) of transistors MN1(1), MN2(1), MN2(2), MN1(2), MN1(3), MN2(3), MN2(4), MN1(4) that are directly adjacent to it. Furthermore, drain/sources of transistors directly adjacent to one another with respect to the first direction are collapsed into a single drain/source region. When a transistor MN1 is adjacent to a transistor MN2, the shared drain/source region is the source of the MN1 transistor and a drain of the MN2 transistor. Each of these types of regions is referred to as drain/source region DSN. For example, the portion of active region 592 to the right of gate GN1(1) and to the left of gate GN2(1) is one of the drain/source regions DSN.

Conductors 593A each have a long axis that extends in the second direction (parallel to the Y-axis) and each is connected to conductor 540. Each of conductors 593A is located in metal layer M0 and extends across the length of drain/source regions DSN. For each of conductors 593A, a plurality of vias are located in the MD/VD layer that connects each respective conductor 593A with their respective drain/source regions DSN. Conductors 540, 593A and vias in MD/VD layer provide the network net1, as described in FIG. 1. In some embodiments, conductors in network net1 are connected to each other by one or more conductors in a higher metal layer.

When a transistor MN2 is adjacent to another transistor MN2, the shared drain/source region is a drain of one of the MN2 transistor and a drain of the other MN2 transistor. Each of these types of regions is referred to as drain/source region DDN. For example, the portion of active region 592 to the right of gate GN2(1) and to the left of gate GN2(2) is one of the drain/source regions DDNs.

Conductors 593B each have a long axis that extends in the second direction (parallel to the Y-axis). Each of conductors 593B is located in metal layer M0 and extends across the length of drain/source regions DDNs. For each of conductors 593B, a plurality of vias are located in the MD/VD layer that connects each respective conductor 593B with their respective drain/source regions DDNs.

Also, when a transistor MN2 is adjacent to another transistor MN2, a section BN2 of active region 592 extends past and below gates GPS of both of the transistors MN2 relative to the second direction. In this example, a section BN2 is provided past and below gates GN2(1), GN2(2) and a section BN2 is provided past and below gates GN2(3), GN2(4). Sections BN2 are for connecting to the bodies of the adjacent transistors MN2. For each of sections BN2, a conductor 593C is located in metal layer M0 that has a long axis that extends in the first direction (parallel to the X-axis). For each of sections BN2, conductor 593C extends across the entire length of section BN2 relative to the first direction (parallel to the X-axis). Also for each of sections BN2, a plurality of vias located in the MD/VD layer connects conductor 593C to section BN2.

Transistor MP1(2) is adjacent to transistor MP1(3), which is the only location where transistors MP1 are adjacent to one another. A section BP1(2)(3) is located past and above gates GP1(2), GP1(3) relative to the second direction. Section BP1(2)(3) is for connection to the bodies of transistors MP1(2), MP1(3). To the right of gate GP1(2) and to the left of gate GP1(3), a drain/source region DDP is provided that is the drain of transistor MP1(2) and the drain of transistor MP1(3).

Within active region 592, no transistor is provided to the left of transistor MN1(1). Thus, to the left of gate GN1(1) is drain DN1(1), which transistor MN1(1) does not share with another transistor. A section BN1(1) of active region 592 is located past and below gate GN1(1). Section BN1(1) provides a connection to the body of transistor MN1(1). Also, within active region 592, no transistor is provided to the right of transistor MN1(4). Thus, to the right of gate GN1(4) is drain DN1(4), which transistor MN1(4) does not share with another transistor. A section BN1(4) of active region 592 is located past and below gate GN1(4). Section BN1(4) provides a connection to the body of transistor MN1(4).

Transistor MN1(2) is adjacent to transistor MN1(3), which is the only location where transistors MN1 are adjacent to one another. A section BN1(2)(3) is located past and below gates GN1(2), GN1(3) relative to the second direction. Section BN1(2)(3) is for connection to the bodies of transistors MN1(2), MN1(3). To the right of gate GN1(2) and to the left of gate GN1(3), a drain/source region DDN is provided that is the drain of transistor MN1(2) and the drain of transistor MN1(3).

Within active region 592, no transistor is provided to the left of transistor MN1(1). Thus, to the left of gate GN1(1) is drain DN1(1), which transistor MN1(1) does not share with another transistor. A section BN1(1) of active region 592 is located past and below gate GN1(1). Section BN1(1) provides a connection to the body of transistor MN1(1). Also, within active region 592, no transistor is provided to the right of transistor MN1(4). Thus, to the right of gate GN1(4) is drain DN1(4), which transistor MN1(4) does not share with another transistor. A section BN1(4) of active region 592 is located past and below gate GN1(4). Section BN1(4) provides a connection to the body of transistor MN1(4).

Conductor 526 extends across the entire length of section BP1(1) to section BP1(2)(3) in the first direction (parallel to the X-axis). Conductor 526 extends across the entire length of section BP1(2)(3) to section BP1(4) in the first direction (parallel to the X-axis). Conductor 526 extends across the entire length of section BP1(4) in the first direction (parallel to the X-axis). A plurality of vias in the MD/VD layer connects conductor 526 to section BP1(1). A plurality of vias in the MD/VD layer connects conductor 526 to section BP1(2)(3). Finally, a plurality of vias in the MD/VD layer connects conductor 526 to section BP1(4).

Conductor 540 extends across the entire length of section BN1(1) to section BN1(2)(3) in the first direction (parallel to the X-axis). Conductor 540 extends across the entire length of section BN1(2)(3) to section BN1(4) in the first direction (parallel to the X-axis). Conductor 540 extends across the entire length of section BN1(4) in the first direction (parallel to the X-axis). A plurality of vias in the MD/VD layer connects conductor 540 to section BN1(1). A plurality of vias in the MD/VD layer connects conductor 540 to section BN1(2)(3). Finally, a plurality of vias in the MD/VD layer connects conductor 540 to section BN1(4).

Conductor 530(1) is connected to conductor 528 and thus also is configured to receive the input/output signal. Conductor 530(1) extends directly over the entire length of drain DP1(1) in the second direction (parallel to Y-axis) and over entire length of drain DN1(1) in the second direction. Conductor 530(1) is provided in metal layer M0. In this embodiment, a plurality of vias in MD/VD layer are provided across entire length of drain DP1(1) that connect to drain DP1(1) of transistor MP1(1) to conductor 530(1) and a plurality of vias in MD/VD layer are provided across entire length of DN1(1) that connect to drain DN1(1) of transistor MN1(1) to conductor 530(1).

Conductor 530(2)(3) is connected to conductor 528 and thus also is configured to receive the input/output signal. Conductor 530(2)(3) is located in metal layer M0. Conductor 530(2)(3) extends directly over the entire length of drain DP1(2)(3) in the second direction (parallel to Y-axis) and over entire length of drain DN1(2)(3) in the second direction. Conductor 530(2)(3) is provided in metal layer M0. In this embodiment, a plurality of vias in MD/VD layer are provided across entire length of drain DP1(2)(3) that connect to drain DP1(2)(3) of transistor MP1(2)(3) to conductor 530(2)(3) and a plurality of vias in MD/VD layer are provided across entire length of DN1(2)(3) that connect to drain DN1(2)(3) of transistor MN1(2)(3) to conductor 530(2)(3).

Figure 6:
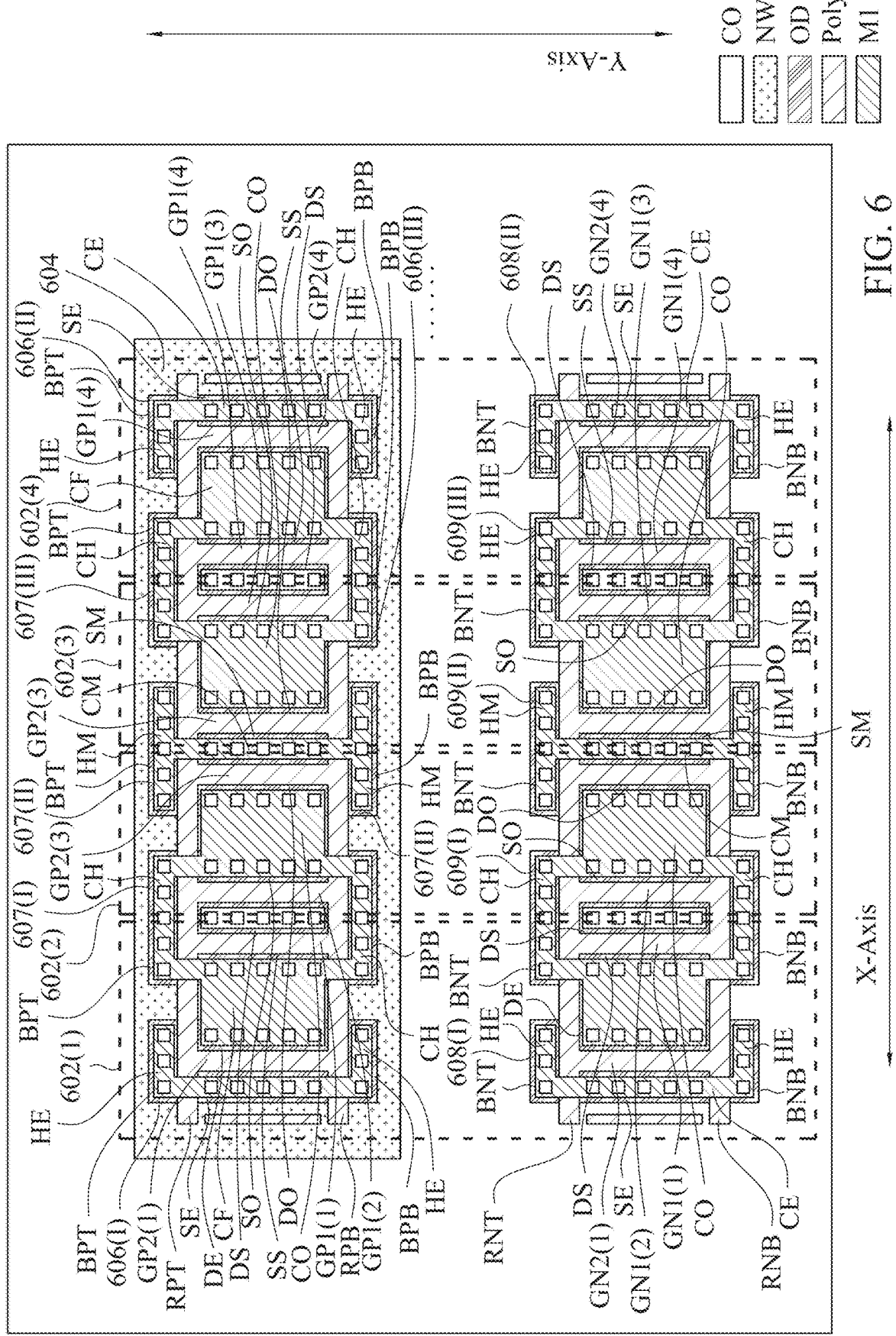
FIG. 6 is a layout diagram of a semiconductor device, in accordance with some embodiments.

Conductor 530(4) is connected to conductor 528 and thus also is configured to receive the input/output signal. Conductor 530(4) is located in metal layer M0. Conductor 530(4) extends directly over the entire length of drain DP1(4) in the second direction (parallel to Y-axis) and over entire length of drain DN1(4) in the second direction. Conductor 530(4) is provided in metal layer M0. In this embodiment, a plurality of vias in MD/VD layer are provided across entire length of drain DP1(4) that connect to drain DP1(4) of transistor MP1(4) to conductor 530(4) and a plurality of vias in MD/VD layer are provided across entire length of DN1(4) that connect to drain DN1(4) of transistor MN1(4) to conductor FIG. 6 is a layout diagram 600 of a semiconductor device, in accordance with some embodiments. In layout diagram 600, for each PMOS or NMOS device, body connections are provided on both sides of the PMOS or NMOS device along the Y-axis. This is different from layout diagrams 500A, 500B where, for each PMOS or NMOS device, a body connection is provided on one side of the PMOS or NMOS device along the Y-axis. In some embodiments, a semiconductor device corresponding to layout diagram 600 achieves an improved ESD performance thanks to the provision of body connections on both sides of each PMOS or NMOS device.

Layout diagram 600 represents various features of the semiconductor device as shapes. Features of layout diagram 600 are discussed with reference to the semiconductor components that the illustrated shapes represent.

Layout diagram 600 includes circuit 602(1), circuit 602(2), circuit 602(3), and circuit 602(4). Each of circuit 602(1), circuit 602(2), circuit 602(3), and circuit 602(4) are an example of the circuit shown in semiconductor device 100 of FIG. 1. It should be noted that the components for circuit 602(1) are discussed in detail and it should be presumed that circuit 602(2), circuit 602(3), and circuit 602(4) have similar components and arrangement. Furthermore, the diodes D1, D2 in FIG. 1 are not shown in FIG. 6.

Layout diagram 600 includes a semiconductor substrate 601. Semiconductor substrate 601 is a silicon on insulator type semiconductor substrate. Semiconductor substrate 601 defines a first well region 604. First well region 604 is an N-Well region. First well region 604 has a long axis that extends in the first direction (which in this embodiment is a first horizontal direction that is parallel to the X-axis). Within first well region 604 is a row of active regions 606(I), 606(II) (referred to generically or collectively as active region(s) 606) and active regions 607(I), 607(II), 607(III) (referred to generically or collectively as active region(s) 607). Active region 606(I) is provided at the left end of the row while active region 606(II) is provided at the right end of the row. Active region 607(I) is active region 607 located directly to the right of active region 606(I). Active region 607(III) is active region 607 that is located directly to the left of active region 606(II). Active region 607(II) is directly to the right of active region 607(I) and directly to the left of active region 607(III).

Active regions 606, 607 are aligned with one another with respect to the second direction (parallel to the Y-axis) and separated from one another with respect to the first direction (parallel to the X-axis). Each of active regions 606, 607 has P-type conductivity. Active regions 606, 607 are used to form PMOS transistors. More specifically, active region 606(I) forms a PMOS transistor MP2(1) that corresponds to transistor MP2 in FIG. 1 within circuit 602(1). Active region 607(I) forms a PMOS transistor MP1(1) that corresponds to transistor MP1 in FIG. 1 within circuit 602(1) and a PMOS transistor MP1(2) that corresponds to transistor MP1 in FIG. 1 within circuit 602(2). Active region 607(II) forms a PMOS transistor MP2(2) that corresponds to transistor MP2 in FIG. 1 within circuit 602(2) and a PMOS transistor MP2(3) that corresponds to transistor MP2 in FIG. 1 within circuit 602(3). Active region 607(III) forms a PMOS transistor MP1(3) that corresponds to transistor MP1 in FIG. 1 within circuit 602(3) and a PMOS transistor MP1(4) that corresponds to transistor MP1 in FIG. 1 within circuit 602(4). Active region 606(II) forms a PMOS transistor MP2(4) that corresponds to transistor MP2 in FIG. 1 within circuit 602(4).

Active regions 606, 607 each have the same length with respect to the first direction. However, active regions 606 are shorter in length with respect to the second direction while active regions 607 are longer with respect to the second direction. This is because one PMOS transistor is formed in active regions 606 while two PMOS transistors are formed on active regions 607 as explained above.

Within active region 606(I), an electrode in the Poly layer is located on active region 606(I) that extends in the second direction (parallel to the Y-axis) and that is gate GP2(1) of transistor MP2(1). Within active region 607(I), two electrodes are provided in the Poly layer are located on active region 607(I) that extend in the second direction (parallel to the Y-axis) and that are gate GP1(1) of transistor MP1(1) and gate GP1(2) of transistor MP1(2). Gate GP1(1) and gate GP1(2) are separated with respect to the first direction (parallel to the X-axis). Within active region 607(II), two electrodes are provided in the Poly layer are located on active region 607(II) that extend in the second direction (parallel to the Y-axis) and that are gate GP2(2) of transistor MP2(2) and gate GP2(3) of transistor MP2(3). Gate GP2(2) and gate GP2(3) are separated with respect to the first direction (parallel to the X-axis). Within active region 607

(III), two electrodes are provided in the Poly layer are located on active region 607(III) that extend in the second direction (parallel to the Y-axis) and that are gate GP1(3) of transistor MP1(3) and gate GP1(4) of transistor MP1(4). Gate GP1(3) and gate GP1(4) are separated with respect to the first direction (parallel to the X-axis). Within active region 606(II), an electrode in the Poly layer is located on active region 606(II) that extends in the second direction (parallel to the Y-axis) and that is gate GP2(4) of transistor MP2(4). Gates GP1(1), GP1(2), GP1(3), GP1(4) are referred to generically or collectively as gate(s) GP1 and gates GP2(1), GP2(2), GP2(3), GP2(4) are referred to generically or collectively as gate(s) GP2. Gates GP1 and GP2 are referred to generically or collectively as gate(s) GP.

A polyrail RPT extends across each of active regions 606, 607 and is connected to the top of each of the gates GP. Another polyrail RPB extends across each of active regions 606, 607 and is connected to the bottom of each of the gates GP. Above the polyrail RPT each of active region 606, 607 provides a section BPT that is past and above the gates GP and the polyrail RPT. Each section BPT is provided to connect to the body of the respective transistors MP2, MP1 formed on active region 606, 607. Below the polyrail RPT each of active region 606, 607 provides a section BPB that is past and below gates GP and the polyrail RPB. Each section BPB is also provided to connect to the body of the respective transistors MP2, MP1 formed on active region 606, 607.

Below the first well region 604 is a row of active regions 608(I), 608(II) (referred to generically or collectively as active region(s) 608) and active regions 609(I), 609(II), 609(III) (referred to generically or collectively as active region(s) 609). Active region 608(I) is provided at the left end of the row while active region 608(II) is provided at the right end of the row. Active region 609(I) is active region 609 located directly to the right of active region 608(I). Active region 609(III) is active region 609 that is located directly to the left of active region 608(II). Active region 609(II) is directly to the right of active region 609(I) and directly to the left of active region 609(III).

Active regions 608, 609 are aligned with one another with respect to the second direction (parallel to the Y-axis) and separated from one another with respect to the first direction (parallel to the X-axis). Each of active regions 608, 609 has N-type conductivity. Active regions 608, 609 are used to form PMOS transistors. More specifically, active region 608(I) forms a PMOS transistor MN2(1) that corresponds to transistor MN2 in FIG. 1 within circuit 602(1). Active region 609(I) forms a PMOS transistor MN1(1) that corresponds to transistor MN1 in FIG. 1 within circuit 602(1) and a PMOS transistor MN1(2) that corresponds to transistor MN1 in FIG. 1 within circuit 602(2). Active region 609(II) forms a PMOS transistor MN2(2) that corresponds to transistor MN2 in FIG. 1 within circuit 602(2) and a PMOS transistor MN2(3) that corresponds to transistor MN2 in FIG. 1 within circuit 602(3). Active region 609(III) forms a PMOS transistor MN1(3) that corresponds to transistor MN1 in FIG. 1 within circuit 602(3) and a PMOS transistor MN1(4) that corresponds to transistor MN1 in FIG. 1 within circuit 602(4). Active region 608(II) forms a PMOS transistor MN2(4) that corresponds to transistor MN2 in FIG. 1 within circuit 602(4).

Active regions 608, 609 each have the same length with respect to the first direction. However, active regions 608 are shorter in length with respect to the second direction while active regions 609 are longer with respect to the second direction. This is because one PMOS transistor is formed in active regions 608 while two PMOS transistors are formed on active regions 609 as explained above.

Within active region 608(I), an electrode in the Poly layer is located on active region 608(I) that extends in the second direction (parallel to the Y-axis) and that is gate GN2(1) of transistor MN2(1). Within active region 609(I), two electrodes are provided in the Poly layer are located on active region 609(I) that extend in the second direction (parallel to the Y-axis) and that are gate GN1(1) of transistor MN1(1) and gate GN1(2) of transistor MN1(2). Gate GN1(1) and gate GN1(2) are separated with respect to the first direction (parallel to the X-axis). Within active region 609(II), two electrodes are provided in the Poly layer are located on active region 609(II) that extend in the second direction (parallel to the Y-axis) and that are gate GN2(2) of transistor MN2(2) and gate GN2(3) of transistor MN2(3). Gate GN2 (2) and gate GN2(3) are separated with respect to the first direction (parallel to the X-axis). Within active region 609 (III), two electrodes are provided in the Poly layer are located on active region 609(III) that extend in the second direction (parallel to the Y-axis) and that are gate GN1(3) of transistor MN1(3) and gate GN1(4) of transistor MN1(4). Gate GN1(3) and gate GN1(4) are separated with respect to the first direction (parallel to the X-axis). Within active region 608(II), an electrode in the Poly layer is located on active region 608(II) that extends in the second direction (parallel to the Y-axis) and that is gate GN2(4) of transistor MN2(4). Gates GN1(1), GN1(2), GN1(3), GN1(4) are referred to generically or collectively as gate(s) GN1 and gates GN2(1), GN2(2), GN2(3), GN2(4) are referred to generically or collectively as gate(s) GN2. Gates GN1 and GN2 are referred to generically or collectively as gate(s) GN.

A polyrail RNT extends across each of active regions 608, 609 and is connected to the top of each of the gates GN. Another polyrail RNB extends across each of active regions 608, 609 and is connected to the bottom of each of gates GN. Above the polyrail RNT each of active region 608, 609 provides a section BNT that is past and above gates GN and the polyrail RNT. Each section BNT is provided to connect to the body of the respective transistors MN2, MN1 formed on active region 608, 609. Below the polyrail RNT each of active region 608, 609 provides a section BNB that is past and below gates GN and the polyrail RNB. Each section BNB is also provided to connect to the body of the respective transistors MN2, MN1 formed on active region 608, 609.

At the ends of the rows are provided active regions 606, 608, as mentioned above. Transistor MP2(1) is a mirror image of transistor MP2(4) and transistor MN2(1) is a mirror image of transistor MN2(4). For each of transistors MP2(1), MP2(4), MN2(1), MN2(4), the portion of active region 606, 608 on the side of the respective gate GP2, GN2 that is unadjacent to another transistor provides source SE of transistor MP2(1), MP2(4), MN2(1), MN2(4). Across each of sources SE, a conductor CE in the metal layer M0 is formed that extends across a length of source SE in the second direction so that one end of conductor CE extends to section BPT, BNT and another end of conductor CE extends to section BPB, BNB of their respective region 606, 608. A plurality of vias in the MD/VD layer connects conductor CE to source SE within each of region 606, 608. At each end, a conductor HE extends in the first direction that extends across the length of their respective section BPB, BNB. For each conductor CE, a plurality of vias in the MD/VD layer connect conductor HE to their respective section BPB, BNB. Conductors HE, CE in regions 606 are configured to receive reference voltage VDDPST while conductors HE, CE while conductors HE, CE in regions 608 are configured to receive reference voltage VSSPST. The portion of active region 606, 608 on the side of respective gate GP2, GN2 opposite of source SE is drain DE of each of transistor MP2(1), MP2(4), MN2(1), MN2(4).

As explained above, a pair of transistors MP1 are located on each of regions 607(I), 607(III) and a pair of transistors MN1 are located on each of regions 609(I), 609(III). The portion of regions 607(I), 607(III) between two gates GP1, under the polyrail RPT, and above the polyrail RPB is a shared drain region DS of the pair of transistors MP1. The portion of regions 609(I), 609(III) between two gates GN1, under the polyrail RNT, and above the polyrail RNB is a shared drain region DS of the pair of transistors MN1. For each of drain regions DS, a conductor CS in metal layer MD/VD extends across a length of drain region DS. For each conductor CS, a plurality of vias in metal layer MD/VD connect conductor CS to the drain region DS. Drain region DS in active region 607(I) is connected to drain region DS in active region 609(I). Similarly, drain region DS in active region 607(III) is connected to drain region DS in active region 609(III). In some embodiments, these connections (not explicitly shown) between drain regions DS is provided through metal layers (not shown) and via layers (not shown) that are higher than MD/VD layer and metal layer M0. In some embodiments, these connections (not explicitly shown) between drain regions DS is provided through metal layers (not shown) and via layers (not shown) that are buried beneath semiconductor substrate 601.

The portion of active regions 607(I), 609(I), to the left of gates GP1(1), GN1(1), respectively, and the portion of active regions 607(III), 609(III), to the right of gates GP1(4), GN1(4), respectively, are sources SS of transistors MP1(1), MN1(1), MP1(4), MN1(4). For each of sources SS, a conductor CF is provided in metal layer M0. Conductor CF has a width in the first direction that extends from source SS to adjacent drain DE. Each conductor CF has a length in the second direction that extends across the entire length of their respective source SS and their respective drain DE. Also, for each conductor CF, a plurality of vias in the MD/VD layer connects conductor CF to the drain DE and a plurality of vias in the MD/VD layer connects conductor CF to source SS.

The portion of active regions 607(I), 609(I), to the right of gates GP1(2), GN1(2), respectively, and the portion of active regions 607(III), 609(III), to the left of gates GP1(3), GN1 (3), respectively, are sources SO of transistors MP1(2), MN1(2), MP1(3), MN1(3). The portion of active regions 607(II), 609(II), to left of gates GP2(2), GN2(2), respectively, and portion of active regions 607(II), 609(II), to right of gates GP2(3), GN2(3), respectively, are drains DO of transistors MP2(2), MN2(2), MP2(3), MN2(3). For each of sources SO and drains DO, a conductor CO is provided in metal layer M0. Conductor CO has a width in the first direction that extends from source SO to adjacent drain DO. Each conductor CO has a length in the second direction that extends across the entire length of their respective source SO and their respective drain DO. Also, for each conductor CO, a plurality of vias in the MD/VD layer connects conductor CO to drain DO and a plurality of vias in the MD/VD layer connects conductor CO to source SO.

For each of active regions 607(I), 609(I), 607(III), 609 (III), a conductor CH in the metal layer M0 extends in the first direction across the entire length of sections BPT, BNT and another conductor CH in the metal layer M0 extends in the first direction across the entire length of sections BPB, BNB. Each conductor CH is connected to one of conductors CF and to one of conductors CO. A plurality of vias in the MD/VD layer connect conductor CH to their respective section BPT, BNT. Conductors CH and corresponding vias in the MD/VD layer provide the networks net0, net1 in FIG. 1.

The portions of active regions 607(II), 609(II), to the right of gates GP2(2), GN2(2) to the left of gates GP2(3), GN2(3), respectively, is a shared source SM of transistors MP2(2), MP2(3) and of transistors MN2(2), MN2(3).

Across each of sources SM, a conductor CM in the metal layer M0 is formed that extends across a length of source SM in the second direction so that one end of conductor CM extends to the section BPT, BNT and another end of conductor CM extends to section BPB, BNB of their respective region 607(II), 609(II). A plurality of vias in the MD/VD layer connects conductor CM to source SM within each of region 607(II), 609(II). At each end of conductor CM, a conductor HM extends in first direction that extends in the first direction across the length of their respective section BPT, BNT, BPB, BNB in regions 607(II), 609(II). For each conductor CM, a plurality of vias in the MD/VD layer connect conductor HM to their respective section BPT, BNT, BPB, BNB. Conductors HM, CM in regions 607(II) are configured to receive reference voltage VDDPST while conductors HM, CM in regions 609(II) are configured to receive reference voltage VSSPST.

Figure 7:
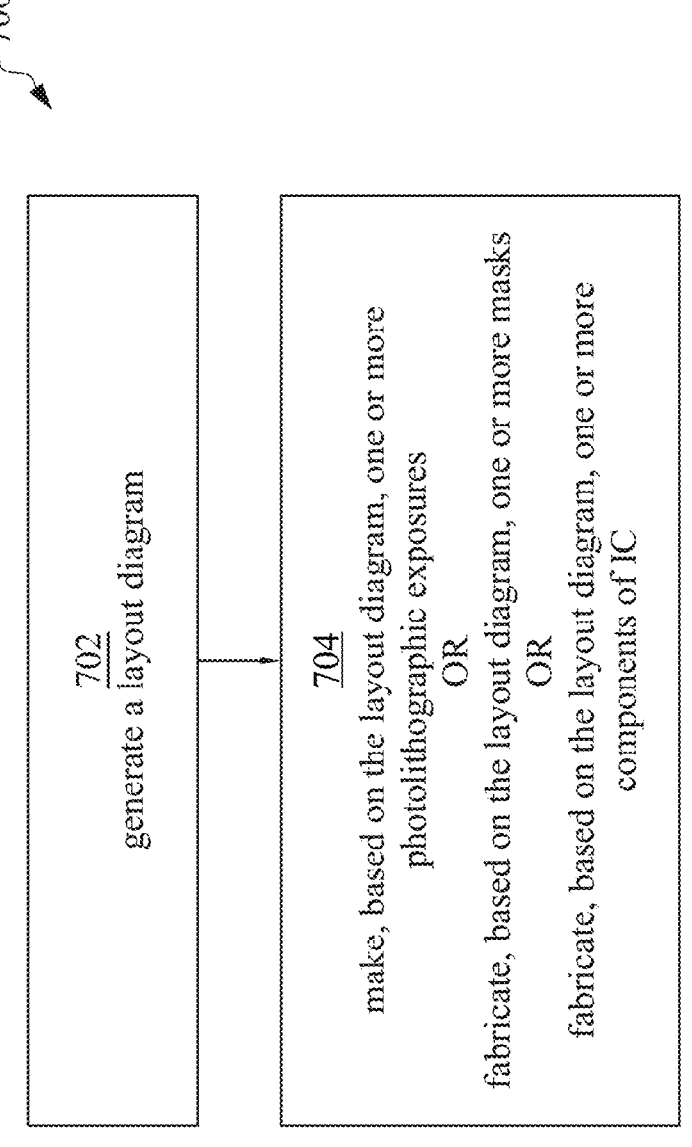
FIG. 7 is a flowchart of a method of generating a layout diagram, in accordance with some embodiments.

FIG. 7 is a flowchart of a method 700 of manufacturing a semiconductor device, in accordance with some embodiments.

Method 700 is implementable, for example, using EDA system 900 (FIG. 9, discussed below) and an integrated circuit (IC) manufacturing system 1000 (FIG. 10, discussed below), in accordance with some embodiments.

In FIG. 7, method 700 includes blocks 702-704. At block 702, a layout diagram is generated. Example layout diagrams that are generated at block 702 include layout diagram 300A in FIG. 3A, layout diagram 300B in FIG. 3B, layout diagram 300C in FIG. 3C, layout diagram 400A in FIG. 4A, layout diagram 400B in FIG. 4B, layout diagram 400C in FIG. 4C, layout diagram 500A in FIG. 5A, layout diagram 500B in FIG. 5B, and layout diagram 600 in FIG. 6. In some embodiments, layout diagram in block 702 is generated by EDA system 900, discussed below in FIG. 9. From block 702, flow proceeds to block 704.

At block 704, based on the layout diagram, at least one of (A) one or more photolithographic exposures are made or (b) one or more semiconductor masks are fabricated or (C) one or more components in a layer of a semiconductor device are fabricated. See discussion below of IC manufacturing system 1100 in FIG. 11 below.

FIG. 8A is a flowchart 800A of a method of generating a layout diagram, in accordance with some embodiments.

Flowchart 800A is an exemplary embodiment of block 702 in FIG. 7. Example layout diagrams that are generated by flowchart 800A include layout diagram 300A in FIG. 3A, layout diagram 300B in FIG. 3B, layout diagram 300C in FIG. 3C, layout diagram 400A in FIG. 4A, layout diagram 400B in FIG. 4B, layout diagram 400C in FIG. 4C, layout diagram 500A in FIG. 5A, and layout diagram 600 in FIG. 6. In some embodiments, at least one layout diagram in flowchart 800A is implemented by EDA system 900, discussed below in FIG. 9.

In some embodiments, a substrate pattern is generated that includes a first active region pattern and a second active region pattern, wherein the first active region pattern and the second active region pattern are separate. Examples of substrate pattern include substrate 301 in FIG. 3A, FIG. 3B, FIG. 3C, FIG. 3E, FIG. 3F, substrate 401 in FIG. 4A, FIG. 4B, FIG. 4C, FIG. 4D, FIG. 4E, FIG. 4F, substrate 501 in FIG. 5A, and substrate pattern 601 in FIG. 6. Examples of first active region pattern include active regions 308(1)-308 (4), 316(1)-316(4) in FIG. 3A, FIG. 3B, 3D, 390, 393 in FIG. 3C, 3E, 408(1)-408(4), 416(1)-416(4) in FIG. 4A, FIG. 4B, 4D, 490, 493 in FIG. 4C, 4E, 508(1)-508(4), 514(1)-514(4) in 5A, and 606(I), 607(II), 606(II), 608(I), 609(II), 608(II) in FIG. 6. Examples of second active region pattern include active regions 310(1)-310(4), 314(1)-314(4) in FIG. 3A, FIG. 3B, 3D, 391, 392 in FIG. 3C, 3E, 410(1)-410(4), 414(1)-414(4) in FIG. 4A, FIG. 4B, 4D, 491, 492 in FIG. 4C, 4E, 510(1)-510(4), 512(1)-512(4) in 5A, and 607(I), 607(III), 609(I), 609(III) in FIG. 6.

At block 802, a first transistor pattern is generated wherein a first body and a first drain of the first transistor pattern are in the first active region pattern. Examples of first transistor pattern include transistors MP2(1)-MP2(4) and MN2(1)-MN2(4) in FIG. 3A, FIG. 3B, FIG. 3C, FIG. 4A, FIG. 4B, FIG. 4C, FIG. 5A, FIG. 6.

At block 804, a second transistor pattern is generated, wherein a second body of the second transistor pattern is in the second active region pattern. Examples of second transistor pattern include transistors MP1(1)-MP1(4) and MN1(1)-MN1(4) in FIG. 3A, FIG. 3B, FIG. 3C, FIG. 4A, FIG. 4B, FIG. 4C, FIG. 5A, FIG. 6.

At block 806, a first conductor pattern configured to receive a first reference voltage is generated, wherein the first conductor pattern is connected to bias the first body of the first transistor pattern with the first reference voltage. Examples of first conductor pattern include conductor 324 (1), 342(1) in FIG. 3A, conductors 360, 365, 370, 371 in FIG. 3B, conductors 394B, 394F, 394K, 394M in FIG. 3C, conductors 422, 440 in FIG. 4A, FIG. 4B and FIG. 4C, conductors 522(1), 540(1) in FIG. 5A, and conductors HE, HM in FIG. 6.

At block 808, a second conductor pattern is generated that connects the second body of the second transistor pattern to the first drain of the first transistor pattern, wherein the first conductor pattern is electrically disconnected from the second conductor pattern. Examples of second conductor pattern include conductor 334(1), 350(1) in FIG. 3A, conductors 380, 385, 375, 377 in FIG. 3B, conductors 394E, 394H, 394L, 394N in FIG. 3C, conductors 434(1), 446(1) in FIG. 4A, 434(2), 446(2) in FIG. 4B, 494B, 494E, 4941, 494K in FIG. 4C, conductors 526, 536 in FIG. 5A, and conductors CH in FIG. 6.

FIG. 8B is a flowchart 800B of a method of fabricating a semiconductor device, in accordance with some embodiments.

Flowchart 800B is an exemplary embodiment of block 704 in FIG. 7. Example semiconductor devices that are fabricated by flowchart 800B include semiconductor device 100 in FIG. 1, semiconductor device 200 in FIG. 2, and semiconductor devices represented by layout diagram 300A in FIG. 3A, layout diagram 300B in FIG. 3B, layout diagram 300C in FIG. 3C, layout diagram 400A in FIG. 4A, layout diagram 400B in FIG. 4B, layout diagram 400C in FIG. 4C, layout diagram 500A in FIG. 5A, layout diagram 500B in FIG. 5B, and layout diagram 600 in FIG. 6. In some embodiments, at least one layout diagram in flowchart 800B is implemented by IC manufacturing system, discussed below in FIG. 10.

Figure 41:
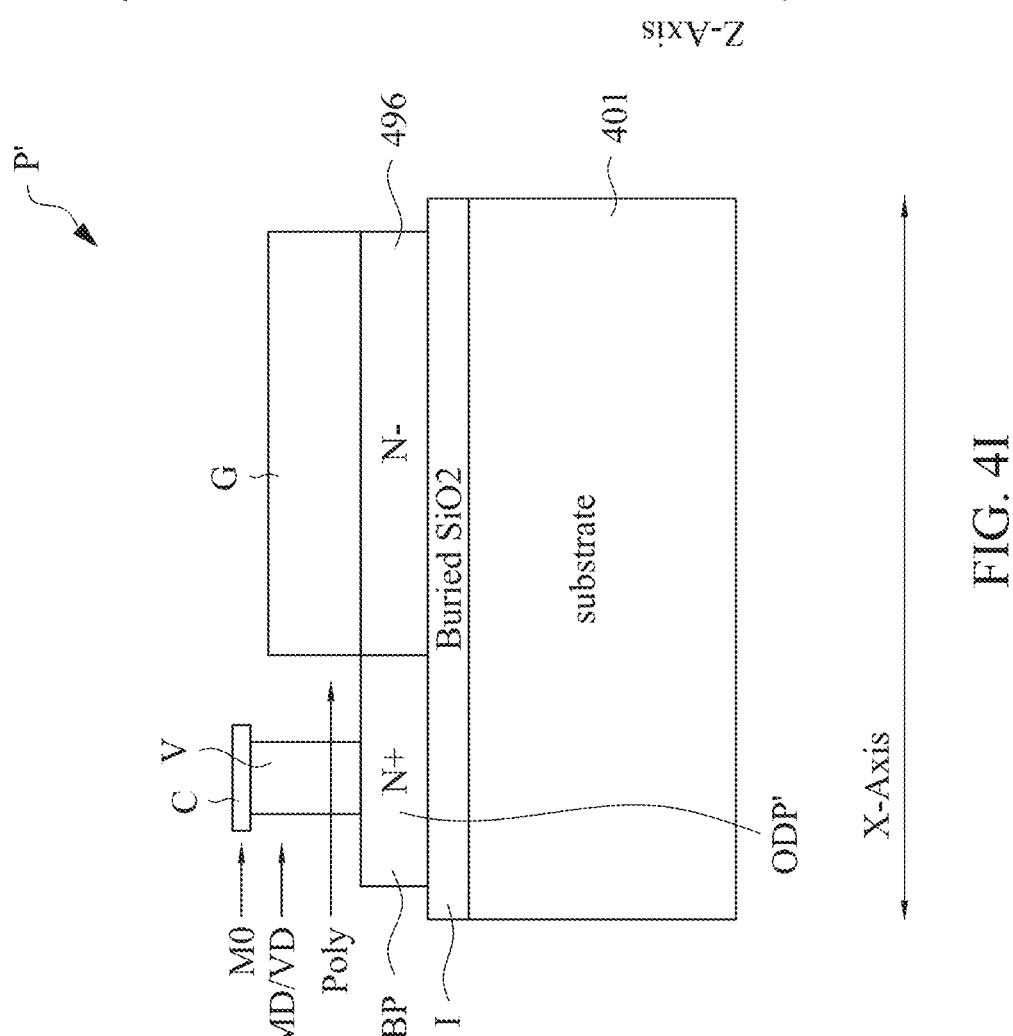

At block 812, first and second active regions are formed in a substrate. In some embodiments, the substrate is a semiconductor substrate that includes silicon, silicon germanium (SiGe), gallium arsenic, or other suitable semiconductor materials. Active regions are formed in or over the substrate, using one or more masks corresponding to one or more active regions in the layout diagrams described herein. Examples of semiconductor substrates includes semiconductor substrate 301 in FIGS. 3A-3F, semiconductor substrate 401 in FIGS. 4A-4K, semiconductor substrate 501 in FIG. 5A, FIG. 5B, and semiconductor substrate 601 in FIG. 6. In some embodiments, one or more N-well regions are formed in a semiconductor substrate. Examples of the N-well regions include N-well regions 304, 306, 312 in FIG. 3A-3D, N-well regions NW in FIGS. 3G, 4J, and 4K. Flow then proceeds to block 814. Examples of active regions include active regions 308(1)-308(4), 310(1)-310(4), 314 (1)-314(4), 316(1)-316(4) in FIG. 3A, 3B, 3D, active regions 390, 391, 392, 293 in FIG. 3C, 3E, active regions 395, 396, 397, 398 in FIG. 3G, active regions 395', 396', 397', 398' in FIG. 3H, 408(1)-408(4), 410(1)-410(4), 414 (1)-414(4), 416(1)-416(4) in FIG. 4A, 4B, 4D, 4E, active regions 490, 491, 492, 493 in FIG. 4C, 4F, 4G, active regions 495, 496, 497, 498 in FIG. 4H, 41, active regions 495', 496', 497', 498' in FIG. 4J, 4K, active regions 508(1)-508(4), 514(1)-514(4) in FIG. 5A, active regions 590, 592 in FIG. 5B, and active regions 606(I), 607(I), 607(II), 607(III), 606(II), 608(I), 609(I), 609(II), 609(III), 608(II) in FIG. 6. Flow then proceeds to block 814.

At block 814, at least one gate electrode on at least one of the active regions is formed to obtain a first transistor and a second transistor, wherein the first transistor has a first body and the second transistor has a second body. In an example manufacturing process, a gate dielectric material layer is deposited over the substrate. Example materials of the gate dielectric material layer include, but are not limited to, a high-k dielectric layer, an interfacial layer, and/or combinations thereof. In some embodiments, the gate dielectric material layer is deposited over the substrate by atomic layer deposition (ALD) or other suitable techniques. A gate electrode layer is deposited over the gate dielectric material layer. Example materials of the gate electrode layer include, but are not limited to, polysilicon, metal, Al, AlTi, Ti, TiN, TaN, Ta, TaC, TaSiN, W, WN, MoN, and/or other suitable conductive materials. In some embodiments, the gate electrode layer is deposited by chemical vapor deposition (CVD), physical vapor deposition (PVD or sputtering), plating, atomic layer deposition (ALD), and/or other suitable processes. A patterning process is then performed, using one or more masks corresponding to one or more gate electrodes in the layout diagrams described herein. As a result, the gate dielectric material layer is patterned in to one or more gate dielectric layers. In at least one embodiment, spacers are formed, by deposition and patterning, on opposite sides of each gate electrode. Example materials of the spacers include, but are not limited to, silicon nitride, oxynitride, silicon carbide and other suitable materials. Example deposition processes include, but are not limited to, plasma enhanced chemical vapor deposition (PECVD), low-pressure chemical vapor deposition (LPCVD), sub-atmospheric chemical vapor deposition (SACVD), atomic layer deposition (ALD), or the like. Example patterning processes include, but are not limited to, a wet etch process, a dry etch process, or combinations thereof. Drain/source regions are formed in the active regions of the substrate. In at least one embodiment, the drain/source regions are formed by using the gate electrodes and the spacers as a mask. For example, the formation of the drain/source regions is performed by an ion implantation or a diffusion process. Depending on the type of the devices or transistors, the drain/source regions are doped with p-type dopants, such as boron or BF2, n-type dopants, such as phosphorus or arsenic, and/or combinations thereof. Examples of gate electrodes are shown in the PO layer in FIG. 3A-3C, 3F, 3G, FIG. 4A-4C, 4E, 4G, 4H-4I, 5A, 5B, 6. Examples of first transistor include transistors, MP2, MN2 in FIG. 1 and FIG. 2, and MP2(1)-MP2(4) and MN2(1)-MN2(4) in FIG. 3A, FIG. 3B, FIG. 3C, FIG. 4A, FIG. 4B, FIG. 4C, FIG. 5A, FIG. 6. Examples of second transistors include transistors MP1, MN1 in FIG. 1, MP1, MP0, MN1, MN0 in FIG. 2, and MP1(1)-MP1(4) and MN1(1)-MN1(4) in FIG. 3A, FIG. 3B, FIG. 3C, FIG. 4A, FIG. 4B, FIG. 4C, FIG. 5A, FIG. 6. Flow proceeds to block 816.

At least one example embodiment of block 814 is described with respect to block 824. At block 824, first and second gate electrodes and a gate electrode portion are formed in a same layer over the first and second active regions, wherein the gate electrode portion is transverse to the first and second gate electrodes, and connects the first gate electrode to the second gate electrode. For example, as described with respect to at least FIGS. 4D-4E, in the same PO layer, first and second gate electrodes (e.g., portions VP) and a gate electrode portion (e.g., portion HP) are formed. The gate electrode portion (e.g., portion HP) extends along the X-axis and is transverse to the first and second gate electrodes (e.g., portions VP) which extend along the Y-axis. The gate electrode portion (e.g., portion HP) also connects the first gate electrode (e.g., one portion VP) to the second gate electrode (an adjacent portion VP), as described with respect to at least FIG. 4E. The first and second gate electrodes and the first active region configure a first transistor. For example, the first and second gate electrodes (e.g., portions VP) and the first active region (e.g., 408(1), 408(2), 408(3), and/or 408(4)) configure a first transistor, e.g., a PMOS transistor that corresponds to the PMOS transistor MP2 in FIG. 1, as described with respect to FIG. 4A. The first and second gate electrodes and the second active region configure a second transistor. For example, the first and second gate electrodes (e.g., portions VP) and the second active region (e.g., 410(1), 410(2), 410(3), and/or 410(4)) configure a second transistor, e.g., a PMOS transistor that corresponds to the PMOS transistor MP1 in FIG. 1, as described with respect to FIG. 4A. The first transistor has a first body and the second transistor has a second body. For example, the first transistor has a first body, e.g., BP2(1), BP2(2), BP2(3), and/or BP2(4), and the second transistor has a second body, e.g., BP1(1), BP1(2), BP1(3), and/or BP1(4), as described with respect to one or more of FIGS. 4, 4D, 4E.

At block 816, form conductors and conductive vias such that a first terminal of the first transistor is connected to a conductor configured to receive a first reference voltage, a second terminal of the first transistor and a first terminal of the second transistor are electrically connected to each other, the first body of the first transistor is electrically connected to the first terminal of the first transistor, and the second body of the second transistor is electrically connected to the second terminal of the first transistor. In an example manufacturing process, a conductive layer, e.g., a metal, is deposited over the substrate with the transistors formed thereon, thereby making electrical connections to the drain/source regions and gates of the transistors. A planarizing process is performed to planarize the conductive layer, resulting in contact structures. The planarizing process includes, for example, a chemical mechanical polish (CMP) process. A dielectric layer is deposited over the substrate with the drain/source contacts formed thereon. The dielectric layer is etched, and the etched portions are filled with a conductive material, such as a metal, to form one or more via structures, such as the VD and VG via structures. A planarizing process is performed. A conductive layer including a conductive material, such as a metal, is deposited over the planarized structure and patterned to form various conductive patterns. A dielectric layer is deposited over the patterned metal layer. The dielectric layer is etched, and the etched portions are filled with a conductive material, such as a metal, to form one or more conductive vias. An example of the first terminal of the first transistor is terminal SP2(1), SN2(1) in FIG. 3A. An example of the second terminal of the first transistor includes terminal DP2(1), DN2(1) in FIG. 3A. An example of the first terminal of the second transistor is terminal SP1(1), SN1(1) in FIG. 3A. An example of the first reference voltage is VDDPST, VSSPST in FIG. 3A. An example of conductors that receive the first reference voltage include conductors 324(1), 342(1) in FIG. 3A. Examples of conductors that connect the second terminal of the first transistor and the first terminal of the second transistor include conductors 334(1), 350(1) in FIG. 3A. Conductive vias are shown in MD/VD layer in FIG. 3A. Examples of the first body of the first transistor or the second body of the second transistor are shown as body 398 in FIG. 3G and body 398' in FIG. 3H.

Figure 9:
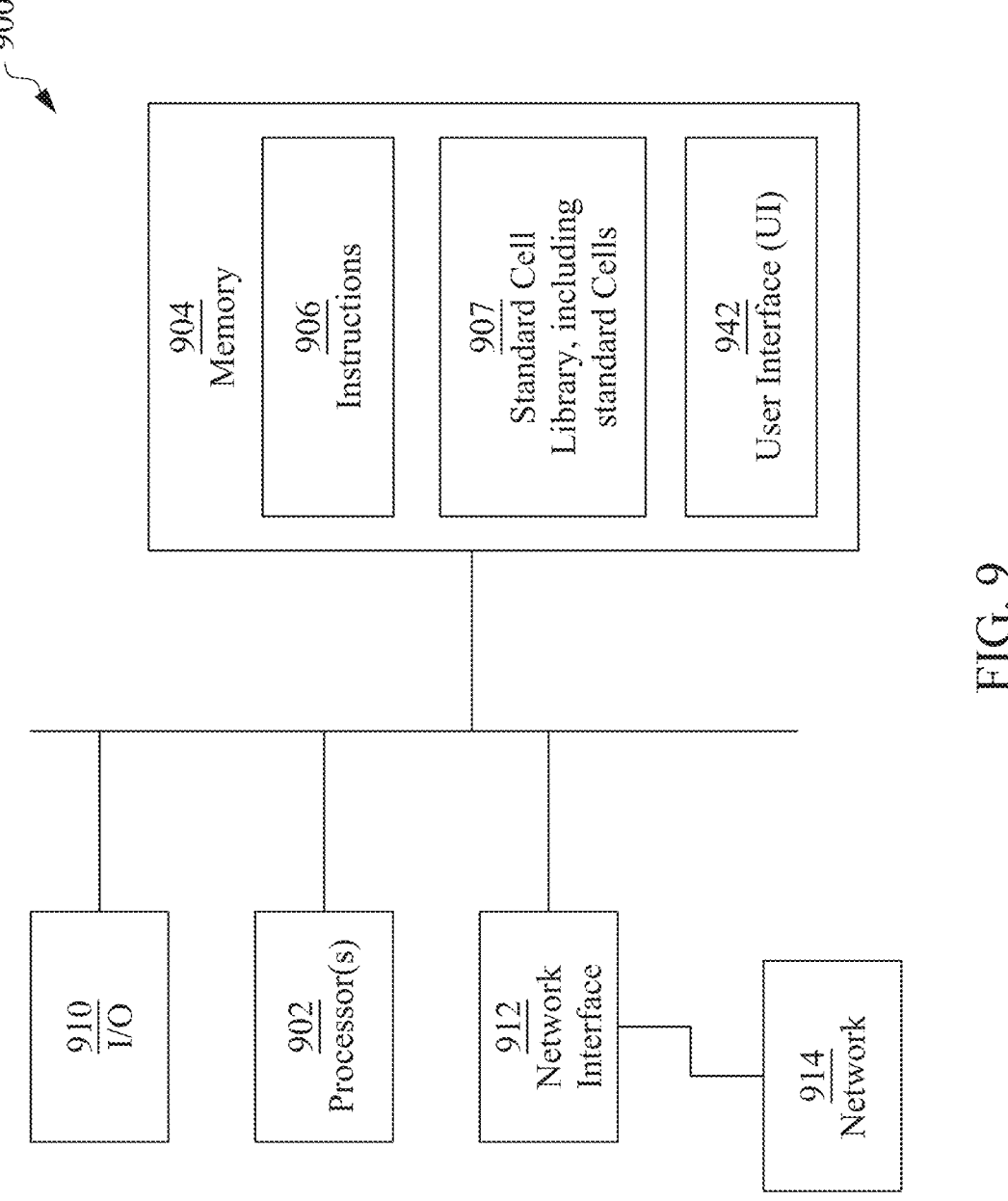
FIG. 9 is a block diagram of an electronic design automation (EDA) system 900, in accordance with some embodiments.

FIG. 9 is a block diagram of an EDA system 900, in accordance with some embodiments.

In some embodiments, EDA system 900 includes an APR system. Methods described herein of designing layout diagrams, in accordance with one or more embodiments, are implementable, for example, using EDA system 900, in accordance with some embodiments.

In some embodiments, EDA system 900 is a general purpose computing device including a hardware processor 902 and a non-transitory, computer-readable storage medium 904. Storage medium 904, amongst other things, is encoded with, i.e., stores, computer program code 906, i.e., a set of executable instructions. Execution of instructions 906 by hardware processor 902 represents (at least in part) an EDA tool which implements a portion or all of the methods described herein in accordance with one or more embodiments (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DMD/VD).

In one or more embodiments, storage medium 904 stores computer program code 906 configured to cause system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores library 907 of standard cells including such standard cells as disclosed herein. In one or more embodiments, storage medium 904 stores one or more layout diagrams 909 corresponding to one or more layouts disclosed herein.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 900.

System 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a UI through I/O interface 910. The information is stored in computer-readable medium 904 as user interface (UI) 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DMD/VD, a magnetic disk, such as a hard disk, a semiconductor memory, such as a ROM, a RAM, a memory card, and the like.

Figure 10:
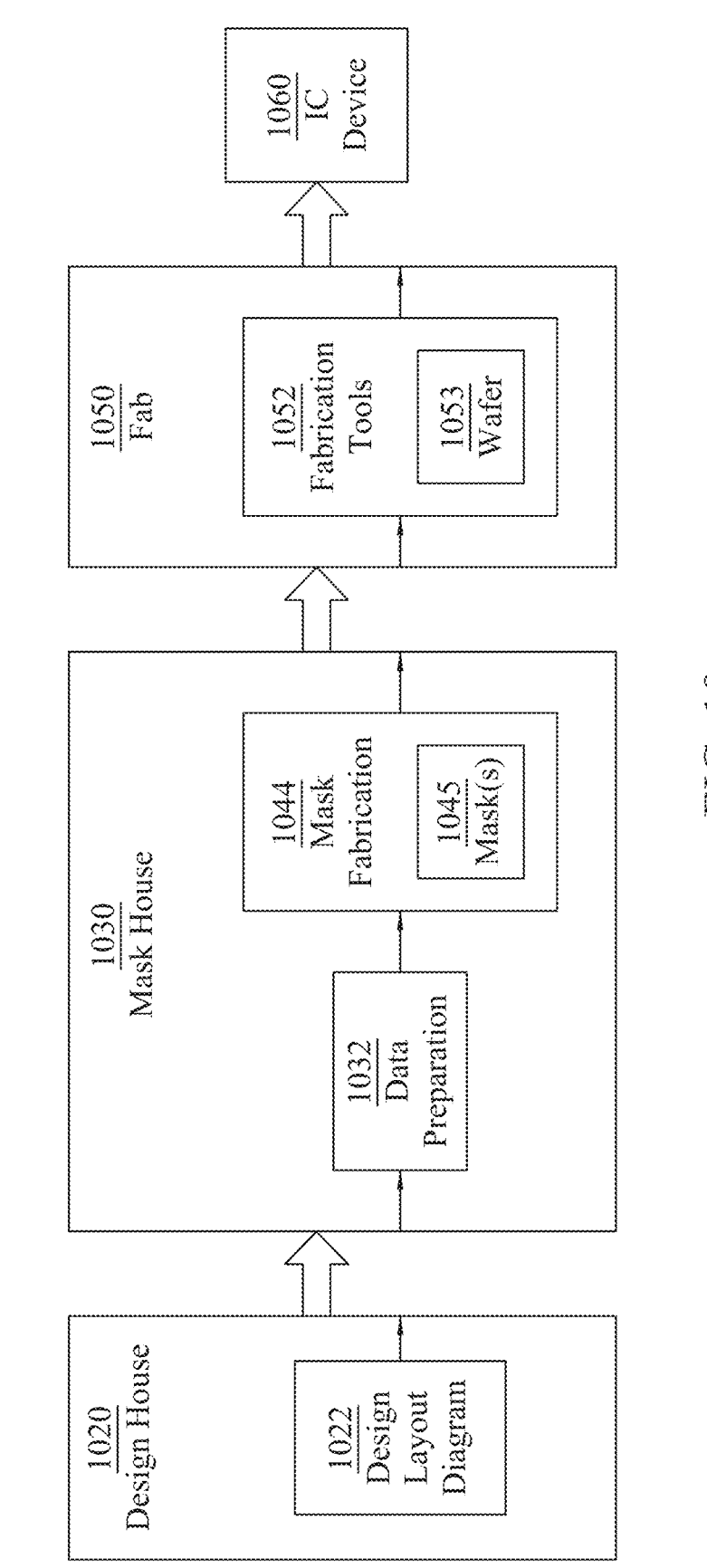
FIG. 10 is a block diagram of an integrated circuit (IC) manufacturing system, and an IC manufacturing flow associated therewith, in accordance with some embodiments.

FIG. 10 is a block diagram of an IC manufacturing system 1000, and an IC manufacturing flow associated therewith, in accordance with some embodiments.

In some embodiments, based on a layout diagram, e.g., at least one of (A) one or more semiconductor masks or (b) at least one component in a layer of a semiconductor integrated circuit is fabricated using manufacturing system 1000.

In FIG. 10, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an inter-layer interconnection, and openings for bonding pads, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place and route. IC design layout diagram 1022 is presented in one or more data files having information of the geometrical patterns. For example, IC design layout diagram 1022 is expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 10, mask data preparation 1032 and mask fabrication 1044 are illustrated as separate elements. In some embodiments, mask data preparation 1032 and mask fabrication 1044 is collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are repeated to further refine IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 is formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask is attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 includes fabrication tools 1052 configured to execute various manufacturing operations on semiconductor wafer 1053 such that IC device 1060 is fabricated in accordance with the mask(s), e.g., mask 1045. In various embodiments, fabrication tools 1052 include one or more of a wafer stepper, an ion implanter, a photoresist coater, a process chamber, e.g., a CMD/VD chamber or LPCMD/VD furnace, a CMP system, a plasma etch system, a wafer cleaning system, or other manufacturing equipment capable of performing one or more suitable manufacturing processes as discussed herein.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multilevel interconnects, and the like (formed at subsequent manufacturing steps).

Details regarding an integrated circuit (IC) manufacturing system (e.g., system 1000 of FIG. 10), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a semiconductor device, includes a first transistor having a first body, wherein the first body of the first transistor is connected to receive a first reference voltage; and a second transistor having a second body, wherein: the first transistor and the second transistor are electrically connected in series, and the second body of the second transistor is electrically disconnected from the first body of the first transistor.

In some embodiments, semiconductor device, including a substrate comprising a first active region and a second active region, wherein the first active region and the second active region are separate; a first transistor, wherein a first body and a first drain of the first transistor are in the first active region; a second transistor, wherein a second body of the second transistor is in the second active region; a first conductor configured to receive a first reference voltage, wherein the first conductor is connected to the first body of the first transistor; and a second conductor that connects the second body of the second transistor to the first drain of the first transistor, wherein the first conductor is electrically disconnected from the second conductor.

In some embodiments, a method of fabricating a semiconductor device, includes forming active regions in the semiconductor substrate; forming at least one gate electrode on at least one of the active regions to obtain a first transistor and a second transistor, wherein the first transistor has a first body and the second transistor has a second body; and forming conductors and conductive vias such that the first transistor is connected to receive a first reference voltage, the first transistor and the second transistor are electrically connected in series, and the second body of the second transistor is electrically disconnected from the first body of the first transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   an input/output node;
   a plurality of transistors; and
   first and second diodes,
   wherein
   the plurality of transistors comprises first through fourth transistors,
   the first transistor has a first body and a first source, wherein the first body and the first source of the first transistor are directly connected to a first reference node which is configured to receive a first reference voltage,
   the second transistor has a second body, wherein:
      the first transistor and the second transistor are electrically connected in series,
      the second body of the second transistor is electrically disconnected from the first body of the first transistor,
      a first gate of the first transistor is directly connected to a second gate of the second transistor and to a first node configured to receive a first control signal,
      the first transistor and the second transistor are of a same, first conductivity type, and
      a drain of the second transistor is directly connected to the input/output node, the third transistor has a third body and a third source, wherein the third body and the third source of the third transistor are directly connected to a second reference node which is configured to receive a second reference voltage different from the first reference voltage, the fourth transistor has a fourth body, wherein the third transistor and the fourth transistor are electrically connected in series, the fourth body of the fourth transistor is electrically disconnected from the third body of the third transistor, a third gate of the third transistor is directly connected to a fourth gate of the fourth transistor and to a second node configured to receive a second control signal different from the first control signal, the third transistor and the fourth transistor are of a same, second conductivity type different from the first conductivity type, and a drain of the fourth transistor is directly connected to the input/output node, the first diode is connected between the input/output node and the first reference node, the second diode is connected between the input/output node and the second reference node, and the plurality of transistors is configured to, during an electrostatic discharge (ESD) event, block ESD current to cause the ESD current to pass through one of the first and second diodes, wherein in response to the ESD event being a negative ESD event, the ESD current is caused to flow between the input/output node and the first reference node through the first diode, bypassing the first transistor and the second transistor, and in response to the ESD event being a positive ESD event, the ESD current is caused to flow between the input/output node and the second reference node through the second diode, bypassing the third transistor and the fourth transistor.

2. The semiconductor device of claim 1, wherein:

the first reference voltage is a power supply voltage, the second reference voltage is a ground voltage, and each of the first control signal and the second control signal is different from each of the power supply voltage and the ground voltage.

3. The semiconductor device of claim 2, wherein the plurality of transistors further comprises:

a fifth transistor of the first conductivity type and having a fifth body; and a sixth transistor of the second conductivity type and having a sixth body, the fifth transistor is electrically connected in series with, and is between, the first transistor and the second transistor, the fifth body of the fifth transistor is electrically disconnected from the first body of the first transistor and the second body of the second transistor, a fifth gate of the fifth transistor is connected to the first node configured to receive the first control signal, the sixth transistor is electrically connected in series with, and is between, the third transistor and the fourth transistor, the sixth body of the sixth transistor is electrically disconnected from the third body of the third transistor and the fourth body of the fourth transistor, and a sixth gate of the sixth transistor is connected to the second node configured to receive the second control signal.

4. The semiconductor device of claim 1, wherein the second transistor is between the first transistor and the input/output node, and the fourth transistor is between the third transistor and the input/output node.

5. The semiconductor device of claim 4, wherein:

the first transistor further has a first drain, the second transistor further has a second source, wherein the second source and the second body of the second transistor are directly connected to the first drain of the first transistor, the third transistor further has and a third drain, and the fourth transistor further has a fourth source, wherein the fourth source and the fourth body of the fourth transistor are directly connected to the third drain of the third transistor.

6. The semiconductor device of claim 5, wherein:

the first reference voltage is a power supply voltage, the second reference voltage is a ground voltage, and each of the first control signal and the second control signal is different from each of the first reference voltage and the second reference voltage.

7. The semiconductor device of claim 6, wherein the first diode has a first anode directly connected to the input/output node and a first cathode directly connected to the first source of the first transistor, and the second diode has a second anode directly connected to the input/output node and a second cathode directly connected to the third source of the third transistor.

8. The semiconductor device of claim 1, wherein the plurality of transistors is connected into a driver configured to convert a signal of a lower voltage level to and from an input/output signal of a higher voltage level at the input/output node.

9. The semiconductor device of claim 1, wherein the first transistor and the second transistor are n-channel metal-oxide semiconductor (NMOS) transistors, and the third transistor and the fourth transistor are p-channel metal-oxide semiconductor (PMOS) transistors.

10. The semiconductor device of claim 1, wherein the first transistor and the second transistor are p-channel metal-oxide semiconductor (PMOS) transistors, and the third transistor and the fourth transistor are n-channel metal-oxide semiconductor (NMOS) transistors.

11. A semiconductor device, comprising:

a substrate having a first direction and a second direction perpendicular to the first direction, the substrate comprising:

a first active region, and a second active region physically separated, by a first spacing, from the first active region in the second direction;

a first gate electrode physically extending, continuously in a same layer over the first and second active regions and along the second direction, over the first active region, across the first spacing, and then over the second active region;

a first transistor configured by the first active region and the first gate electrode, wherein a first body and a first drain of the first transistor are in the first active region;

a second transistor configured by the second active region and the first gate electrode, wherein a second body of the second transistor is in the second active region;

a first conductor configured to receive a first reference voltage, wherein the first conductor is connected to the first body of the first transistor; and a second conductor that connects the second body of the second transistor to the first drain of the first transistor, wherein the first conductor is electrically disconnected from the second conductor, and the second conductor is electrically disconnected from the first gate electrode, the first active region has a first section that physically extends in the second direction beyond the first gate electrode, the first section is aligned with the first gate electrode along the second direction, without overlapping the first gate electrode in a third direction perpendicular to the first and second directions, the first conductor physically overlaps the first section in the third direction, and is electrically connected to the first section which provides a connection to the first body, and the first gate electrode has a width along the first direction and a length along the second direction, and the length of the first gate electrode is greater than the width of the first gate electrode, the semiconductor device further comprising:

an input/output node;

a plurality of transistors including the first and second transistors, and third and fourth transistors; and first and second diodes, wherein the first transistor has the first body and a first source, wherein the first body and the first source of the first transistor are directly connected to a first reference node which is configured to receive a first reference voltage, wherein the first transistor and the second transistor are electrically connected in series, the second body of the second transistor is electrically disconnected from the first body of the first transistor, a first gate electrode of the first transistor is directly connected to a second gate electrode of the second transistor and to a first node configured to receive a first control signal, the first transistor and the second transistor are of a same, first conductivity type, and a second drain of the second transistor is directly connected to the input/output node, the third transistor has a third body and a third source, wherein the third body and the third source of the third transistor are directly connected to a second reference node which is configured to receive a second reference voltage different from the first reference voltage, the fourth transistor has a fourth body, wherein the third transistor and the fourth transistor are electrically connected in series, the fourth body of the fourth transistor is electrically disconnected from the third body of the third transistor, a third gate electrode of the third transistor is directly connected to a fourth gate electrode of the fourth transistor and to a second node configured to receive a second control signal different from the first control signal, the third transistor and the fourth transistor are of a same, second conductivity type different from the first conductivity type, and a drain of the fourth transistor is directly connected to the input/output node, the first diode is connected between the input/output node and the first reference node, the second diode is connected between the input/output node and the second reference node, and the plurality of transistors is configured to, during an electrostatic discharge (ESD) event, block ESD current to cause the ESD current to pass through one of the first and second diodes, wherein in response to the ESD event being a negative ESD event, the ESD current is caused to flow between the input/output node and the first reference node through the first diode, bypassing the first transistor and the second transistor, and in response to the ESD event being a positive ESD event, the ESD current is caused to flow between the input/output node and the second reference node through the second diode, bypassing the third transistor and the fourth transistor.

12. The semiconductor device of claim 11, wherein:

the first conductor also connects to a first source of the first transistor, and the second conductor also connects a second source of the second transistor to the first drain of the first transistor.

13. The semiconductor device of claim 12, wherein the first conductor and the second conductor are in a lowest metal layer over the first transistor and the second transistor.

14. The semiconductor device of claim 11, further comprising a third active region, and a fourth active region, wherein:

the first active region and the third active region are physically separated from each other in the first direction, the second active region and the fourth active region are physically separated from each other in the first direction, the third active region and the fourth active region are physically separated, by a second spacing, from each other in the second direction, the first gate electrode and the second gate electrode are physically separated from each other in the first direction, the second gate electrode physically extends, continuously in the same layer as the first gate electrode and along the second direction, over the third active region, across the second spacing, and then over the fourth active region, the semiconductor device further comprises a gate electrode portion physically extending continuously in the same layer as the first and second gate electrodes and along the first direction, and connecting the first gate electrode to the second gate electrode, the second gate electrode has a width along the first direction and a length along the second direction, and the length of the second gate electrode is greater than the width of the second gate electrode, and the gate electrode portion has a width along the second direction and a length along the first direction, and the length of the gate electrode portion is greater than the width of the gate electrode portion.

15. The semiconductor device of claim 13, wherein:

the first conductor comprises, in the same metal layer:

a first portion physically extending continuously along the first direction, the first portion of the first conductor overlapping the first section of the first active region without overlapping the first gate electrode in the third direction, the first portion of the first conductor electrically connected to the first section of the first active region to be connected to the first body of the first transistor, and a second portion continuous to the first portion, the second portion physically extending continuously along the second direction and overlapping the first source of the first transistor in the third direction, the second portion of the first conductor electrically connected to the first source of the first transistor, the first portion of the first conductor has a width along the second direction and a length along the first direction, and the length of the first portion of the first conductor is greater than the width of the first portion of the first conductor, and the second portion of the first conductor has a width along the first direction and a length along the second direction, and the length of the second portion of the first conductor is greater than the width of the second portion of the first conductor.

16. The semiconductor device of claim 11, wherein
the first transistor and the second transistor are n-channel metal-oxide semiconductor (NMOS) transistors, and
the third transistor and the fourth transistor are p-channel metal-oxide semiconductor (PMOS) transistors.

17. A method of fabricating a semiconductor device, the method comprising:
forming first and second active regions over a substrate;
forming first and second gate electrodes and a gate electrode portion in a same layer over the first and second active regions, wherein:
the gate electrode portion is transverse to the first and second gate electrodes, and connects the first gate electrode to the second gate electrode,
the first and second gate electrodes and the first active region configure a first transistor,
the first and second gate electrodes and the second active region configure a second transistor, wherein the first transistor has a first body and the second transistor has a second body; and
forming conductors and conductive vias over the first and second active regions and the first and second gate electrodes such that
the first body of the first transistor is electrically connected to a first source of the first transistor by a first conductor among the conductors, the first conductor configured to receive a first reference voltage, and
the second body and a second source of the second transistor are electrically connected to a first drain terminal of the first transistor by a second conductor among the conductors,
wherein
the first and second active regions are of a same semiconductor type and are physically disconnected, by a spacing, from each other over the substrate,
the first and second gate electrodes continuously extend from the first active region, across the spacing, to the second active region,
the method further comprises forming an input/output node, a plurality of transistors, and first and second diodes
the plurality of transistors comprises the first and second transistors, and third and fourth transistors,
the first body and the first source of the first transistor are directly connected to a first reference node which is configured to receive the first reference voltage, wherein:

the first transistor and the second transistor are electrically connected in series,
the second body of the second transistor is electrically disconnected from the first body of the first transistor,
the first gate electrode and the second gate electrode are directly connected to a first node configured to receive a first control signal,
the first transistor and the second transistor are of a same, first conductivity type, and
a second drain of the second transistor is directly connected to the input/output node,
the third transistor has a third body and a third source, wherein the third body and the third source of the third transistor are directly connected to a second reference node which is configured to receive a second reference voltage different from the first reference voltage,
the fourth transistor has a fourth body, wherein
the third transistor and the fourth transistor are electrically connected in series,
the fourth body of the fourth transistor is electrically disconnected from the third body of the third transistor,
a third gate electrode of the third transistor is directly connected to a fourth gate electrode of the fourth transistor and to a second node configured to receive a second control signal different from the first control signal,
the third transistor and the fourth transistor are of a same, second conductivity type different from the first conductivity type, and
a drain of the fourth transistor is directly connected to the input/output node,
the first diode is connected between the input/output node and the first reference node,
the second diode is connected between the input/output node and the second reference node, and
the plurality of transistors is configured to, during an electrostatic discharge (ESD) event, block ESD current to cause the ESD current to pass through one of the first and second diodes, wherein
in response to the ESD event being a negative ESD event, the ESD current is caused to flow between the input/output node and the first reference node through the first diode, bypassing the first transistor and the second transistor, and
in response to the ESD event being a positive ESD event, the ESD current is caused to flow between the input/output node and the second reference node through the second diode, bypassing the third transistor and the fourth transistor.

18. The method of claim 17, wherein
the substrate has a first direction and a second direction perpendicular to the first direction,
the first gate electrode has a width along the first direction and a length along the second direction, and the length of the first gate electrode is greater than the width of the first gate electrode,
the second gate electrode has a width along the first direction and a length along the second direction, and the length of the second gate electrode is greater than the width of the second gate electrode,
the gate electrode portion has a width along the second direction and a length along the first direction, and the length of the gate electrode portion is greater than the width of the gate electrode portion, and the first and second gate electrodes physically extend continuously in the same layer along the second direction from the first active region, across the spacing, to the second active region.

19. The method of claim 18, wherein
the first conductor comprises, in a metal layer:
  a first portion physically extending continuously along the first direction without overlapping the first and second gate electrodes in a third direction perpendicular to the first and second directions, the first portion of the first conductor overlapping the first body of the first transistor in the third direction and electrically connected to the first body of the first transistor, and
  a second portion continuous to the first portion, the second portion of the first conductor physically extending continuously along the second direction and overlapping the first source of the first transistor in the third direction, the second portion of the first conductor electrically connected to the first source of the first transistor,
  the first portion of the first conductor has a width along the second direction and a length along the first direction, and the length of the first portion of the first conductor is greater than the width of the first portion of the first conductor, and
  the second portion of the first conductor has a width along the first direction and a length along the second direction, and the length of the second portion of the first conductor is greater than the width of the second portion of the first conductor.

20. The method of claim 19, wherein
the second conductor comprises, in the metal layer:
  a first portion physically extending continuously along the first direction, the first portion of the second conductor overlapping the second body of the second transistor in the third direction and electrically connected to the second body of the second transistor, and
  a second portion continuous to the first portion of the second conductor, the second portion of the second conductor physically extending continuously in a single straight line along the second direction, and overlapping the first drain of the first transistor and the second source of the second transistor in the third direction, the second portion of the second conductor electrically connected to the first drain of the first transistor and the second source of the second transistor,
  the first portion of the second conductor has a width along the second direction and a length along the first direction, and the length of the first portion of the second conductor is greater than the width of the first portion of the second conductor,
  the second portion of the second conductor has a width along the first direction and a length along the second direction, and the length of the second portion of the second conductor is greater than the width of the second portion of the second conductor, and
  along the first direction, the first gate electrode is between the second portion of the first conductor and the second portion of the second conductor.

* * * * *